US012075624B2

(12) United States Patent
Baek et al.

(10) Patent No.: US 12,075,624 B2
(45) Date of Patent: Aug. 27, 2024

(54) THREE-DIMENSIONAL SEMICONDUCTOR MEMORY DEVICE

(71) Applicant: SAMSUNG ELECTRONICS CO., LTD., Suwon-si (KR)

(72) Inventors: Seokcheon Baek, Hwaseong-si (KR); Younghwan Son, Hwaseong-si (KR); Miram Kwon, Suwon-si (KR); Junyong Park, Hwaseong-si (KR); Jiho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 441 days.

(21) Appl. No.: 17/378,317

(22) Filed: Jul. 16, 2021

(65) Prior Publication Data

US 2022/0157831 A1 May 19, 2022

(30) Foreign Application Priority Data

Nov. 17, 2020 (KR) .................. 10-2020-0154058

(51) Int. Cl.
*H10B 43/35* (2023.01)
*H10B 41/10* (2023.01)
*H10B 41/27* (2023.01)
*H10B 41/35* (2023.01)
*H10B 41/40* (2023.01)
(Continued)

(52) U.S. Cl.
CPC .............. *H10B 43/35* (2023.02); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/40* (2023.02)

(58) Field of Classification Search
CPC ........ H10B 43/35; H10B 41/10; H10B 41/27; H10B 41/35; H10B 41/40; H10B 43/10; H10B 43/27; H10B 43/40; H10B 43/50; H01L 21/76877; H01L 21/76898
See application file for complete search history.

(56) References Cited

U.S. PATENT DOCUMENTS 8,765,598 B2    7/2014  Smith et al.
9,768,233 B1*   9/2017  Fukuda ................. H01L 27/101
(Continued)

FOREIGN PATENT DOCUMENTS

KR          101192359 B1    10/2012

*Primary Examiner* — Kyoung Lee
*Assistant Examiner* — Sophia W Kao
(74) *Attorney, Agent, or Firm* — Sughrue Mion, PLLC

(57) ABSTRACT

Provided is a three-dimensional semiconductor memory device including a first substrate that includes a cell array region and a connection region; first and second electrode layers that are sequentially stacked and spaced apart from each other on the first substrate, and an end portion of the first electrode layer and an end portion of the second electrode layer are offset from each other on the connection region; a first cell contact penetrating the second electrode layer and the first electrode layer such as to be connected to the second electrode layer on the connection region; and a first contact dielectric pattern between the first cell contact and the first electrode layer. The first cell contact includes columnar part that vertically extends from a top surface of the first substrate, and a connection part that laterally protrudes from the columnar part and contacts the second electrode layer.

11 Claims, 50 Drawing Sheets

(51) Int. Cl.
    *H10B 43/10*    (2023.01)
    *H10B 43/27*    (2023.01)
    *H10B 43/40*    (2023.01)

(56) References Cited

U.S. PATENT DOCUMENTS

| | | | |
|---|---|---|---|
| 9,831,260 B2* | 11/2017 | Zhang | H01L 27/1207 |
| 9,871,053 B2* | 1/2018 | Kwak | H10B 43/10 |
| 10,141,326 B1* | 11/2018 | Oh | H10B 43/40 |
| 10,192,929 B2 | 1/2019 | Mori | |
| 10,283,566 B2 | 5/2019 | Sel et al. | |
| 11,107,508 B2* | 8/2021 | Hosotani | H10B 43/10 |
| 2009/0154240 A1 | 6/2009 | Park et al. | |
| 2019/0326316 A1 | 10/2019 | Son et al. | |
| 2020/0105783 A1 | 4/2020 | Baek | |
| 2022/0115320 A1* | 4/2022 | Kim | H10B 41/41 |

\* cited by examiner

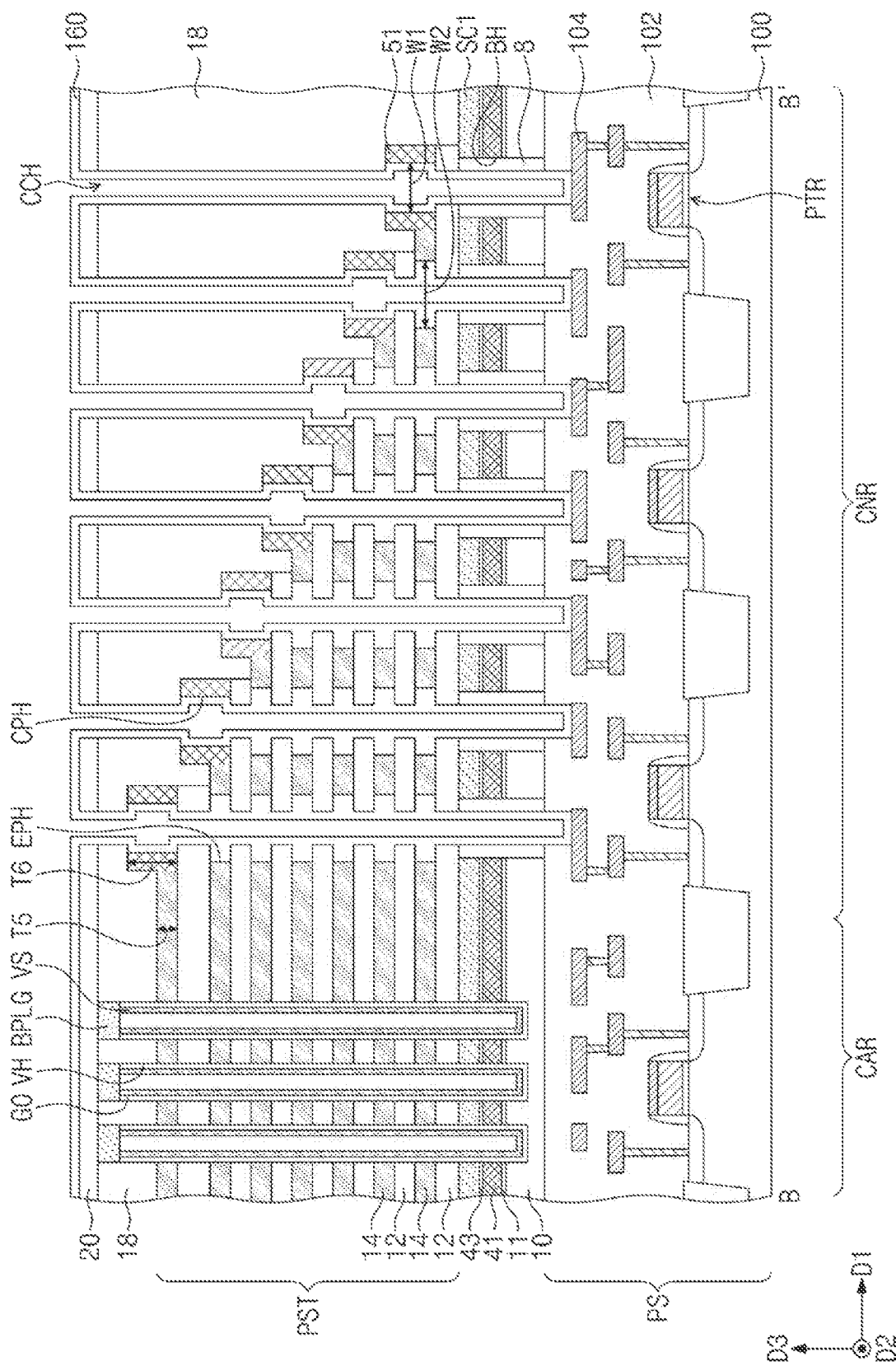

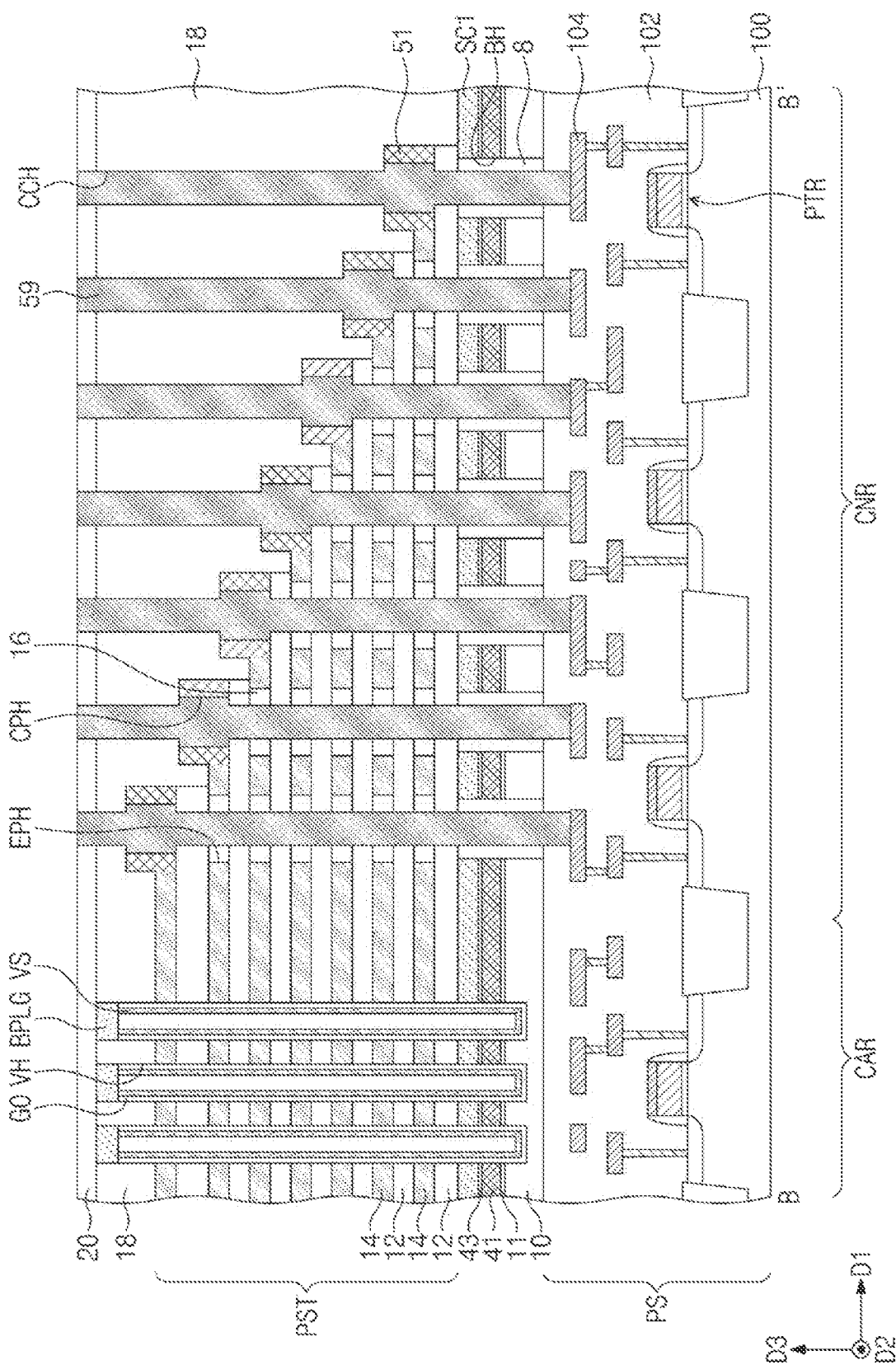

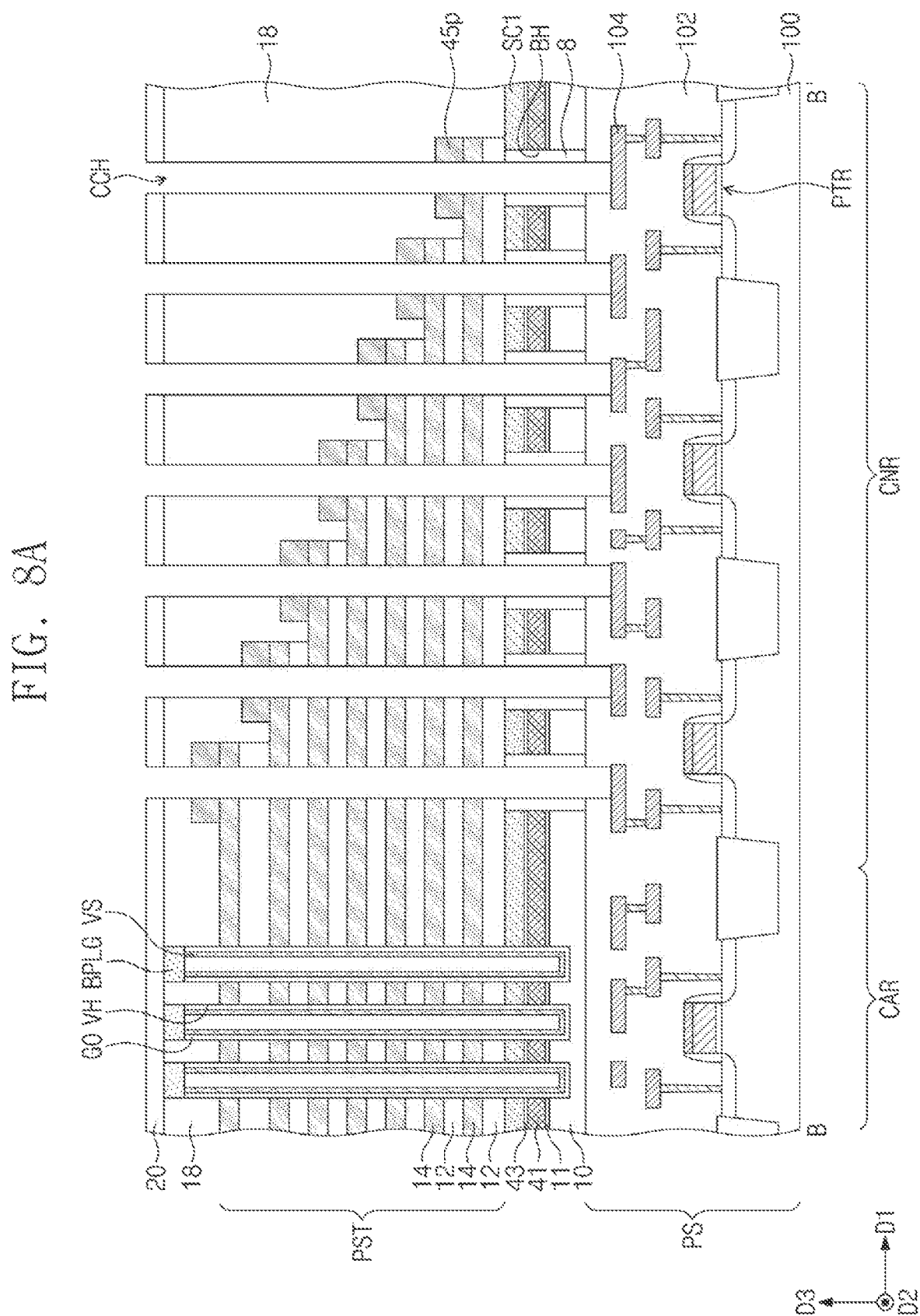

THREE-DIMENSIONAL SEMICONDUCTOR MEMORY DEVICE

CROSS-REFERENCE TO THE RELATED APPLICATION

This U.S. nonprovisional application claims priority under 35 U.S.C § 119 to Korean Patent Application No. 10-2020-0154058 filed on Nov. 17, 2020 in the Korean Intellectual Property Office, the disclosure of which is hereby incorporated by reference in its entirety.

BACKGROUND

Embodiments of the present disclosure relate to three-dimensional semiconductor memory devices, and more particularly, to three-dimensional semiconductor memory devices with improved reliability and increased integration.

Semiconductor devices have been highly integrated to meet high performance and low manufacturing cost which are required by customers. Because integration of the semiconductor devices is an important factor in determining product price, high integration is increasingly requested. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present disclosure provide three-dimensional semiconductor memory devices with improved reliability and increased integration.

Objects of embodiments of the present disclosure are not limited to those mentioned above, and other objects which have not been mentioned above will be clearly understood to those skilled in the art from the following description.

According to one or more embodiments of the present disclosure, a three-dimensional semiconductor memory device is provided. The three-dimensional semiconductor memory device includes: a first substrate that includes a cell array region and a connection region; a first electrode layer and a second electrode layer that are sequentially stacked and spaced apart from each other on the first substrate, and an end portion of the first electrode layer and an end portion of the second electrode layer are offset from each other on the connection region; a first cell contact penetrating the second electrode layer and the first electrode layer such as to be connected to the second electrode layer on the connection region; and a first contact dielectric pattern between the first cell contact and the first electrode layer, wherein the first cell contact includes: a columnar part that vertically extends from a top surface of the first substrate; and a connection part that laterally protrudes from the columnar part and contacts the second electrode layer, wherein a width of the connection part is less than a width of the first contact dielectric pattern.

According to one or more embodiments of the present disclosure, a three-dimensional semiconductor memory device is provided. The three-dimensional semiconductor memory device includes: a peripheral circuit structure and a cell array structure on the peripheral circuit structure, wherein the cell array structure includes: a first substrate that includes a cell array region and a connection region; a source structure on the first substrate; a first electrode layer and a second electrode layer that are sequentially stacked and spaced apart from each other on the source structure, and an end portion of the first and an end portion of the second electrode layer are offset from each other on the connection region; a plurality of vertical patterns penetrating the first electrode layer, the second electrode layer, and the source structure such as to be adjacent to the first substrate on the cell array region; a first cell contact penetrating the second electrode layer and the first electrode layer such as to be connected to the second electrode layer on the connection region; and a first contact dielectric pattern between the first cell contact and the second electrode layer, wherein the first cell contact includes: a columnar part that vertically extends from a top surface of the first substrate; and a connection part that laterally protrudes from the columnar part and contacts a top surface of the second electrode layer, wherein the connection part includes: a connection center part that overlaps the first contact dielectric pattern; and a connection edge part that overlaps the second electrode layer, and wherein a bottom surface of the connection edge part is lower than a bottom surface of the connection center part.

According to one or more embodiments of the present disclosure, a three-dimensional semiconductor memory device is provided. The three-dimensional semiconductor memory device includes: a first substrate that includes a cell array region and a connection region; and a plurality of electrode layers that are sequentially stacked and spaced apart from each other on the first substrate, wherein each of the plurality of electrode layers includes an electrode part on the cell array region and a pad part on the connection region, wherein the electrode part has a first thickness, and wherein the pad part has a second thickness less than the first thickness.

BRIEF DESCRIPTION OF THE DRAWINGS

FIG. 6F illustrates a sixth cross-sectional view showing a part of the method of fabricating the three-dimensional semiconductor memory device having the cross-section of FIG. 3B according to some example embodiments of the present disclosure.

FIG. 6I illustrates an eighth cross-sectional view showing a part of the method of fabricating the three-dimensional semiconductor memory device having the cross-section of FIG. 3B according to some example embodiments of the present disclosure.

FIG. 8A illustrates a first cross-sectional view showing a part of a method of fabricating a three-dimensional semiconductor memory device having the cross-section of FIG. 7A.

DETAILED DESCRIPTION OF EMBODIMENTS

Some example embodiments of the present disclosure will now be described in detail with reference to the accompanying drawings to aid in clearly explaining the present disclosure.

Figure 1A:
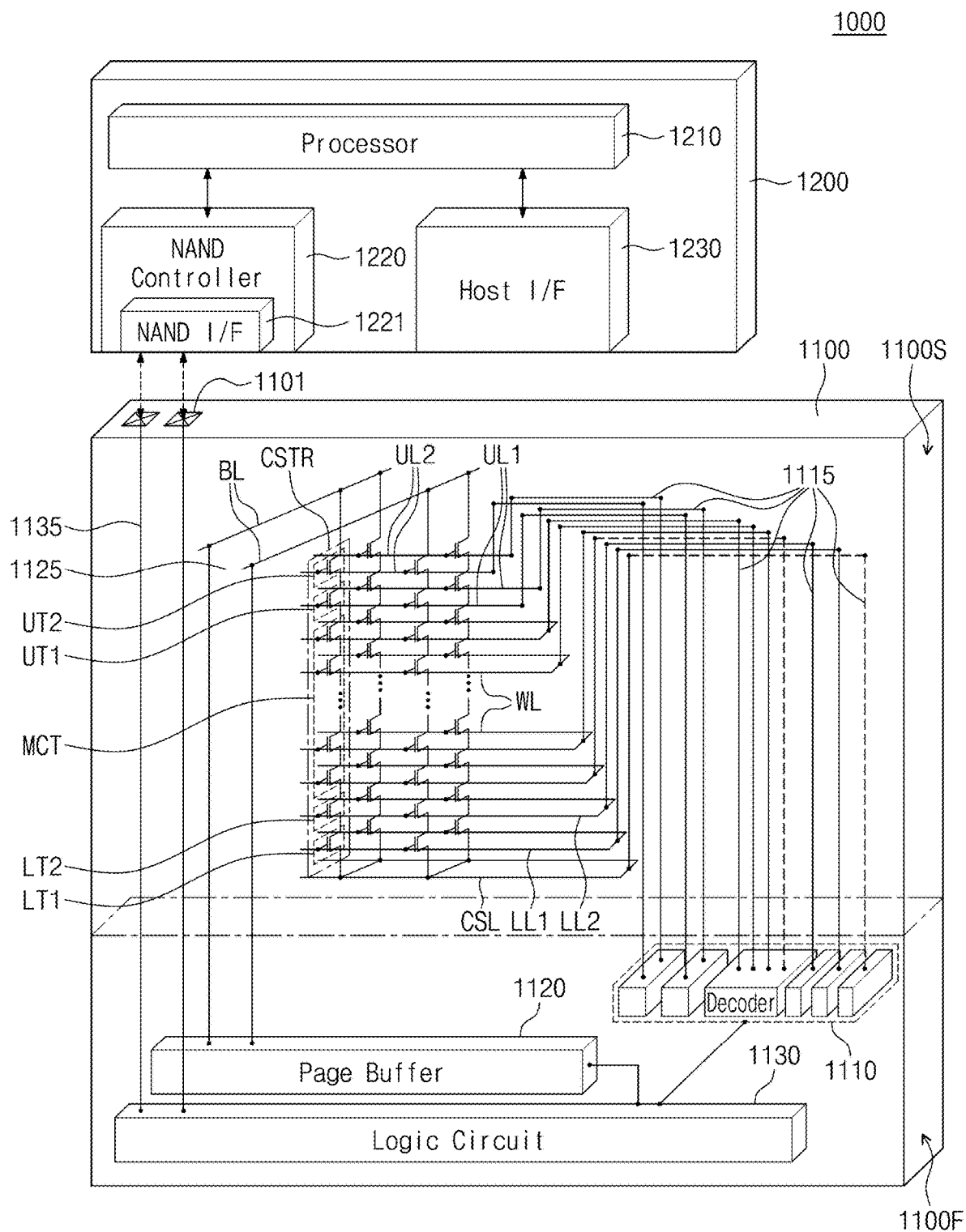
FIG. 1A illustrates a simplified schematic diagram showing an electronic system that includes a semiconductor device according to some example embodiments of the present disclosure.

FIG. 1A illustrates a simplified schematic diagram showing an electronic system that includes a semiconductor device according to some example embodiments of the present disclosure.

Referring to FIG. 1A, an electronic system 1000 according to some example embodiments of the present disclosure may include a semiconductor device 1100 and a controller 1200 electrically connected to the semiconductor device 1100. The electronic system 1000 may be a storage device that includes a single or a plurality of the semiconductor device 1100 or may be an electronic device that includes the storage device. For example, the electronic system 1000 may be a solid state drive (SSD) device, a universal serial bus (USB), a computing system, a medical apparatus, or a communication apparatus, each of which includes a single or a plurality of the semiconductor device 1100.

The semiconductor device 1100 may be a nonvolatile memory device, such as a NAND Flash memory device. The semiconductor device 1100 may include a first structure 1100F and a second structure 1100S on the first structure 1100F. In some example embodiments, the first structure 1100F may be disposed on a side of the second structure 1100S. The first structure 1100F may be a peripheral circuit structure that includes a decoder circuit 1110, a page buffer 1120, and a logic circuit 1130. The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit lines BL and the common source line CSL.

On the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some example embodiments, the upper transistors UT1 and UT2 may include a string selection transistor, and the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, and the first and second gate upper lines UL1 and UL2 may be gate electrodes of the upper transistors UT1 and UT2, respectively.

In some example embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

On the first structure 1100F, the decoder circuit 1110 and the page buffer 1120 may perform a control operation with respect to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

The controller 1200 may include a processor 1210, a NAND controller 1220, and a host interface 1230. In some example embodiments, the electronic system 1000 may include a plurality of the semiconductor device 1100, and in this case, the controller 1200 may control the plurality of the semiconductor device 1100.

The processor 1210 may control an overall operation of the electronic system 1000 including the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer a control command that controls the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 1B:
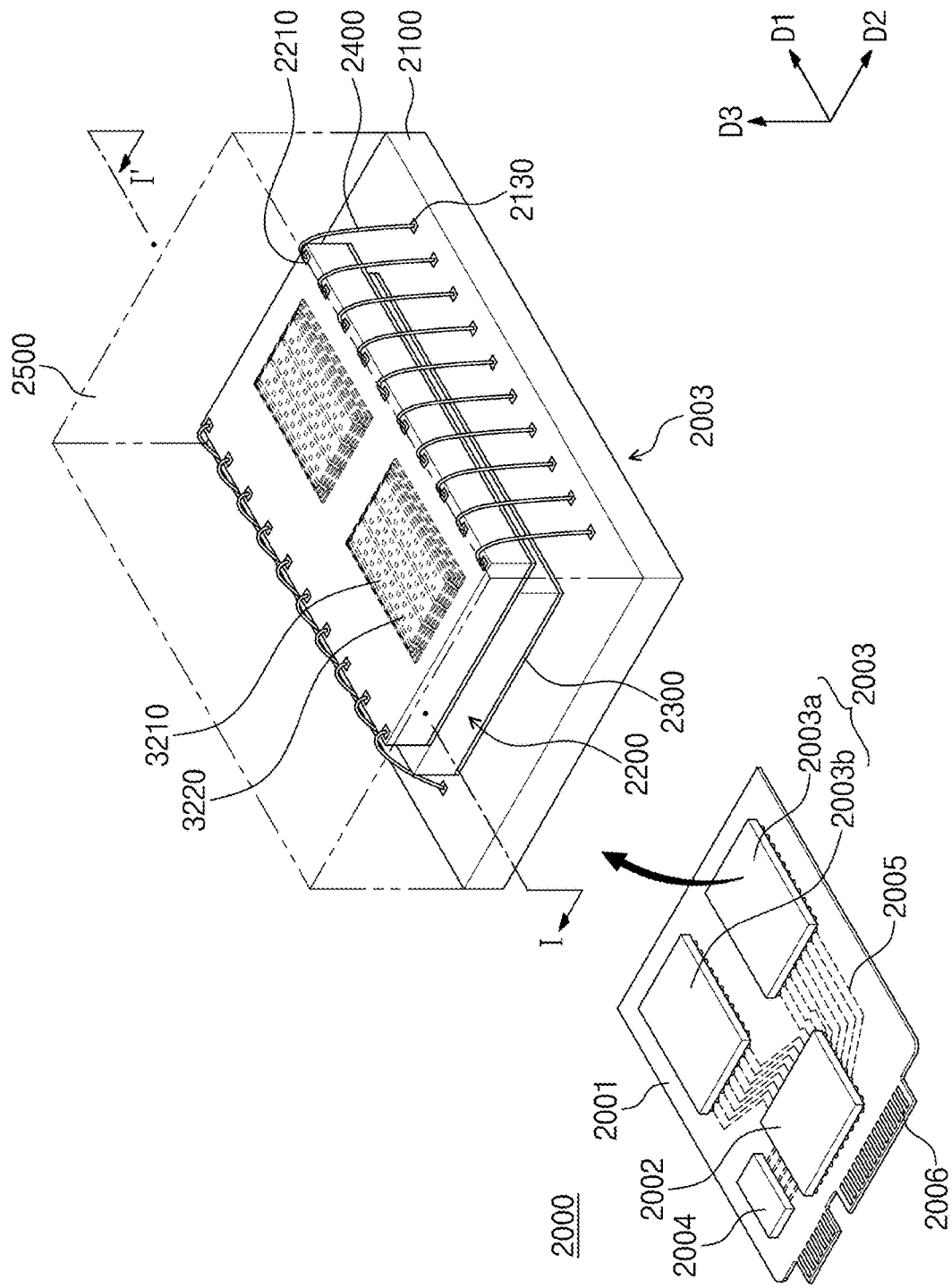
FIG. 1B illustrates a simplified perspective view showing an electronic system that includes a semiconductor device according to some example embodiments of the present disclosure.

FIG. 1B illustrates a simplified perspective view showing an electronic system that includes a semiconductor device according to some example embodiments of the present disclosure.

Referring to FIG. 1B, an electronic system 2000 according to some example embodiments of the present disclosure may include a main board 2001, a controller 2002 mounted on the main board 2001, at least one semiconductor package 2003, and a dynamic random access memory (DRAM) 2004. The semiconductor package 2003 and the DRAM 2004 may be connected to the controller 2002 through wiring patterns 2005 formed on the main board 2001.

The main board 2001 may include a connector 2006 including a plurality of pins that will be coupled to an external host. The number and arrangement of the plurality of pins on the connector 2006 may be changed based on a communication interface between the electronic system 2000 and the external host. In some example embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some example embodiments, the electronic system 2000 may operate with power supplied through the connector 2006 from the external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only an NAND controller for controlling the semiconductor package 2003, but a DRAM controller for controlling the DRAM 2004.

The semiconductor package 2003 may include a first semiconductor package 2003a and a second semiconductor package 2003b that are spaced apart from each other. Each of the first semiconductor package 2003a and the second semiconductor package 2003b may include a plurality of semiconductor chips 2200. Each of the first semiconductor package 2003a and the second semiconductor package 2003b may include a package substrate 2100, semiconductor chips 2200 on the package substrate 2100, adhesive layers 2300 on bottom surfaces of the semiconductor chips 2200, a plurality of a connection structure 2400 that electrically connect the semiconductor chips 2200 to the package substrate 2100, and a molding layer 2500 that lies on the package substrate 2100 and covers the semiconductor chips 2200 and the plurality of the connection structure 2400.

The package substrate 2100 may be an integrated circuit board including package upper pads 2130. Each of the semiconductor chips 2200 may include one or more of an input/output pad 2210. The input/output pad 2210 may correspond to the input/output pad 1101 of FIG. 1A. Each of the semiconductor chips 2200 may include a plurality of a gate stack structure 3210 and vertical structures 3220. Each of the semiconductor chips 2200 may include a semiconductor device which will be discussed below.

In some example embodiments, the connection structure 2400 may be a bonding wire that electrically connects an input/output pad 2210 to one of the package upper pads 2130. Therefore, on each of the first semiconductor package 2003a and the second semiconductor package 2003b, the semiconductor chips 2200 may be electrically connected to each other in a wire bonding manner, and may be electrically connected to the package upper pads 2130 of the package substrate 2100. In some example embodiments, on each of the first semiconductor package 2003a and the second semiconductor package 2003b, the semiconductor chips 2200 may be electrically connected to each other through connection structures such as through silicon vias instead of the plurality of the connection structure 2400 shaped like bonding wires.

In some example embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 1C:
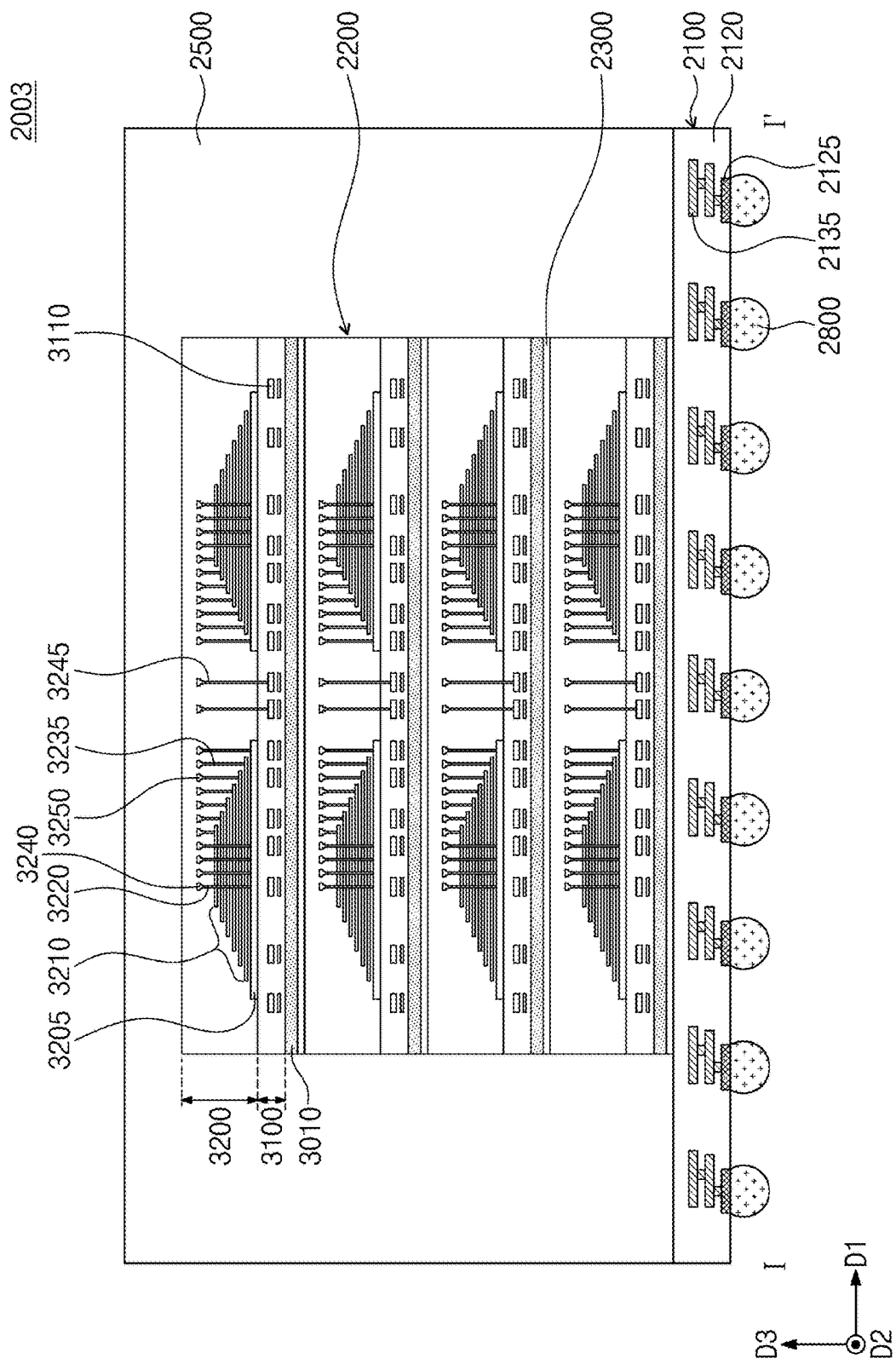
FIG. 1C illustrates a simplified cross-sectional view showing a semiconductor package according to an example embodiment of the present disclosure.
Figure 1D:
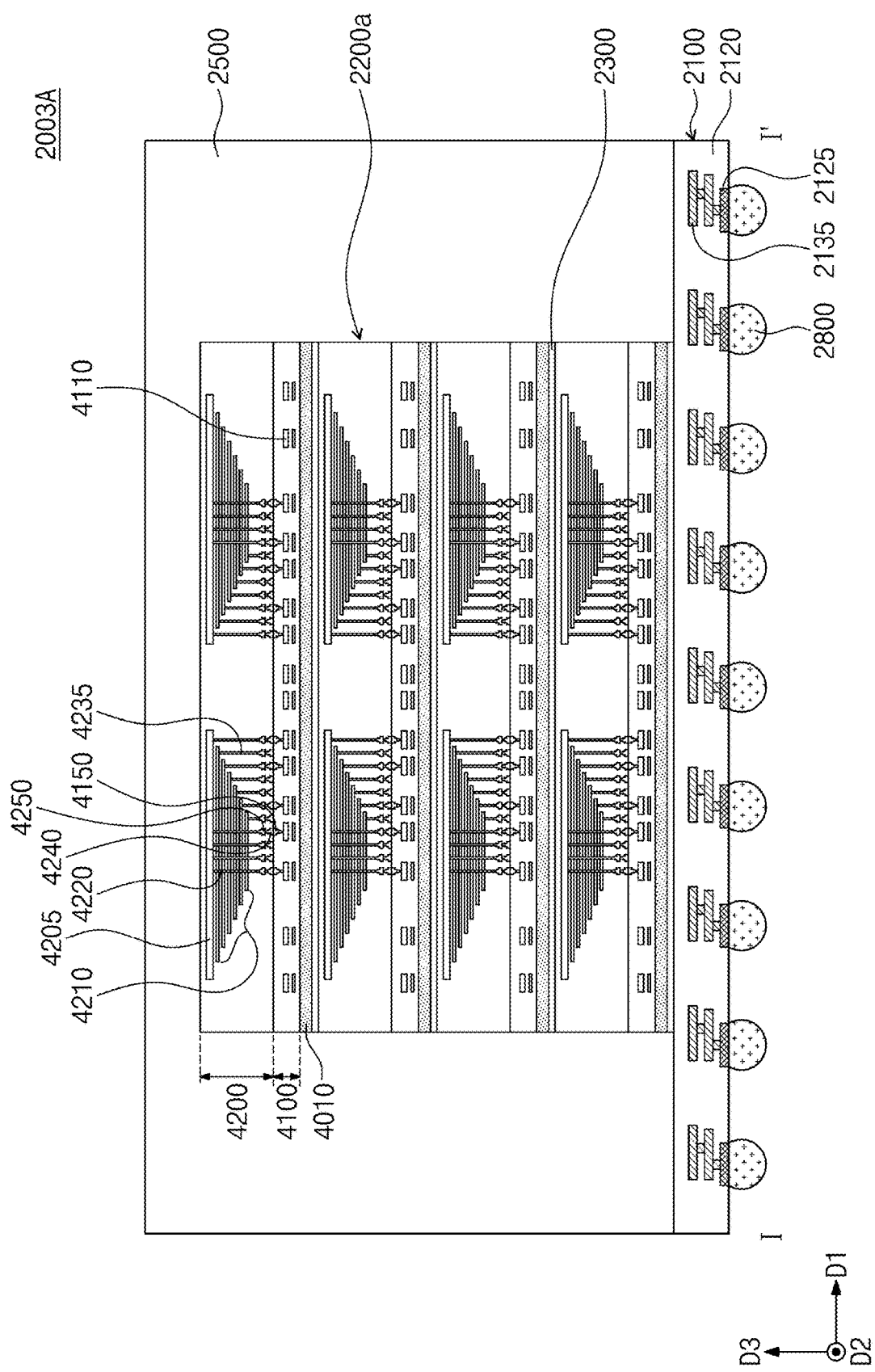
FIG. 1D illustrates a simplified cross-sectional view showing a semiconductor package according to an example embodiment of the present disclosure.

FIGS. 1C and 1D illustrate simplified cross-sectional views showing a semiconductor package according to some example embodiments of the present disclosure. FIGS. 1C and 1D each depicts a non-limiting example embodiment of the semiconductor package shown in FIG. 1B, conceptually showing a section taken along line I-I' of the semiconductor package shown in FIG. 1B.

Referring to FIG. 1C, a printed circuit board may be used as the package substrate 2100 of the semiconductor package 2003. The package substrate 2100 may include a package substrate body 2120, upper pads (see package upper pads 2130 of FIG. 1B) disposed on a top surface of the package substrate body 2120, lower pads 2125 disposed or exposed on a bottom surface of the package substrate body 2120, and internal lines 2135 that lie in the package substrate body 2120 and electrically connect the package upper pads 2130 to the lower pads 2125. The package upper pads 2130 may be electrically connected to the plurality of the connection structure 2400 (refer to FIG. 1B). The lower pads 2125 may be connected through conductive connection parts 2800 to the wiring patterns 2005 on the main substrate 2010 of the electronic system 2000, as shown in FIG. 1B.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral circuit lines 3110. The second structure 3200 may include a source structure 3205, a stack structure 3210 on the source structure 3205, vertical structures 3220 and separation structures 3230 that penetrate the stack structure 3210, bit lines 3240 electrically connected to the vertical structures 3220, and cell contact plugs 3235 electrically connected to the word lines (see word lines WL of FIG. 1A) of the stack structure 3210. Each of the first structure 3100, the second structure 3200, and the semiconductor chips 2200 may further include separation structures which will be discussed below.

Each of the semiconductor chips 2200 may include one or more through lines 3245 that have electrical connections with the peripheral circuit lines 3110 and extend into the second structure 3200. The through lines 3245 may be disposed to be outside the stack structure 3210 and may further be disposed to penetrate the stack structure 3210. Each of the semiconductor chips 2200 may further include one or more input/output pads (see input/output pad 2210 of FIG. 1B) electrically connected to the peripheral circuit lines 3110 of the first structure 3100.

Referring to FIG. 1D, a semiconductor package 2003A may include semiconductor chips 2200a each including a semiconductor substrate 4010, a first structure 4100 on the semiconductor substrate 4010, and a second structure 4200 that is wafer-bonded to the first structure 4100.

The first structure 4100 may include a peripheral circuit region including peripheral circuit lines 4110 and first bonding structures 4150. The second structure 4200 may include a source structure 4205, a stack structure 4210 on the source structure 4205, vertical structures 4220 and separation structures 4230 that penetrate the stack structure 4210, and second bonding structures 4250 electrically connected to the vertical structures 4220 and the word lines (see word lines WL of FIG. 1A) of the stack structure 4210. For example, the second bonding structures 4250 may be electrically connected to the vertical structures 4220 through bit lines 4240 electrically connected to the vertical structures 4220, and may also be electrically connected to the word lines WL through cell contact plugs 4235 electrically connected to the word lines WL of FIG. 1A. The first bonding structures 4150 of the first structure 4100 and the second bonding structures 4250 of the second structure 4200 may be coupled to each other while being in contact with each other. The first bonding structures 4150 and the second bonding structures 4250 may have their bonding portions formed of copper (Cu).

Each of the first structure 4100, the second structure 4200, and the semiconductor chips 2200a may further include a source structure which will be discussed below. Each of the semiconductor chips 2200a may further include one or more input/output pads (see input/output pad 2210 of FIG. 1B) electrically connected to the peripheral circuit lines 4110 of the first structure 4100.

The semiconductor chips 2200 of FIG. 1C may be electrically connected to each other through the connection structures (see connection structure 2400 of FIG. 1B) shaped like bonding wires, and the same may be true for the semiconductor chips 2200a of FIG. 1D. In some example embodiments, connection structures including through electrodes (TSV) may be used to electrically connect to each other semiconductor chips, such as the semiconductor chips 2200 of FIG. 1C or the semiconductor chips 2200a of FIG. 1D, in a single semiconductor package.

The first structure 3100 of FIG. 1C and the first structure 4100 of FIG. 1D may each correspond to a peripheral circuit structure discussed below in the following embodiments, and the second structure 3200 of FIG. 1C and the second structure 4200 of FIG. 1D may each correspond to a cell array structure discussed in the following embodiments.

Figure 2:
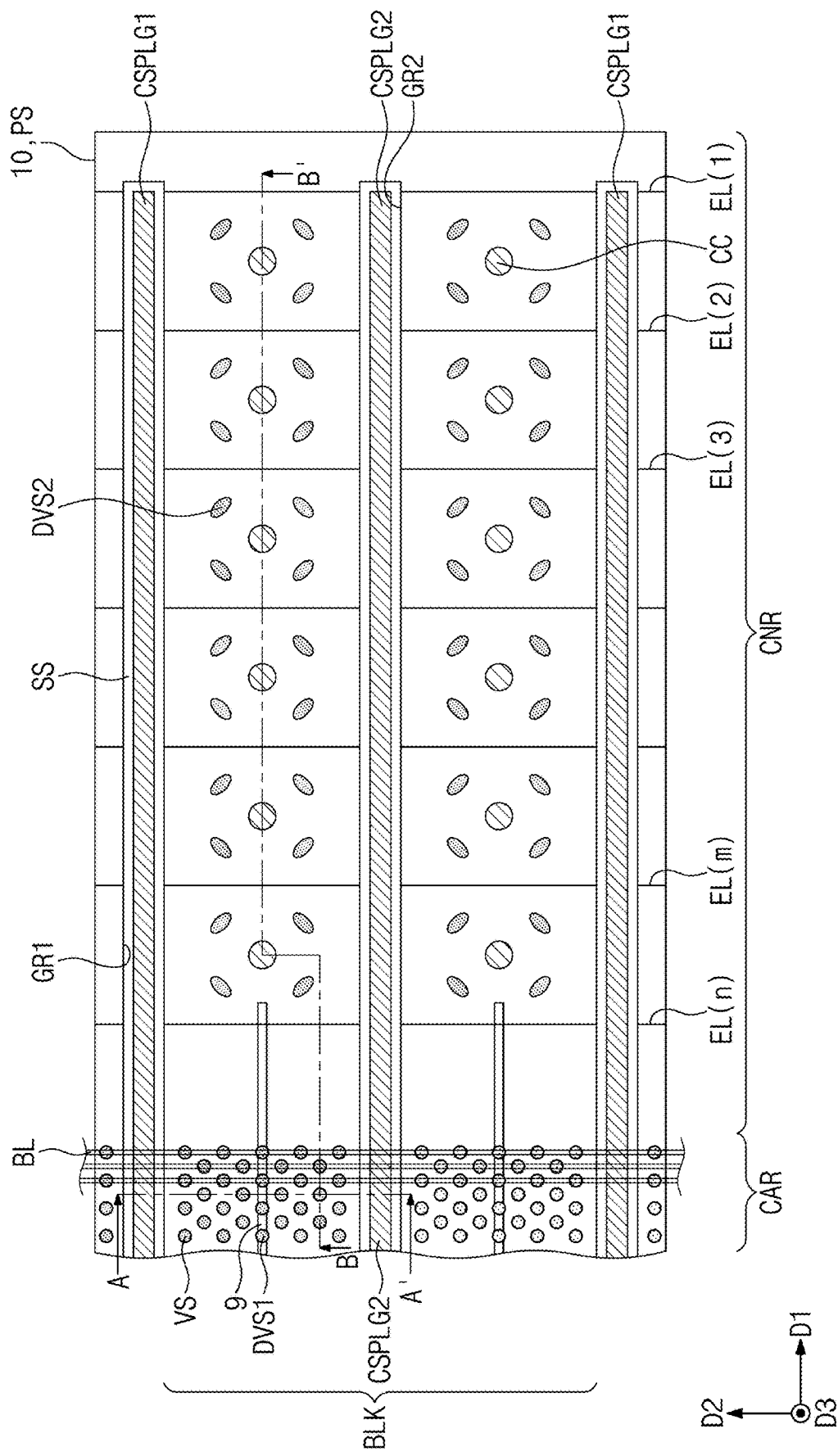
FIG. 2 illustrates a plan view showing a three-dimensional semiconductor memory device according to some example embodiments of the present disclosure.
Figure 3A:
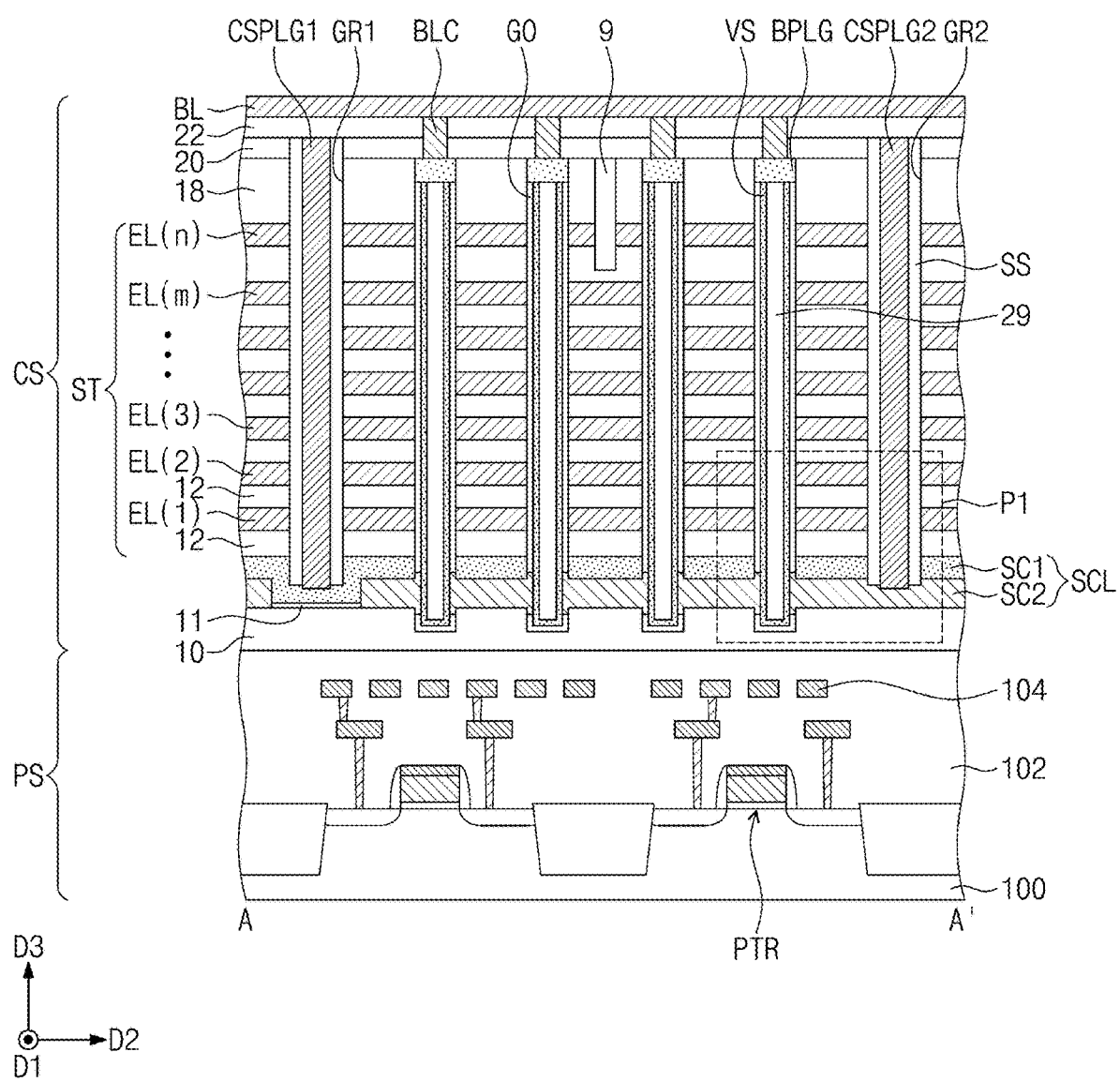
FIG. 3A illustrates a cross-sectional view taken along line A-A' of FIG. 2.
Figure 3B:
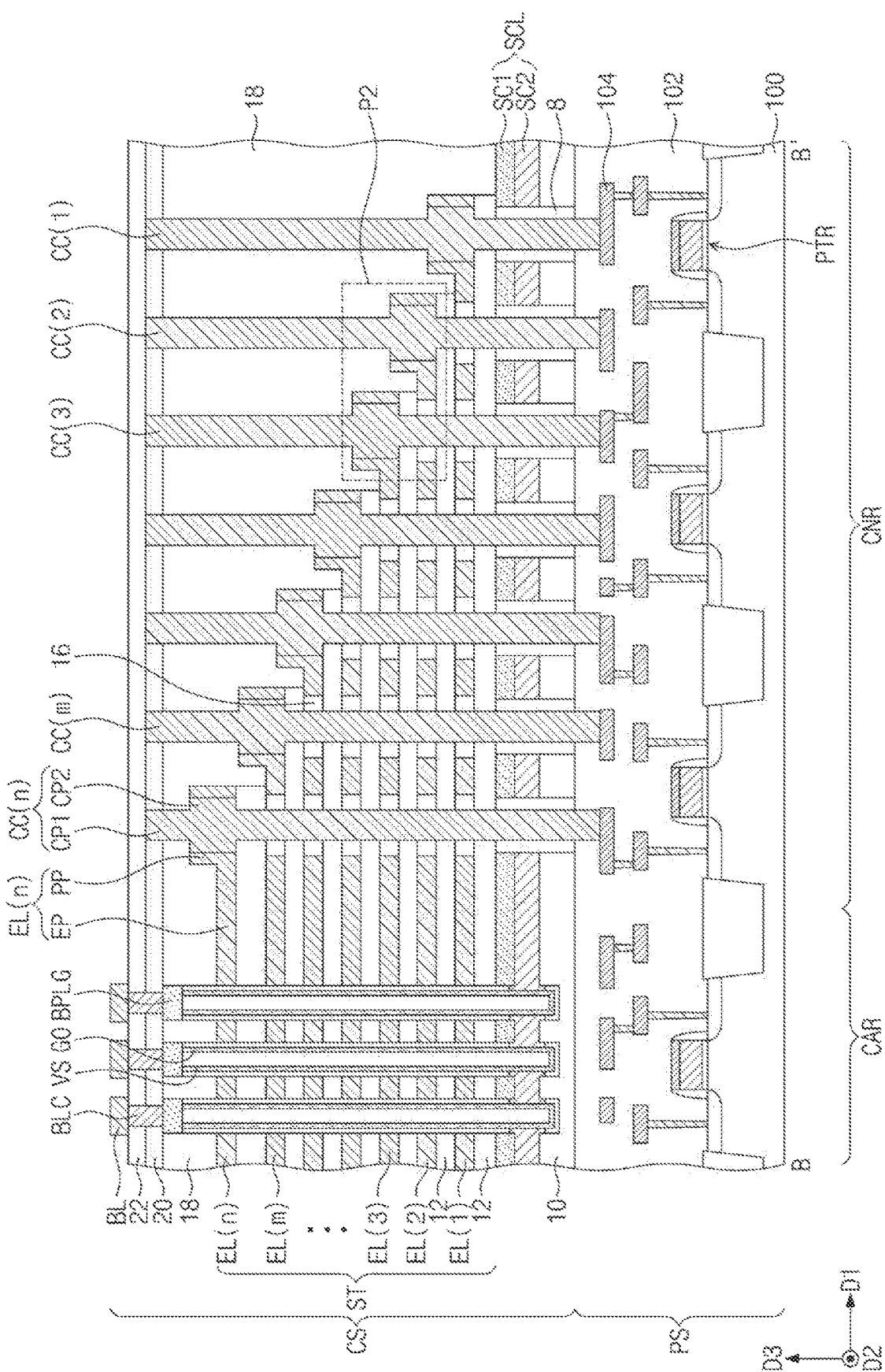
FIG. 3B illustrates a cross-sectional view taken along line B-B' of FIG. 2.
Figure 4A:
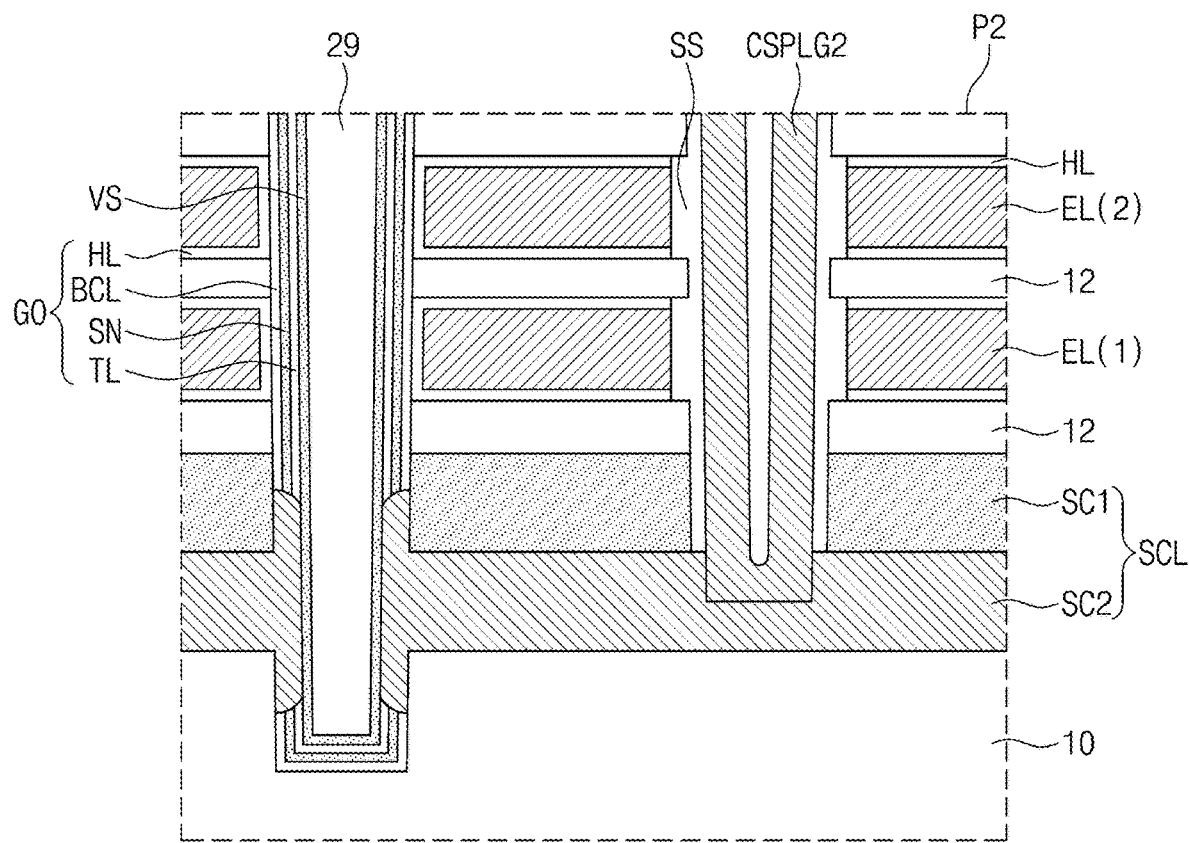
FIG. 4A illustrates an enlarged view showing section P1 of FIG. 3A.
Figure 4B:
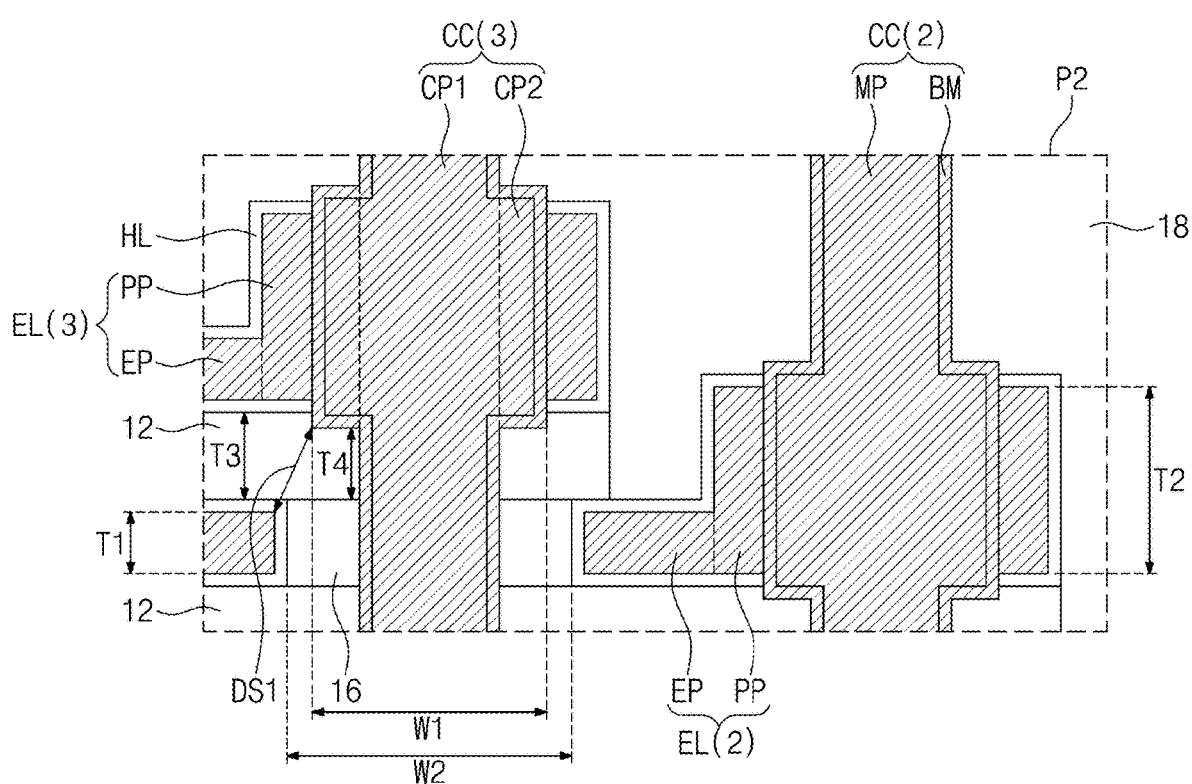
FIG. 4B illustrates an enlarged view showing section P2 of FIG. 3B.
Figure 4C:
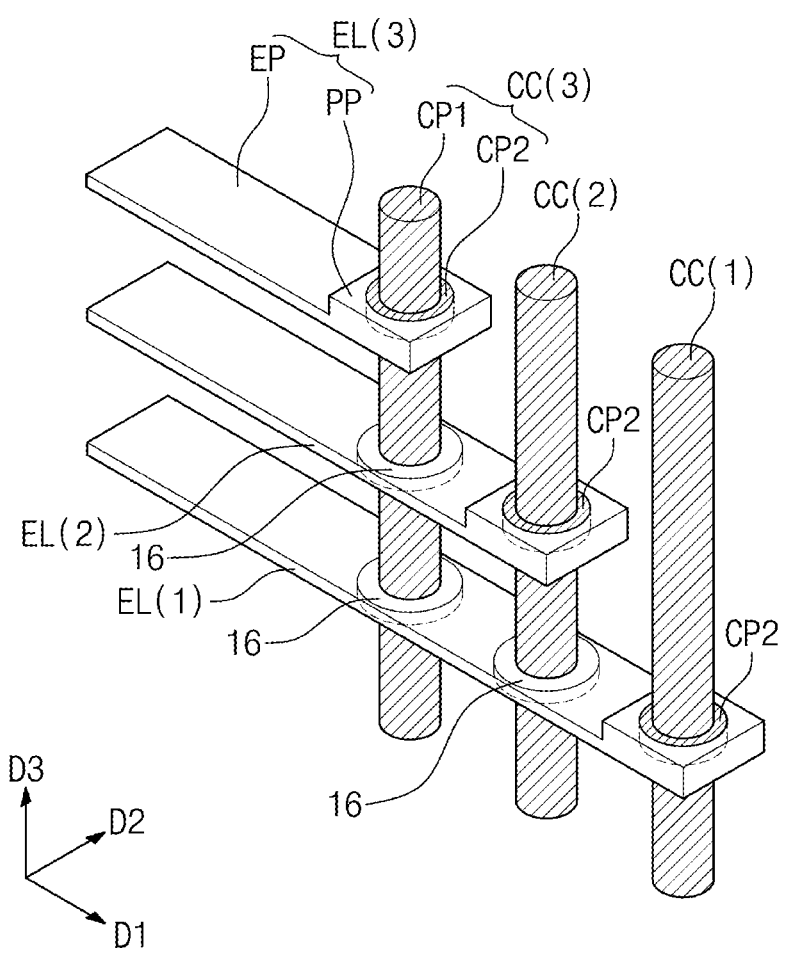
FIG. 4C illustrates a perspective view showing a portion of FIG. 3B.

FIG. 2 illustrates a plan view showing a three-dimensional semiconductor memory device according to some example embodiments of the present disclosure. FIG. 3A illustrates a cross-sectional view taken along line A-A' of FIG. 2. FIG. 3B illustrates a cross-sectional view taken along line B-B' of FIG. 2. FIG. 4A illustrates an enlarged view showing section P1 of FIG. 3A. FIG. 4B illustrates an enlarged view showing section P2 of FIG. 3B. FIG. 4C illustrates a perspective view showing a portion of FIG. 3B.

Referring to FIGS. 2 to 4C, a cell array structure CS may be disposed on a peripheral circuit structure PS. The peripheral circuit structure PS may include peripheral circuit transistors PTR disposed on a peripheral circuit substrate 100, a peripheral interlayer dielectric layer 102 that covers the peripheral circuit transistors PTR, and peripheral circuit lines 104 disposed in the peripheral interlayer dielectric layer 102. The peripheral circuit transistors PTR and the peripheral circuit lines 104 may constitute row and column decoders, a page buffer, and control circuits.

The peripheral interlayer dielectric layer 102 may be a single or multiple layer including at least one selected from a silicon oxide layer, a silicon nitride layer, a silicon oxynitride layer, and a porous dielectric layer. The cell array structure CS may be stacked on the peripheral interlayer dielectric layer 102. The cell array structure CS may include a cell substrate 10. The cell substrate 10 may include a semiconductor layer, such as a polysilicon layer (or a polycrystalline silicon layer) or a single-crystalline silicon layer. The cell substrate 10 may be doped with N-type or P-type impurities.

The cell substrate 10 may include a cell array region CAR and a connection region CNR that are arranged side by side in a first direction D1. The cell array structure CS may include a plurality of memory blocks BLK, and FIG. 2 depicts a plan view of one among the plurality of memory blocks BLK. First source contact plugs CSPLG1 may be disposed between neighboring ones of the plurality of memory blocks BLK. In addition, a second source contact plug CSPLG2 may be disposed on a central portion of each of the memory blocks BLK and may divide each of the memory blocks BLK into two compartments in a second direction D2.

As shown in the plan view of FIG. 2, the first source contact plugs CSPLG1 may have a linear shape that is continuously elongated in the first direction D1. In contrast, the second source contact plugs CSPLG2 may have a discontinuous section (or cut area) on the connection region CNR. The memory blocks BLK, the first source contact plug CSPLG1, and the second source contact plug CSPLG2 may have therebetween dielectric spacers SS formed of a dielectric material. The first source contact plug CSPLG1 and the second course contact plug CSPLG2 may include, for example, at least one selected from doped semiconductor materials (e.g., doped silicon), metals (e.g., tungsten, copper, or aluminum), conductive metal nitrides (e.g., titanium nitride or tantalum nitride), and transition metals (e.g., titanium or tantalum).

A single one of the plurality of memory blocks BLK included in the cell array structure CS may include a source structure SCL and a stack structure ST that are sequentially stacked on the cell substrate 10. On the connection region CNR, a plurality of a substrate dielectric pattern 8 may penetrate the cell substrate 10 and the source structure SCL. The plurality of the substrate dielectric pattern 8 may have isolated island shapes that are spaced apart from each other and linearly arranged along the first direction D1. Each substrate dielectric pattern 8 may include a silicon oxide layer, a silicon nitride layer, or a silicon oxynitride layer.

The stack structure S may include electrodes layers EL and inter-electrode dielectric layers 12 that are alternately stacked. The source structure SCL may include a first source pattern SC1 and a second source pattern SC2 below the first source pattern SC1. The second source pattern SC2 may be interposed between the first source pattern SC1 and the cell substrate 10. A portion of the first source pattern SC1 may penetrate a portion of the second source pattern SC2 and may adjoin the cell substrate 10. A buffer dielectric layer 11 may be interposed between the cell substrate 10 and the portion of the first source pattern SC1. Each of the first source pattern SC1 and the second source pattern SC2 may include a single-crystalline or polycrystalline silicon pattern doped with, for example, N-type or P-type impurities. The impurities doped into the second source pattern SC2 may have the same conductivity type as that of the impurities doped into the first source pattern SC1. The impurities doped into the second source pattern SC2 may have a concentration the same as or different from that of the impurities doped into the first source pattern SC1. The source structure SCL may correspond to the common source line CSL of FIG. 1A.

The buffer dielectric layer 11 and the inter-electrode dielectric layers 12 may include, for example, a silicon oxide layer. The electrode layers EL may include metal, such as tungsten. The electrode layers EL may have their end portions that constitute a stepwise shape on the connection region CNR. The stack structure ST may be covered with a planarized dielectric layer 18. A first upper dielectric layer 20 and a second upper dielectric layer 22 may be sequentially stacked on the planarized dielectric layer 18. The planarized dielectric layer 18, the first upper dielectric layer 20, and the second upper dielectric layer 22 may include the same dielectric material as that of the inter-electrode dielectric layers 12. A first groove GR1 and a second groove GR2 may be formed spaced apart from each other while penetrating the first upper dielectric layer 20, the planarized dielectric layer 18, and the stack structure ST. The first groove GR1 may have the first source contact plug CSPLG1 and the dielectric spacer SS disposed therein, and the second groove GR2 may have the second source contact plug CSPLG2 and the dielectric spacer SS disposed therein. The first source contact plug CSPLG1 may be in contact with the first source pattern SC1. The second source contact plug CSPLG2 may be in contact with the second source pattern SC2.

According to some example embodiments, a vertical NAND Flash memory device may be adopted as a three-dimensional semiconductor memory device of the present disclosure. Separation dielectric patterns 9 may divide an uppermost electrode layer EL(n) into a plurality of line patterns that extend in the first direction D1 and correspond to the first and second gate upper lines UL1 and UL2 of FIG. 1A. A lowermost electrode layer EL(1) may correspond to the first and second gate lower lines LL1 and LL2 of FIG. 1A. Other electrode layers EL(2) to EL(m) may correspond to the word lines WL of FIG. 1A. In this description, the subscripts m and n are a natural number equal to or greater than 4.

Referring to FIGS. 2 and 3A, on the cell array region CAR, a plurality of cell vertical patterns VS may penetrate the planarized dielectric layer 18, the stack structure ST, and the source structure SCL. Although not shown in FIG. 3A but illustrated in FIG. 2, the cell array region CAR may include first dummy vertical patterns DVS1 between the cell vertical patterns VS. The first dummy vertical patterns DVS1 may be linearly disposed along the first direction D1 on a central portion of one compartment of the memory block BLK. The separation dielectric patterns 9 may be disposed between upper portions of the first dummy vertical patterns DVS1. The separation dielectric patterns 9 may include the same dielectric material as that of the inter-electrode dielectric layers 12.

Referring to FIG. 2, on the connection region CNR, a plurality of second dummy vertical patterns DVS2 may penetrate the planarized dielectric layer 18, the stack structure ST, and the source structure SCL. The second dummy vertical patterns DVS2 may have widths greater than those of the cell vertical patterns VS and those of the first dummy vertical patterns DVS1. The second dummy vertical patterns DVS2 may each have an oval shape when viewed in plan.

The vertical patterns VS, the first dummy vertical patterns DVS1, and the second dummy vertical patterns DVS2 may include a single-crystalline or polycrystalline silicon layer that is doped with or without impurities. The vertical patterns VS, the first dummy vertical patterns DVS1, and the second dummy vertical patterns DVS2 may each have a hollow shell shape. Each of the vertical patterns VS, the first dummy vertical patterns DVS1, and the second dummy vertical patterns DVS2 may include a buried dielectric pattern 29 that fills an inside thereof. The buried dielectric pattern 29 may have a single-layered or multi-layered structure including, for example, at least one selected from a silicon oxide layer, a silicon nitride layer, and a silicon oxynitride layer. A bit-line pad BPLG may be disposed on each of the vertical patterns VS, the first dummy vertical patterns DVS1, and the second dummy vertical patterns DVS2. The bit-line pad BPLG may include impurity-doped polysilicon or metal, such as tungsten, aluminum, or copper.

A gate dielectric layer GO may be interposed between the stack structure ST and each of the vertical patterns VS, the first dummy vertical patterns DVS1, and the second dummy vertical patterns DVS2. The second source pattern SC2 may penetrate the gate dielectric layer GO and may contact lower lateral surfaces of at least cell vertical patterns VS among the vertical patterns VS, the first dummy vertical patterns DVS1, and the second dummy vertical patterns DVS2.

Referring to FIG. 4A, the gate dielectric layer GO may include a tunnel dielectric layer TL, a charge storage layer SN, and a blocking dielectric layer BCL. The charge storage layer SN may be a trap dielectric layer, a floating gate electrode, or a dielectric layer including conductive nanodots. For example, the charge storage layer SN may include at least one selected from a silicon nitride layer, a silicon oxynitride layer, a silicon-rich nitride layer, a nano-crystalline silicon layer, and a laminated trap layer. The tunnel dielectric layer TL may include one of materials each having a bandgap greater than that of the charge storage layer SN, and the blocking dielectric layer BCL may include a high-k dielectric layer such as an aluminum oxide layer or a hafnium oxide layer.

The gate dielectric layer GO may further include a high-k dielectric layer HL. The high-k dielectric layer HL may be interposed between the blocking dielectric layer BCL and the electrode layers EL. The high-k dielectric layer HL may be interposed between the electrode layers EL and the inter-electrode dielectric layers 12. The high-k dielectric layer HL may include a metal oxide layer, such as a hafnium oxide layer or an aluminum oxide layer, having a dielectric constant greater than that of a silicon oxide layer. The second source pattern SC2 may divide the gate dielectric layer GO into two pieces. A portion of the dielectric spacer SS may be interposed between the inter-electrode dielectric layers 12 that protrude in the second direction D2 toward the electrode layers EL, thereby being interposed between the electrode layers EL. The dielectric spacer SS may have an uneven structure at a lateral surface thereof.

Referring to FIGS. 3B, 4B, and 4C, each of the electrode layers EL may include an electrode part EP and a pad part PP. The electrode part EP may overlap the cell array region CAR and extend in the first direction D1. The electrode part EP may have a first thickness T1. The pad part PP may correspond to the end portion of the electrode layer EL. The pad part PP may have a second thickness T2 greater than the first thickness T1. The pad parts PP of the electrode layers EL may constitute a stepwise shape.

The pad parts PP of the electrode layers EL may be connected to corresponding cell contacts CC. The cell contacts CC may correspond to portions of the first connection lines 1115 depicted in FIG. 1A. The cell contacts CC may connect the electrode layers EL to the decoder circuit (see decoder circuit 1110 of FIG. 1A) of the peripheral circuit structure PS. The cell contacts CC may correspondingly penetrate the pad parts PP of the electrode layers EL. When viewed in cross-section, each of the cell contacts CC may include a main contact part MP and a diffusion break layer BM that covers a surface of the main contact part MP. The main contact part MP may include metal, for example, tungsten, copper, or aluminum. The diffusion break layer BM may include at least one selected from a titanium layer, a titanium nitride layer, a tantalum layer, or a tantalum nitride layer. Morphologically, the cell contact CC may each have a columnar part CP1 that extends in a vertical direction (e.g., a third direction D3) relative to a top surface of the cell substrate 10 and a connection part CP2 that laterally protrudes from a lateral surface of the columnar part CP1. The columnar part CP1 may have a circular shape when viewed in plan. The connection part CP2 may have an annular shape when viewed in plan. The connection part CP2 of the cell contacts CC may each have a first width W1.

The connection part CP2 of the cell contacts CC may be in contact with the pad parts PP of the electrode layers EL. The columnar part CP1 of the cell contact CC may penetrate the electrode part EP of another electrode layer EL positioned below the pad part PP. For example, referring to FIG. 4B, the connection part CP2 of a second cell contact CC(2) may be in contact with the pad part PP of a second electrode layer EL(2). The connection part CP2 of a third cell contact CC(3) may be in contact with the pad part PP of a third electrode layer EL(3). The columnar part CP1 of the third cell contact CC(3) may penetrate the electrode part EP of the second electrode layer EL(2) below the third electrode layer EL(3). A contact dielectric pattern 16 may be interposed between the columnar part CP1 of the third cell contact CC(3) and the electrode part EP of the second electrode layer EL(2).

Each columnar part CP1 of the cell contacts CC may penetrate the inter-electrode dielectric layers 12, the substrate dielectric pattern 8, and a portion of the peripheral interlayer dielectric layer 102, and may have connections with the peripheral circuit lines 104. A plurality of the contact dielectric pattern 16 may be correspondingly interposed between the columnar parts CP1 of the cell contacts CC and the electrode parts EP of the electrode layers EL. The plurality of the contact dielectric pattern 16 may include, for example, a silicon oxide layer. Each pattern in the plurality of the contact dielectric pattern 16 may have an annular shape when viewed in plan. Each pattern of the plurality of the contact dielectric pattern 16 may have a second width W2 greater than the first width W1.

The connection part CP2 of the cell contacts CC may not overlap the electrode parts EP of the electrode layers EL. The connection part CP2 of the cell contacts CC may vertically overlap the plurality of the contact dielectric pattern 16. The high-k dielectric layer HL may cover a lateral surface of the contact dielectric pattern 16. The high-k dielectric layer HL may be in contact with the diffusion break layer BM at a position of the connection part CP2 of the cell contact CC. The diffusion break layer BM of the cell contact CC may be interposed between the pad part PP of the electrode layer EL and the main contact part MP that corresponds to the connection part CP2 of the cell contact CC. The connection part CP2 of the cell contact CC may have a top surface higher than that of the high-k dielectric layer HL adjacent to the connection part CP2 of the cell contact CC. The connection part CP2 of the cell contact CC may have a bottom surface lower than that of the high-k dielectric layer HL adjacent to the connection part CP2 of the cell contact CC. The inter-electrode dielectric layers 12 may have a third thickness T3 between the electrode layers EL. The inter-electrode dielectric layers 12 may have, between the contact dielectric pattern 16 and the connection part CP2 of the cell contact CC, a fourth thickness T4 less than the third thickness T3. An interval DS1 between the connection part CP2 of the cell contacts CC and their adjacent electrode layers EL may be greater than the third thickness T3 of the inter-electrode dielectric layers 12.

A three-dimensional semiconductor memory device according to some example embodiments of the present disclosure may be configured such that the inter-electrode dielectric layers 12 maintain the third thickness T3 between the electrode layers EL. In addition, the interval DS1 between the connection part CP2 of the cell contacts CC and their adjacent electrode layers EL may be maintained equal to or greater than the third thickness T3. Therefore, when operating the three-dimensional semiconductor memory device, interference between the electrodes EL may be minimized and breakdown voltage drop may be prevented. As a result, it may be possible to prohibit operating errors and to increase reliability of the three-dimensional semiconductor memory device.

FIGS. 5A to 5E illustrate cross-sectional views showing a method of fabricating a three-dimensional semiconductor memory device having the cross-section of FIG. 3A. FIGS. 6A to 6G and 6I to 6K illustrate cross-sectional views showing a method of fabricating a three-dimensional semiconductor memory device having the cross-section of FIG. 3B according to some example embodiments of the present disclosure. FIG. 6H illustrates an enlarged view showing section P3 of FIG. 6G. FIG. 6L illustrates an enlarged view showing section P4 of FIG. 6K.

Figure 5A:
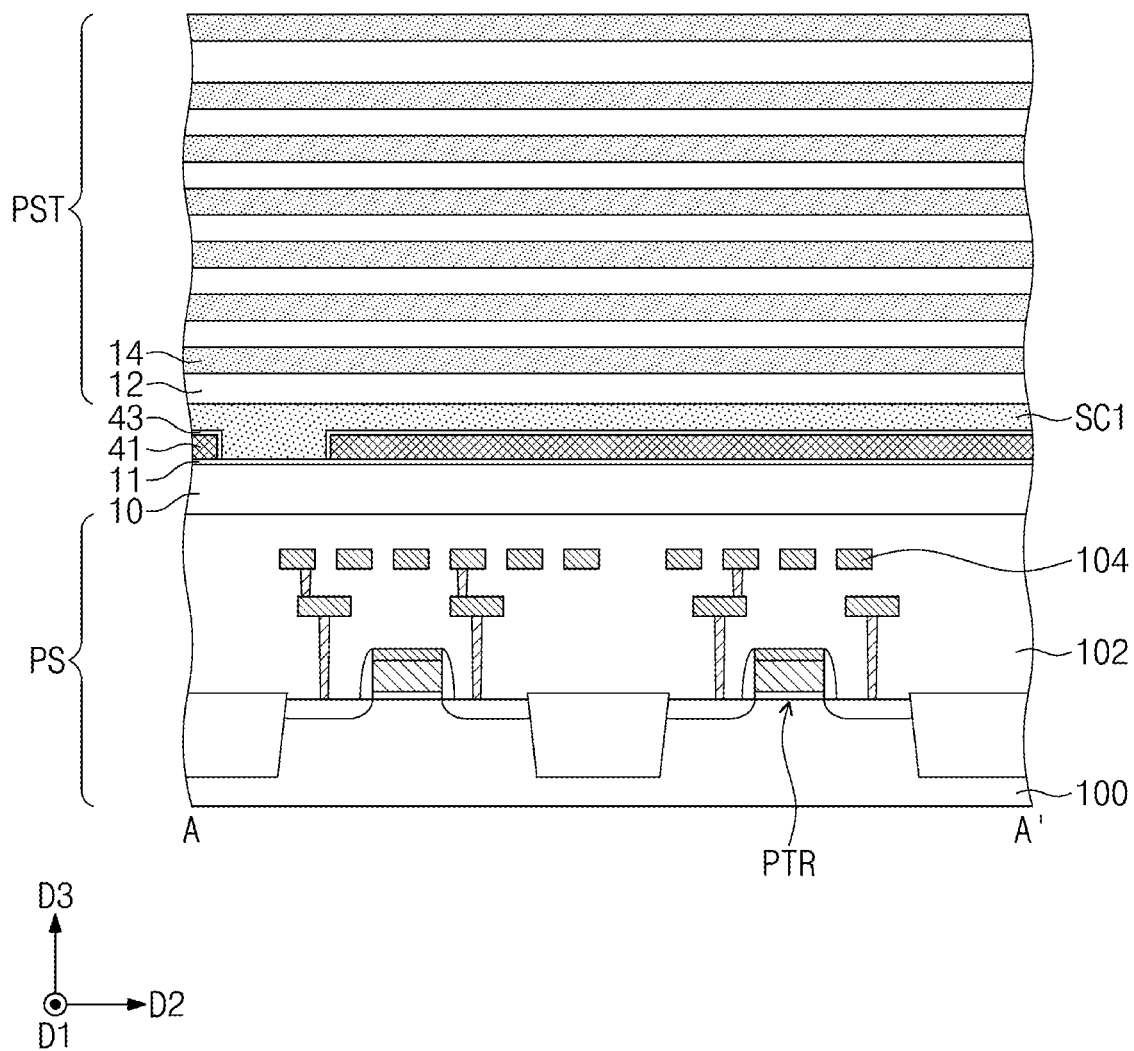
FIG. 5A illustrates a first cross-sectional view showing a part of method of fabricating a three-dimensional semiconductor memory device having the cross-section of FIG. 3A according to some example embodiments of the present disclosure.
Figure 6A:
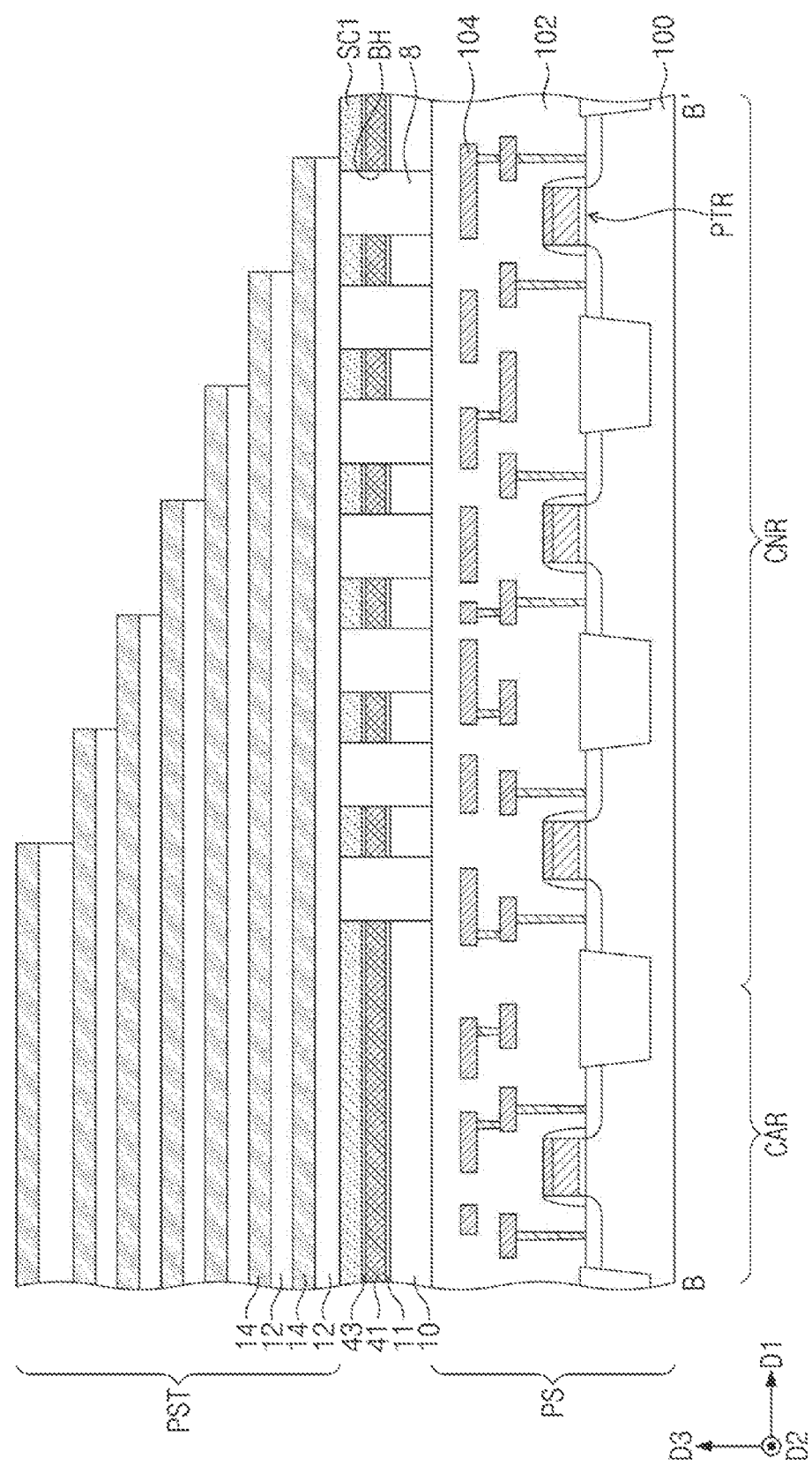
FIG. 6A illustrates a first cross-sectional view showing a part of a method of fabricating a three-dimensional semiconductor memory device having the cross-section of FIG. 3B according to some example embodiments of the present disclosure.

Referring to FIGS. 5A and 6A, a peripheral circuit structure PS may be fabricated. The fabrication of the peripheral circuit structure PS may include forming, on a peripheral circuit substrate 100, a device isolation layer to limit active regions. Transistors PTR may be formed on the active regions. A peripheral interlayer dielectric layer 102, that is multi-layered, may be formed to cover the transistors PTR, and peripheral circuit lines 104 may be formed in the peripheral interlayer dielectric layer 102. A cell substrate 10 may be formed on the peripheral interlayer dielectric layer 102. The cell substrate 10 may include a cell array region CAR and a connection region CNR. A buffer dielectric layer 11 may be formed on the cell substrate 10. The buffer dielectric layer 11 may include, for example, one or more of a silicon oxide layer, a silicon-germanium layer, and a polysilicon layer. A deposition process and an etching process may be performed to form a lower sacrificial layer 41 on the buffer dielectric layer 11. On the cell array region CAR, the lower sacrificial layer 41 may be partially patterned to expose a top surface of the buffer dielectric layer 11. An auxiliary buffer dielectric layer 43 may be formed on top and lateral surfaces of the lower sacrificial layer 41. The auxiliary buffer dielectric layer 43 may include, for example, a silicon oxide layer. A first source pattern SC1 may be formed on the auxiliary buffer dielectric layer 43. The first source pattern SC1 may include, for example, an impurity-doped semiconductor layer. On the connection region CNR, the first source pattern SC1, the auxiliary buffer dielectric layer 43, the lower sacrificial layer 41, the buffer dielectric layer 11, and the cell substrate 10 may be sequentially etched to form lower holes BH that expose a top surface of the peripheral interlayer dielectric layer 102. Each substrate dielectric pattern 8 may be formed to fill corresponding ones of the lower holes BH. A preliminary stack structure PST may be formed by alternately stacking inter-electrode dielectric layers 12 and mold sacrificial layers 14 on the first source pattern SC1. The inter-electrode dielectric layers 12 may include, for example, a silicon oxide layer. The mold sacrificial layers 14 may include a material, such as silicon nitride, having an etch selectivity with respect to the inter-electrode dielectric layers 12. A trimming process and an etching process may be repeatedly performed such that the inter-electrode dielectric layers 12 and the mold sacrificial layers 14 may have their end portions that constitute a stepwise shape on the connection region CNR.

Figure 6B:
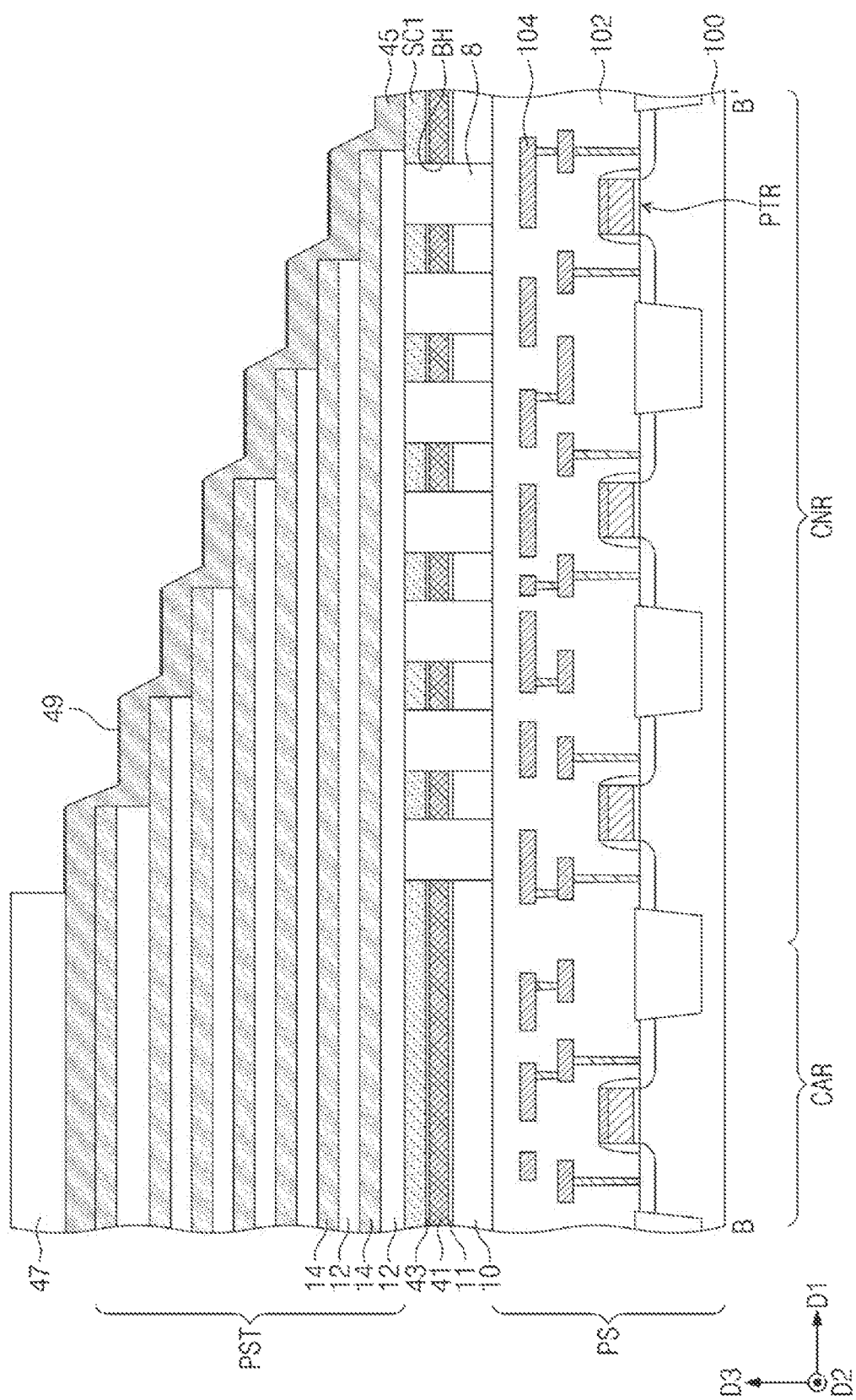
FIG. 6B illustrates a second cross-sectional view showing a part of the method of fabricating the three-dimensional semiconductor memory device having the cross-section of FIG. 3B according to some example embodiments of the present disclosure.

Referring to FIG. 6B, a preliminary pad layer 45 may be formed on an entire surface of the preliminary stack structure PST. The preliminary pad layer 45 may be formed by performing a deposition process whose step coverage is poor, for example, physical vapor deposition (PVD), low-pressure chemical vapor deposition (LPCVD), or sputtering. The preliminary pad layer 45 may include the same material (e.g., silicon nitride) as that of the mold sacrificial layers 14. A mask pattern 47 may be formed to cover the preliminary stack structure PST on the cell array region CAR. In this state, a first plasma treatment process may be performed. The first plasma treatment process may be executed in which an inert gas, such as argon or helium, is used. In the first plasma treatment process, the preliminary pad layer 45 may have portions on top surfaces of the mold sacrificial layers 14, and the portions of the preliminary pad layer 45 may be relatively more exposed to inert gas plasma to form rigid portions 49. In contrast, the preliminary pad layer 45 may have curved portions adjacent to lateral surfaces of the mold sacrificial layers 14, and the curved portions of the preliminary pad layer 45 may be relatively less exposed to inert gas plasma and thus may be less hard.

Figure 6C:
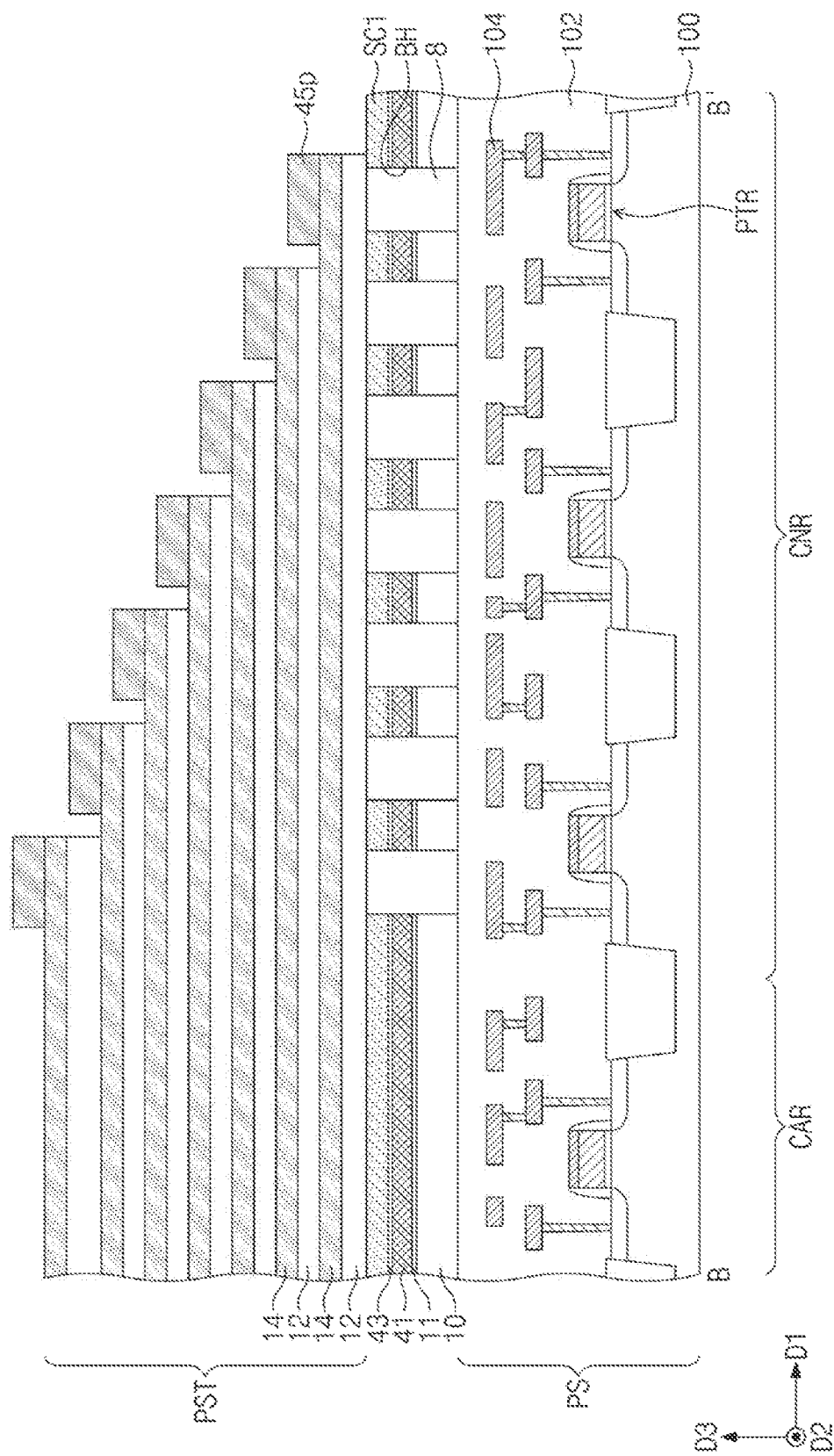
FIG. 6C illustrates a third cross-sectional view showing a part of the method of fabricating the three-dimensional semiconductor memory device having the cross-section of FIG. 3B according to some example embodiments of the present disclosure.

Referring to FIGS. 6B and 6C, the mask pattern 47 may be removed. The preliminary pad layer 45 may undergo a blanket anisotropic etching process to form a plurality of preliminary pad pattern 45p. The plurality of the preliminary pad pattern 45p may correspond to portions of the preliminary pad layer 45 that are positioned below the rigid portions 49 of FIG. 6B. The preliminary pad layer 45 on sides of the rigid portions 49 may all be removed to expose the top and lateral surfaces of the mold sacrificial layers 14 and lateral surfaces of the inter-electrode dielectric layers 12. The plurality of the preliminary pad pattern 45p may be formed spaced apart from each other.

Figure 6D:
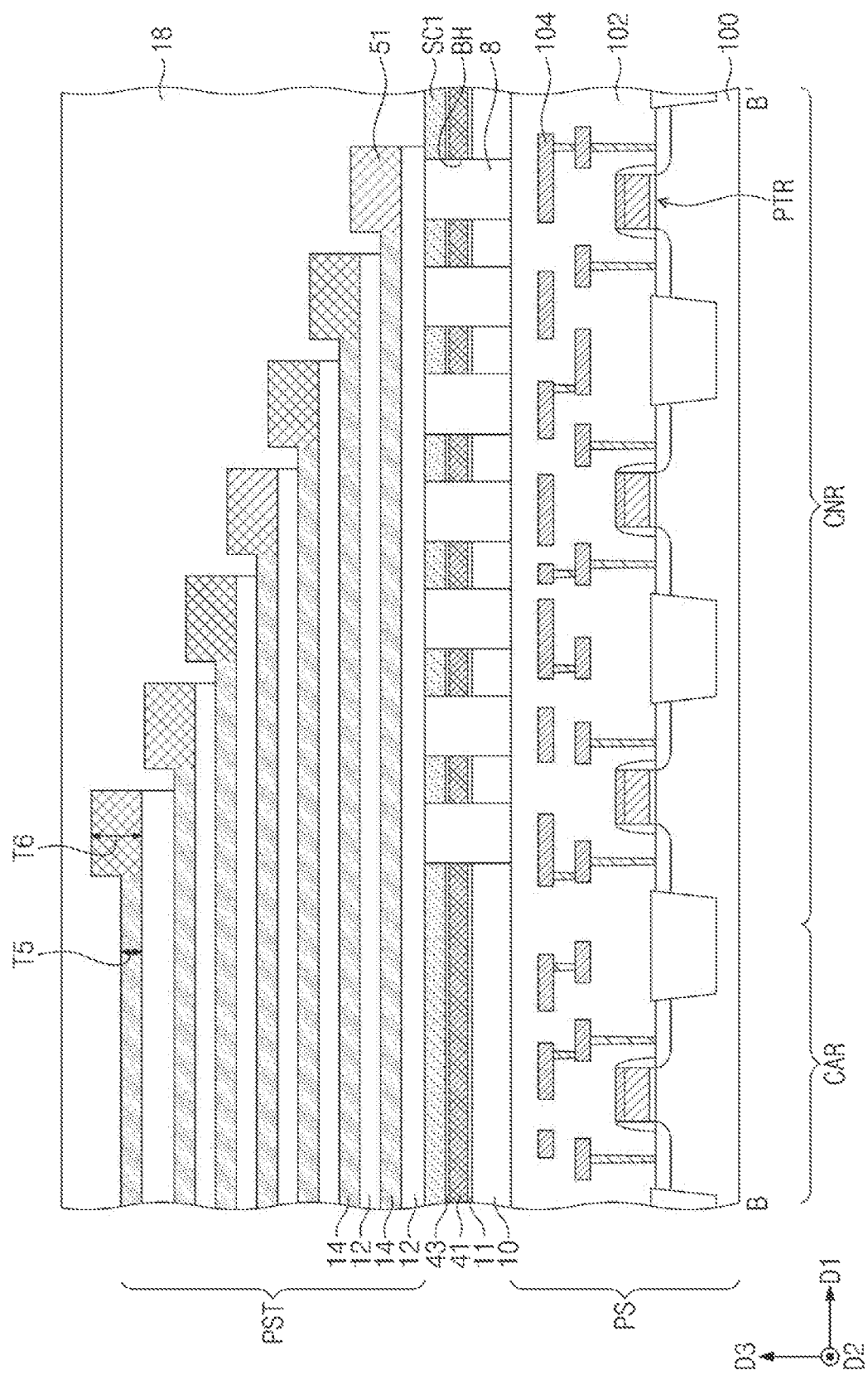
FIG. 6D illustrates a fourth cross-sectional view showing a part of the method of fabricating the three-dimensional semiconductor memory device having the cross-section of FIG. 3B according to some example embodiments of the present disclosure.

Referring to FIGS. 6C and 6D, a second plasma treatment process may be performed to partially convert the plurality of the preliminary pad pattern 45p and their underlying mold sacrificial layers 14 into unified preliminary pad patterns 51. The second plasma treatment process may be executed in which an inert gas, such as argon or helium, is used. The unified preliminary pad patterns 51 may be formed by only the first plasma treatment process. A planarized dielectric layer 18 may be formed to cover the preliminary stack structure PST. The mold sacrificial layers 14 may each have a fifth thickness T5. The unified preliminary pad patterns 51 may each have a sixth thickness T6 greater than the fifth thickness T5.

Figure 5B:
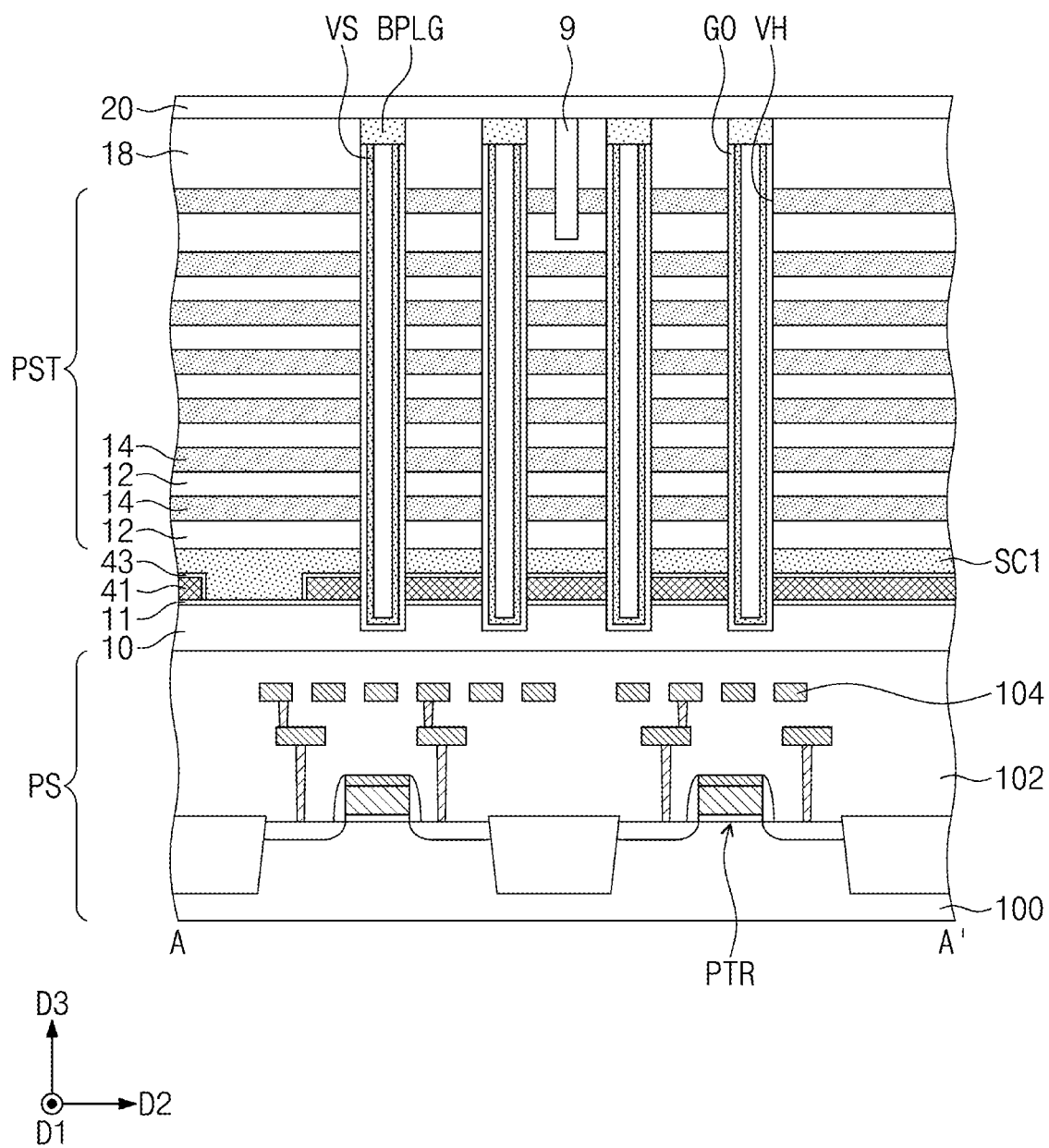
FIG. 5B illustrates a second cross-sectional view showing a part of the method of fabricating the three-dimensional semiconductor memory device having the cross-section of FIG. 3A according to some example embodiments of the present disclosure.
Figure 6E:
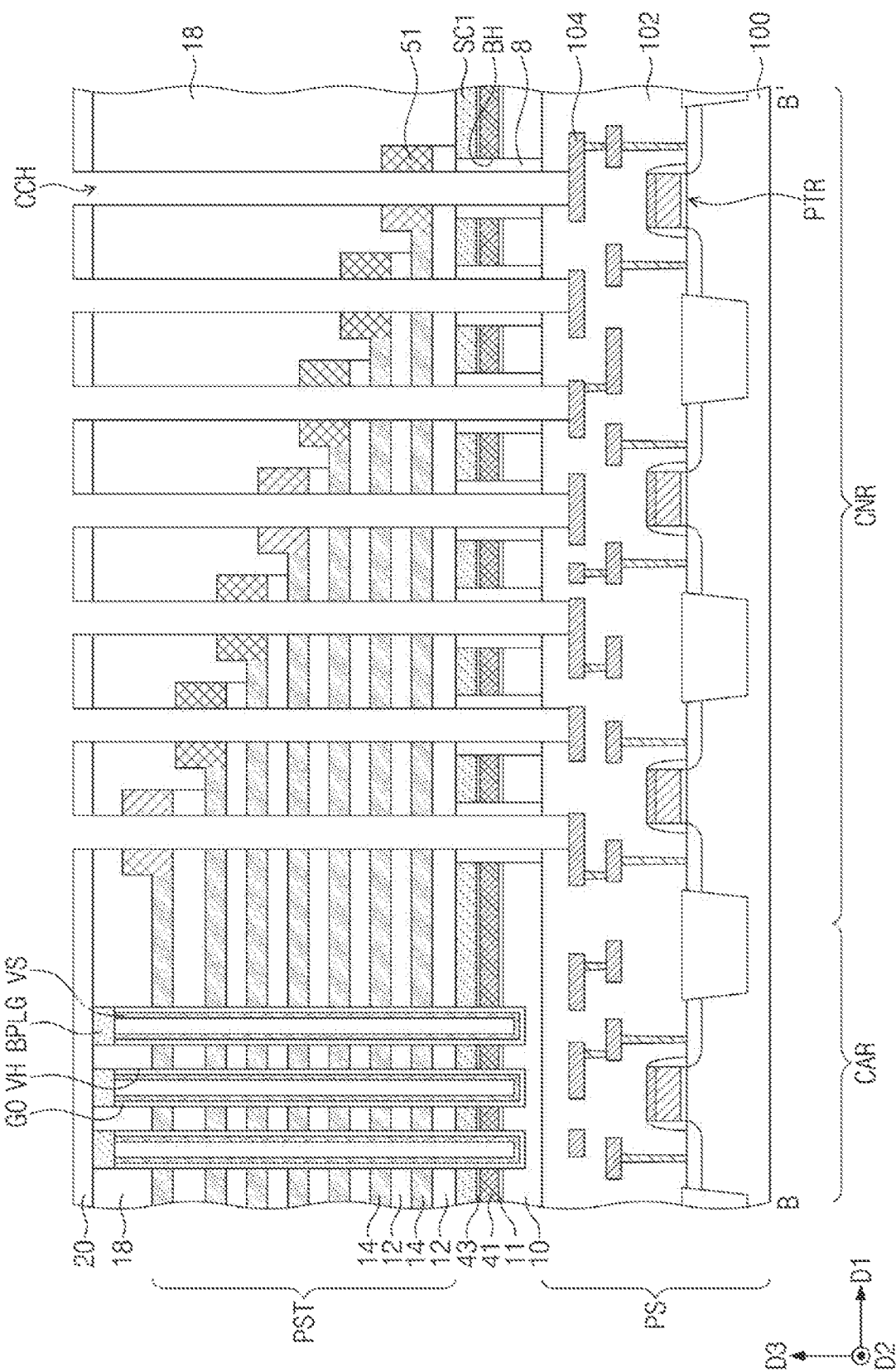
FIG. 6E illustrates a fifth cross-sectional view showing a part of the method of fabricating the three-dimensional semiconductor memory device having the cross-section of FIG. 3B according to some example embodiments of the present disclosure.

Referring to FIGS. 5B and 6E, on the cell array region CAR, the planarized dielectric layer 18 and an uppermost one of the mold sacrificial layers 14 may be partially removed to form a recess region that extends in a first direction D1, and then the region may be filled with a dielectric layer to form one of the separation dielectric patterns 9. Vertical holes VH may be formed by partially etching the planarized dielectric layer 18, the preliminary stack structure PST, the first source pattern SC1, the auxiliary buffer dielectric layer 43, the lower sacrificial layer 41, the buffer dielectric layer 11, and the cell substrate 10. A gate dielectric layer GO and one from among the vertical patterns VS, the first dummy vertical patterns DVS1, and the second dummy vertical patterns DVS2 may be formed to sequentially and conformally cover an inner wall of each of the vertical holes VH. A plurality of the buried dielectric pattern 29 may be formed to fill the vertical holes VH. The plurality of the buried dielectric pattern 29, the vertical patterns VS, the first dummy vertical patterns DVS1, the second dummy vertical patterns DVS2, and the gate dielectric layers GO may be partially removed to form recess regions, and then the recess regions may be filled with conductive layers to form bit-line pads BPLG. A first upper dielectric layer 20 may be formed on the planarized dielectric layer 18. On the connection region CNR, the first upper dielectric layer 20, the planarized dielectric layer 18, the preliminary stack structure PST, the substrate dielectric pattern 8, and the peripheral interlayer dielectric layer 102 may be partially removed to form cell contact holes CCH that expose the peripheral circuit lines 104. The cell contact holes CCH may expose lateral surfaces of the unified preliminary pad patterns 51, lateral surfaces of the inter-electrode dielectric layers 12, and lateral surfaces of the mold sacrificial layers 14.

Referring to FIGS. 6E and 6F, an isotropic etching process may be performed through the cell contact holes CCH to partially remove the unified preliminary pad patterns 51 and the mold sacrificial layers 14. Thus, the unified preliminary pad patterns 51 may be removed to form first inner holes CPH. In addition, the mold sacrificial layers 14 may be removed to form second inner holes EPH. A difference in density and/or rigidity between the unified preliminary pad patterns 51 and the mold sacrificial layers 14 may cause the unified preliminary pad patterns 51 to have a relatively lower etching rate and the mold sacrificial layers 14 to have a relatively higher etching rate. Therefore, the first inner hole CPH may be formed to have a first width W1, and the second inner hole EPH may be formed to have a second width W2 greater than the first width W1. The first inner hole CPH may have a height that is the same as the sixth thickness T6 of the unified preliminary pad patterns 51. The second inner hole EPH may have a height that is the same as the fifth thickness T5 of the mold sacrificial layers 14. A contact dielectric layer 160 may be conformally formed on an entire surface of the first upper dielectric layer 20. At this stage, the contact dielectric layer 160 may have a thickness that is about half the fifth thickness T5 of the mold sacrificial layers 14. Because the sixth thickness T6 is greater than the fifth thickness T5, the contact dielectric layer 160 may completely fill the second inner hole EPH, but may incompletely fill the first inner hole CPH while conformally covering an inner wall of the first inner hole CPH.

Figure 6G:
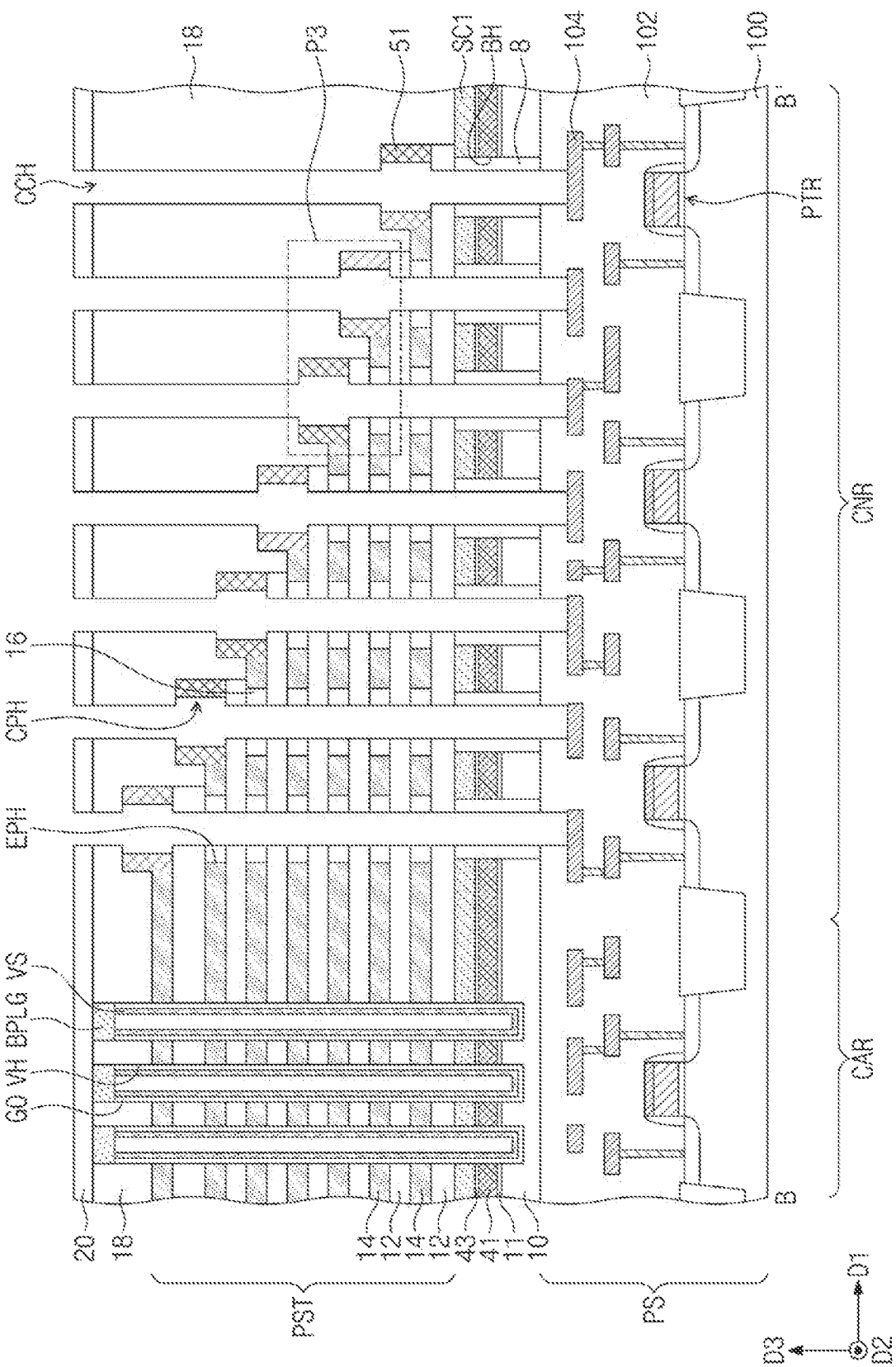
FIG. 6G illustrates a seventh cross-sectional view showing a part of the method of fabricating the three-dimensional semiconductor memory device having the cross-section of FIG. 3B according to some example embodiments of the present disclosure.
Figure 6H:
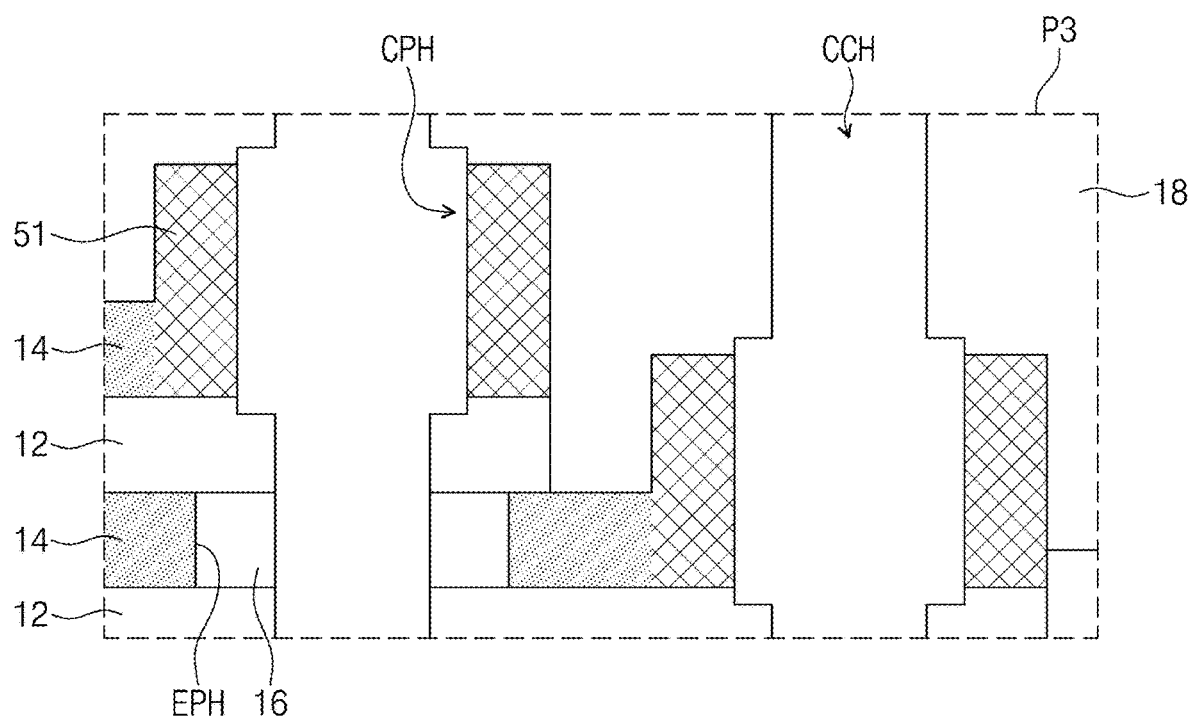
FIG. 6H illustrates an enlarged view showing section P3 of FIG. 6G.
Figure 6J:
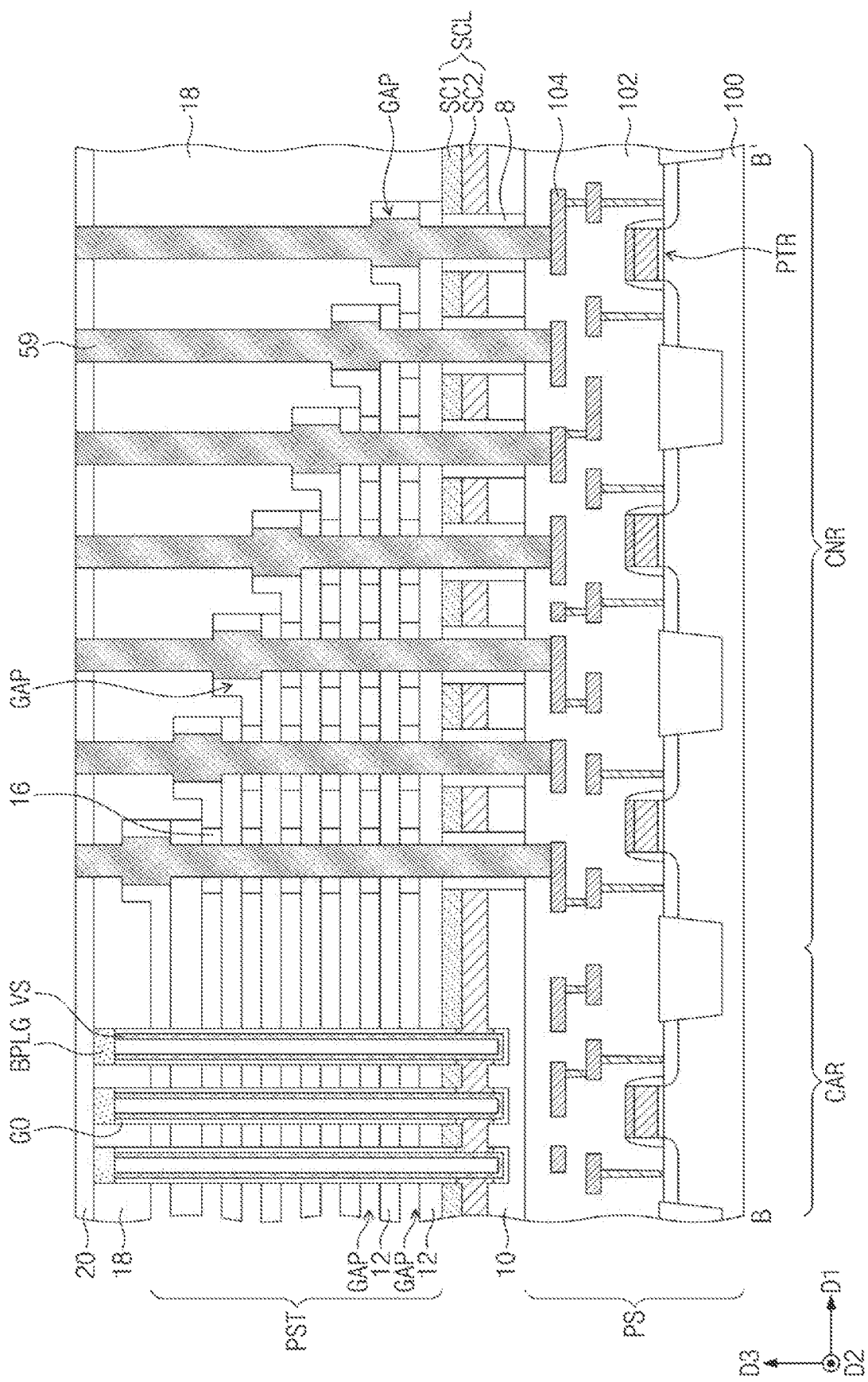
FIG. 6J illustrates a ninth cross-sectional view showing a part of the method of fabricating the three-dimensional semiconductor memory device having the cross-section of FIG. 3B according to some example embodiments of the present disclosure.

Referring to FIGS. 6F, 6G, and 6H, an isotropic etching process may be performed such that the contact dielectric layer 160 may be partially removed to form a plurality of a contact dielectric pattern 16 in the second inner holes EPH and to expose inner walls of the first inner holes CPH, inner wall of the cell contact holes CCH, and the peripheral circuit lines 104. At this stage, the contact dielectric layer 160 may be over-etched. Because the first inner hole CPH has a relatively greater height (or the sixth thickness T6), an etchant may easily reach to partially etch not only the contact dielectric layer 160 in the first inner hole CPH, but the one of the inter-electrode dielectric layers 12 and the planarized dielectric layer 18 that are formed in the vicinity of the contact dielectric layer 160 in the first inner hole CPH. Therefore, the inter-electrode dielectric layers 12 may have a relatively smaller thickness below the first inner hole CPH.

In the present embodiment, the mold sacrificial layers 14 may be absent below the first inner hole CPH. The contact dielectric pattern 16 may be positioned below the first inner hole CPH. Thus, even when the first inner hole CPH has a connection part CP2 of a cell contact CC which will be formed subsequently, and even when one of the mold sacrificial layers 14 is replaced with an electrode layer EL which will be formed afterwards, the connection part CP2 and its underlying one of the electrode layer EL may maintain therebetween an interval equal to or greater than a certain distance. As a result, it may be possible to prevent an abnormal reduction in interval between the cell contact CC and its neighboring one of the electrode layer EL.

Figure 5C:
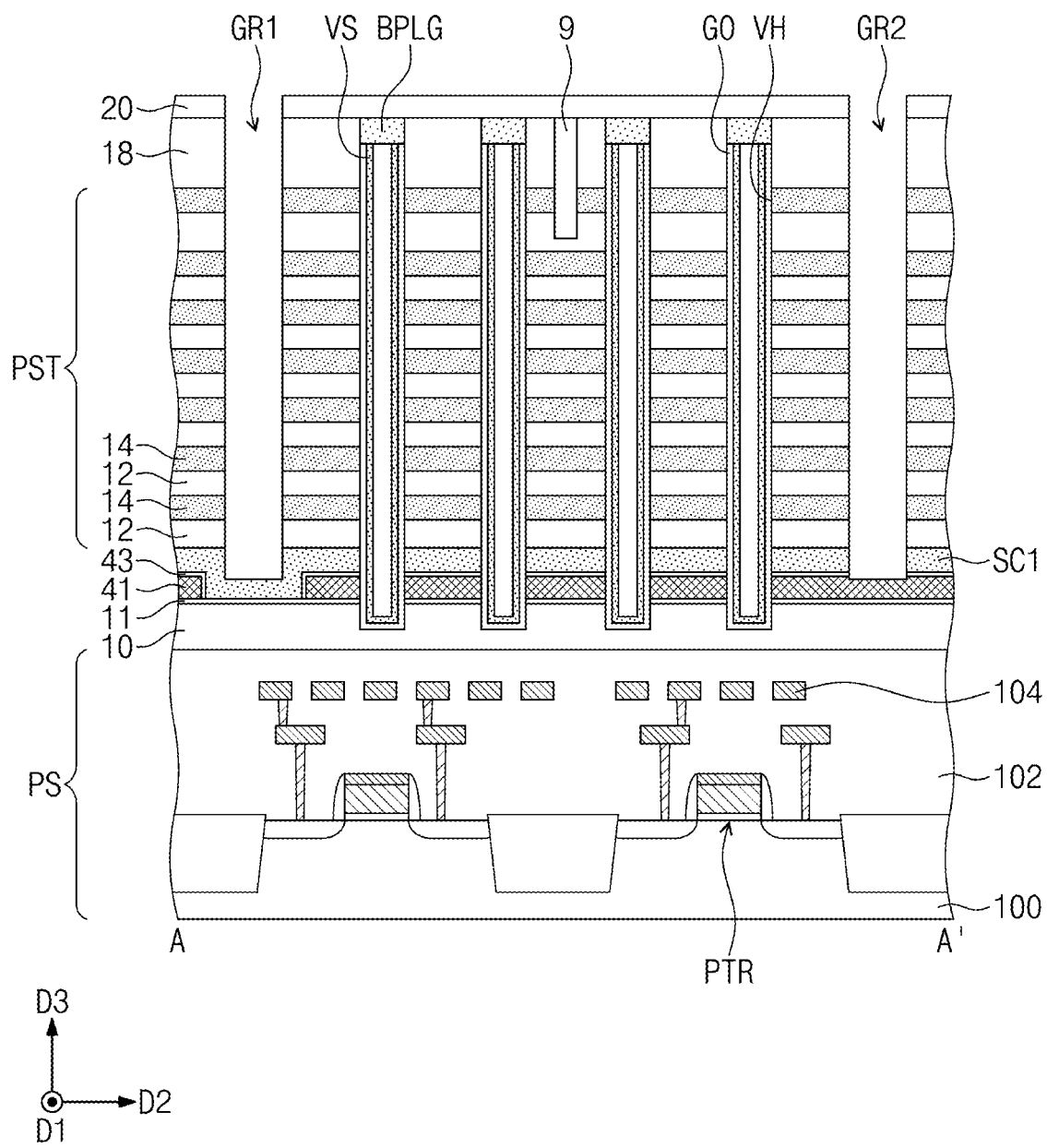
FIG. 5C illustrates a third cross-sectional view showing a part of the method of fabricating the three-dimensional semiconductor memory device having the cross-section of FIG. 3A according to some example embodiments of the present disclosure.

Referring to FIGS. 5C and 6I, a sacrificial layer may be formed on an entire surface of the first upper dielectric layer 20 to fill the cell contact holes CCH and the first inner holes CPH, and then a chemical mechanical polishing (CMP) process may be performed to expose a top surface of the first upper dielectric layer 20 and to form a sacrificial buried pattern 59 in the cell contact holes CCH. On the cell array region CAR, the first upper dielectric layer 20, the planarized dielectric layer 18, the first source pattern SC1, and the auxiliary buffer dielectric layer 43 may be partially removed to form a first groove GR1 and a second groove GR2. The first groove GR1 may be formed to be spaced apart from the lower sacrificial layer 41. The second groove GR2 may expose the lower sacrificial layer 41.

Figure 5D:
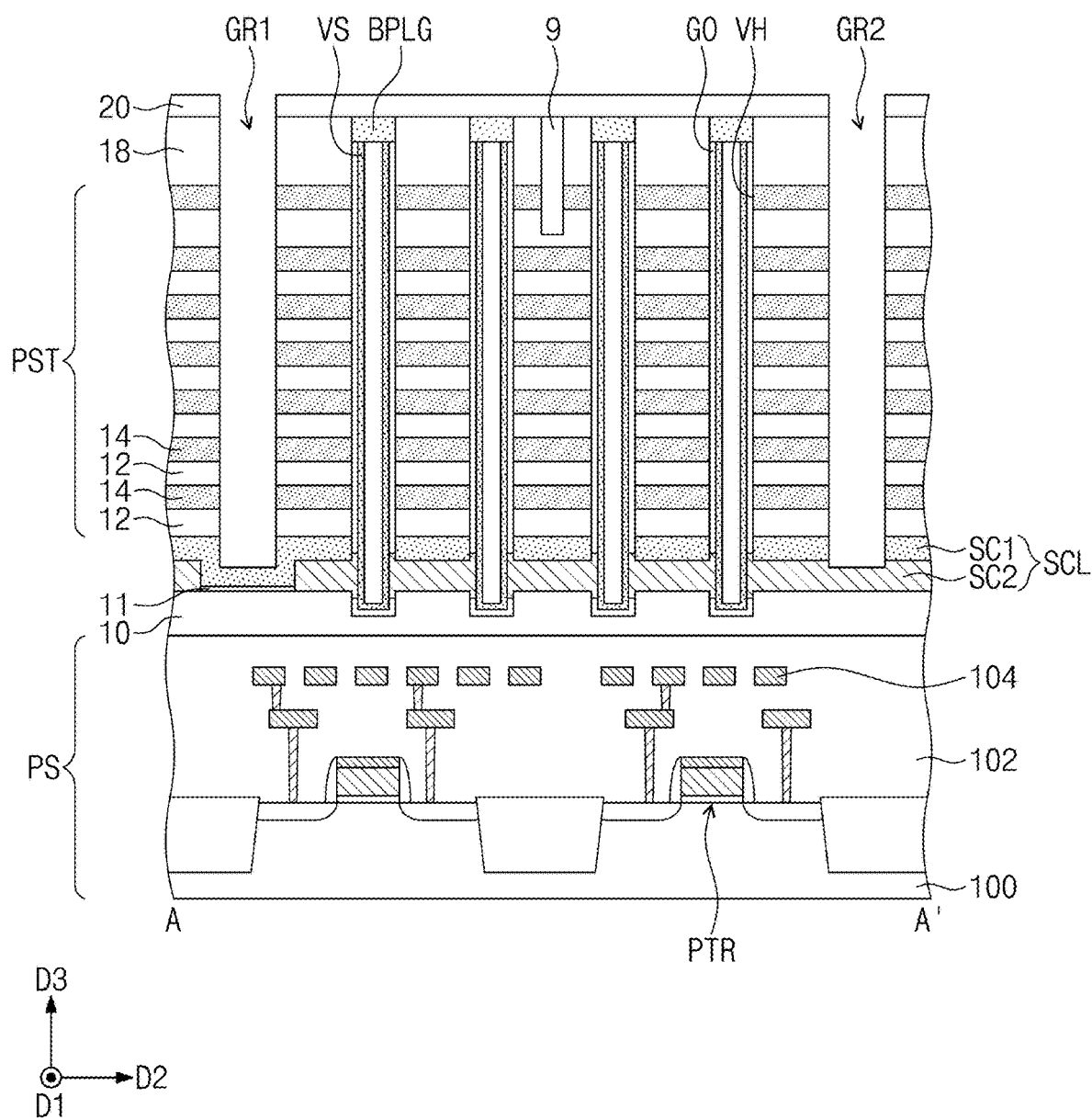
FIG. 5D illustrates a fourth cross-sectional view showing a part of the method of fabricating the three-dimensional semiconductor memory device having the cross-section of FIG. 3A according to some example embodiments of the present disclosure.
Figure 5E:
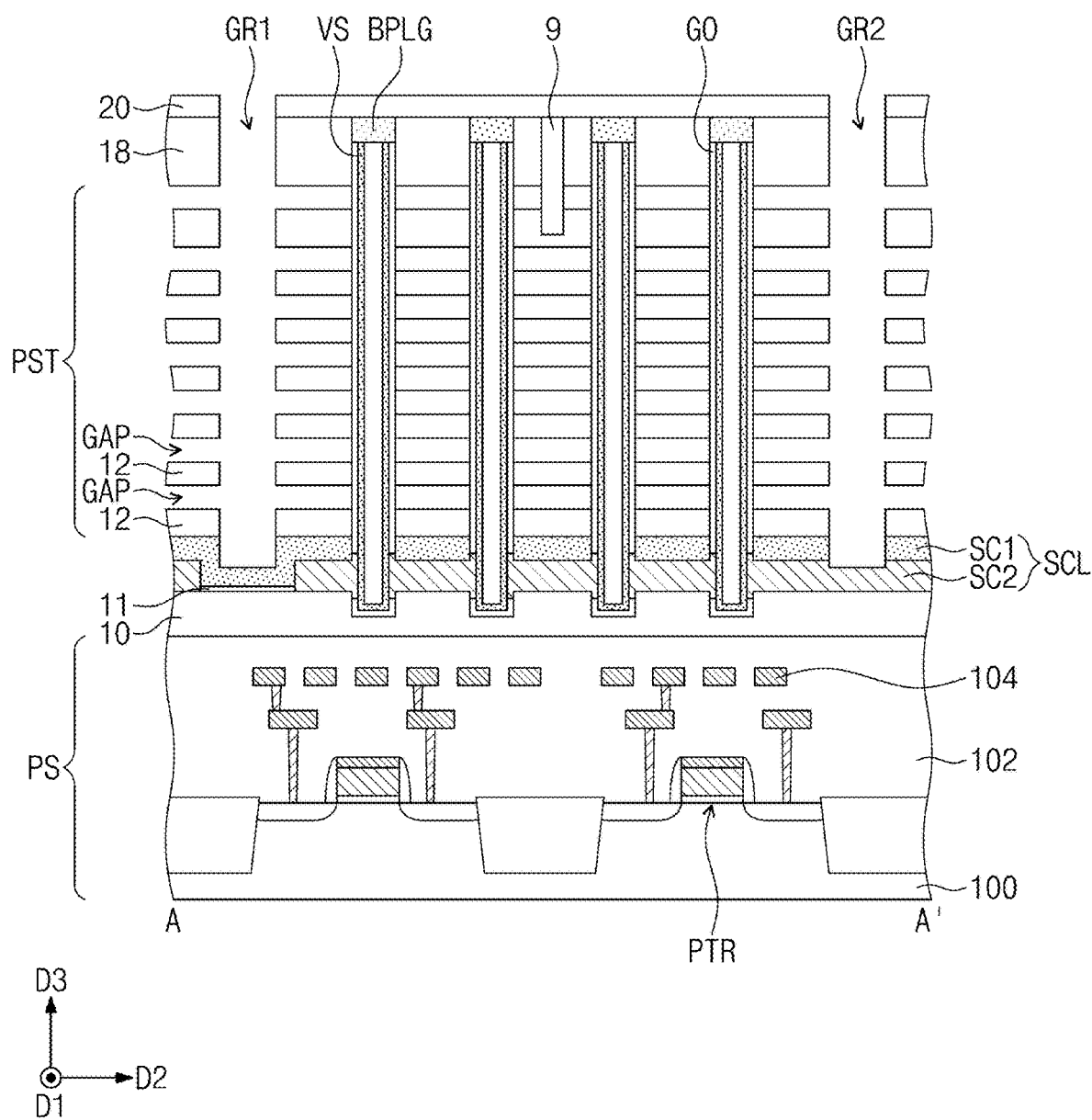
FIG. 5E illustrates a fifth cross-sectional view showing a part of the method of fabricating the three-dimensional semiconductor memory device having the cross-section of FIG. 3A according to some example embodiments of the present disclosure.

Referring to FIG. 5D, the second groove GR2 may be used remove the lower sacrificial layer 41, the auxiliary buffer dielectric layer 43, a portion of the buffer dielectric layer 11, and a portion of the gate dielectric layer GO may be removed to expose lower lateral surfaces of the cell vertical patterns VS, a top surface of the cell substrate 10, and a bottom surface of the first source pattern SC1. A conductive layer may be formed on the entire surface of the first upper dielectric layer 20 to fill the first groove GR1, the second groove GR2, and a space between the first source pattern SC1 and the cell substrate 10, and then the conductive layer in the first groove GR1 and the second groove GR2 may be removed to form a second source pattern SC2 in the space between the first source pattern SC1 and the cell substrate 10. Therefore, a source structure SCL may be formed which includes the first source pattern SC1 and the second source pattern SC2.

Referring to FIGS. 5D, 6I, 5E, and 6J, the mold sacrificial layers 14 and the unified preliminary pad patterns 51 may be removed through the first groove GR1 and the second groove GR2. Thus, empty spaces GAP may be formed to expose top and bottom surfaces of the inter-electrode dielectric layers 12, a lateral surface of the gate dielectric layer GO, a lateral surface of the contact dielectric pattern 16, and a lateral surface of the sacrificial buried pattern 59.

Referring to FIGS. 5E, 6J, 3A, 6K, and 6L, a high-k dielectric layer HL may be conformally formed on the entire surface of the first upper dielectric layer 20 to fill the first groove GR1, the second groove GR2, and inner surfaces of the empty spaces GAP, and then a conductive layer may be formed to fill the first groove GR1, the second groove GR2, and the empty spaces GAP. In addition, an etching action may be performed to remove the high-k dielectric layer HL and the conductive layer on the first upper dielectric layer 20. Moreover, the high-k dielectric layer HL and the conductive layer in the first groove GR1 and the second groove GR2 may be removed to form the high-k dielectric layer HL and electrode layers EL in the empty spaces GAP. Therefore, a stack structure ST may be formed which includes the inter-electrode dielectric layers 12 and the electrode layers EL that are alternately stacked. A dielectric spacer SS may be formed to cover inner surfaces of the first groove GR1 and the second groove GR2, and the first source contact plug CSPLG1 and the second source contact plug CSPLG2 may be formed to fill the first groove GR1 and the second groove GR2. The sacrificial buried pattern 59 may be removed to expose inner and bottom surfaces of the cell contact hole CCH and an inner surface of the first inner hole CPH. The first inner hole CPH may expose a lateral surface of the high-k dielectric layer HL.

Referring back to FIGS. 3B and 4B, the high-k dielectric layer HL exposed to the first inner hole CPH may be partially removed. A diffusion break layer BM may be conformally formed in the cell contact hole CCH and the first inner hole CPH, a conductive layer may be formed to fill the cell contact hole CCH and the first inner hole CPH, and then a chemical mechanical polishing (CMP) process may be performed to form cell contacts CC. A second upper dielectric layer 22 may be subsequently formed. The second upper dielectric layer 22 and the first upper dielectric layer 20 may be etched to form a contact hole that exposes the bit-line pad BPLG, and then the contact hole may be filled with a conductive layer to form a bit-line contact BLC. In addition, bit-lines BL may be formed on the second upper dielectric layer 22. As a result, it may be possible to fabricate a three-dimensional semiconductor memory device of FIGS. 2 to 4C.

Figure 6K:
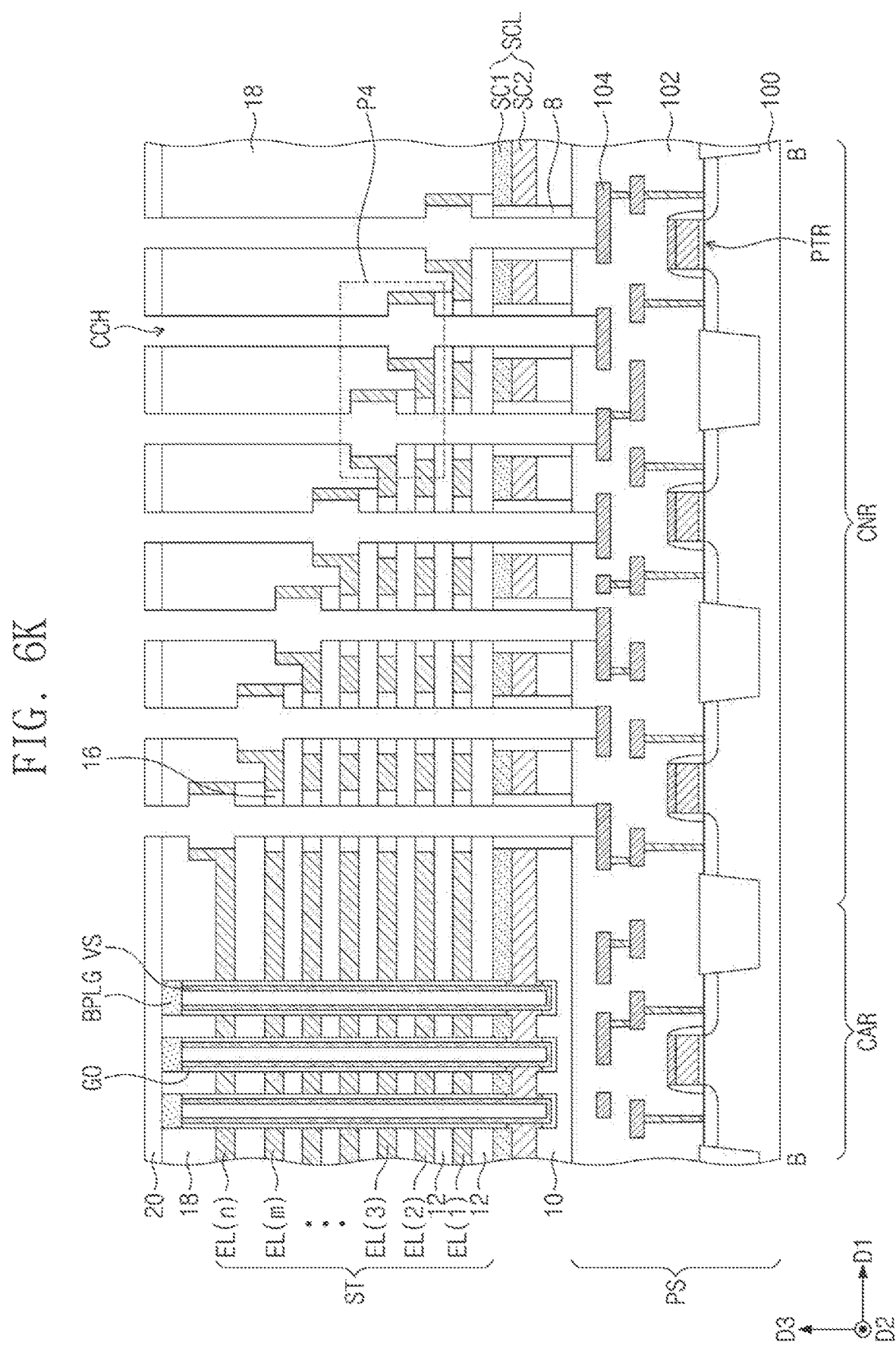
FIG. 6K illustrates a tenth cross-sectional view showing a part of the method of fabricating the three-dimensional semiconductor memory device having the cross-section of FIG. 3B according to some example embodiments of the present disclosure.
Figure 6L:
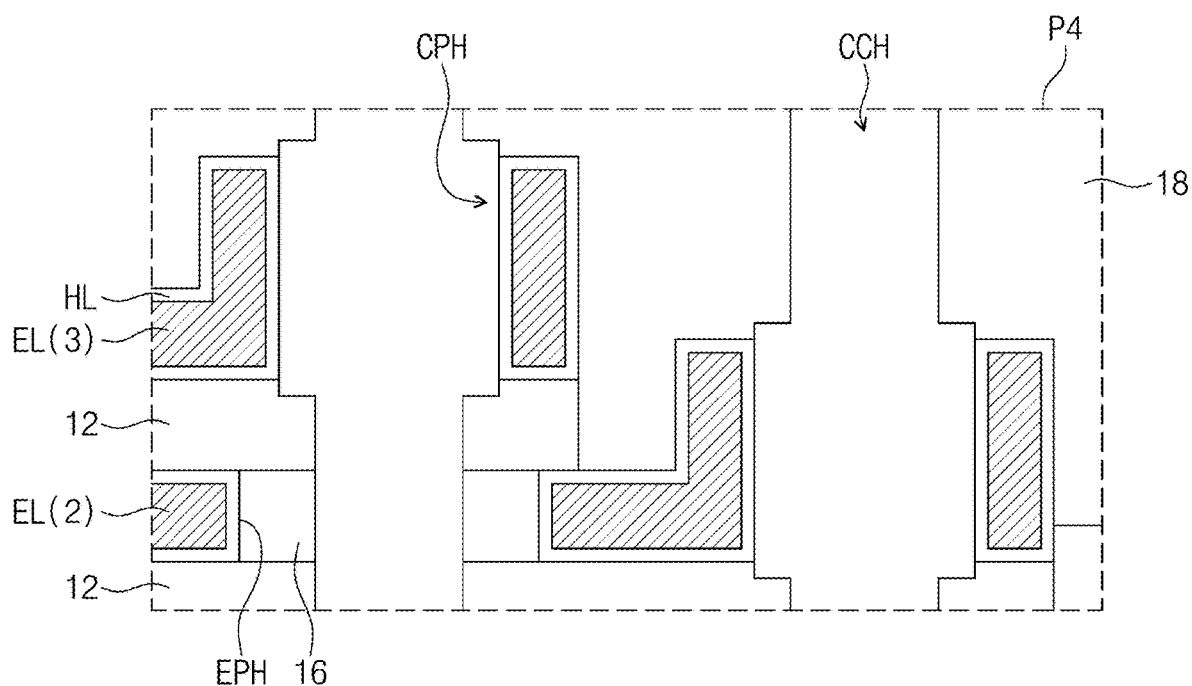
FIG. 6L illustrates an enlarged view showing section P4 of FIG. 6K.

In the present embodiment, the contact dielectric layer 160 may be formed as shown in FIG. 6F, an isotropic etching process may be performed to form the contact dielectric pattern 16 illustrated in FIG. 6G, and then the cell contact hole CCH may be filled with the sacrificial buried pattern 59 depicted in FIG. 6I. In another embodiment of the present disclosure, immediately after the contact dielectric layer 160 is formed as shown in FIG. 6F, the cell contact hole CCH may be filled with the sacrificial buried pattern 59. Afterwards, the sacrificial buried pattern 59 may be removed as shown in FIG. 6K, and then the contact dielectric layer 160 may undergo an isotropic etching process to form the contact dielectric pattern 16.

Figure 7A:
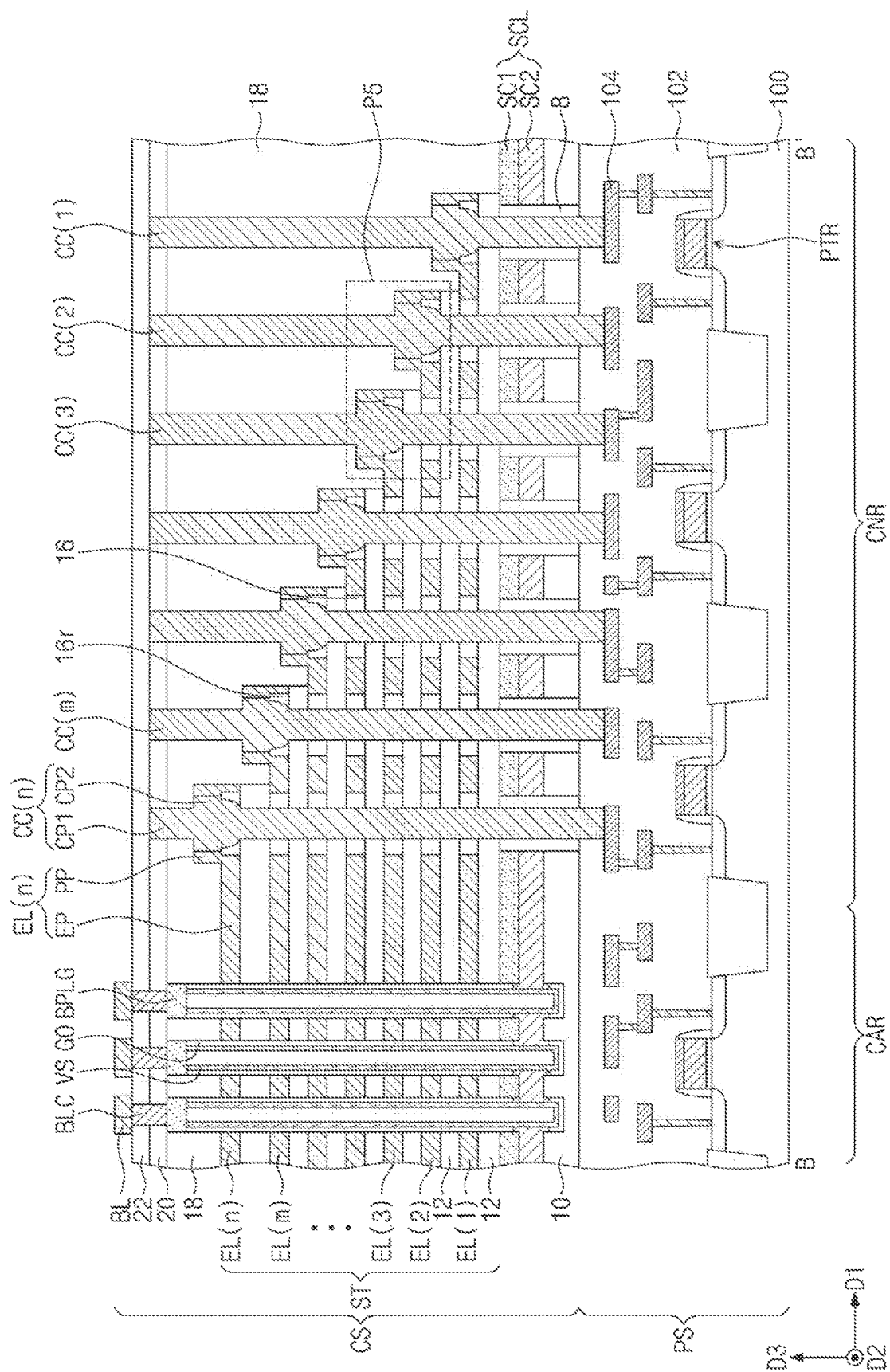
FIG. 7A illustrates a cross-sectional view taken along line B-B' of FIG. 2.
Figure 7B:
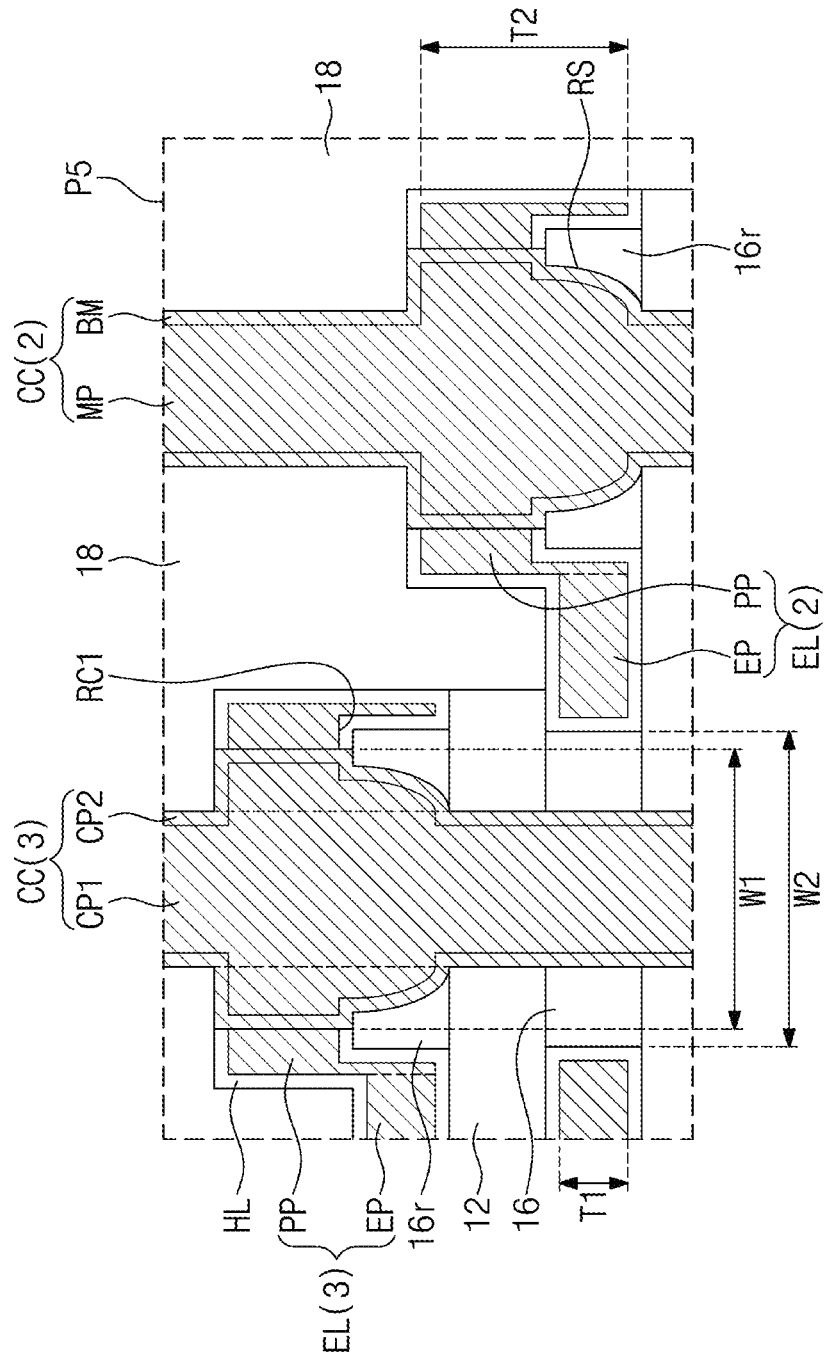
FIG. 7B illustrates an enlarged view showing section P5 of FIG. 7A.

FIG. 7A illustrates a cross-sectional view taken along line B-B' of FIG. 2. FIG. 7B illustrates an enlarged view showing section P5 of FIG. 7A.

Referring to FIGS. 7A and 7B, a three-dimensional semiconductor memory device may be configured such that each of the electrode layers EL includes an electrode part EP and a pad part PP. The electrode part EP may have a first thickness T1. The pad part PP may have a second thickness T2 greater than the first thickness T1. Each of the cell contacts CC may have a columnar part CP1 and a connection part CP2. The connection part CP2 may penetrate the pad part PP. A recession RC1 may be positioned below the pad part PP. An edge of the pad part PP may be spaced apart from the connection part CP2. A residual contact dielectric pattern 16r may be interposed between a lower portion of the connection part CP2 and the edge of the pad part PP. The residual contact dielectric pattern 16r may be positioned in the recession RC1. The residual contact dielectric pattern 16r may be in contact with the connection part CP2. Like the contact dielectric pattern 16 of FIG. 4C, the residual contact dielectric pattern 16r may have an annular shape when viewed in plan. The connection part CP2 may have a rounded lateral surface in contact with the residual contact dielectric pattern 16r. The pad part PP may cover top and lateral surfaces of the residual contact dielectric pattern 16r. The high-k dielectric layer HL may be interposed between the residual contact dielectric pattern 16r and the pad part PP. Other configurations may be identical or similar to those discussed with reference to FIGS. 2 to 4C.

Figure 8B:
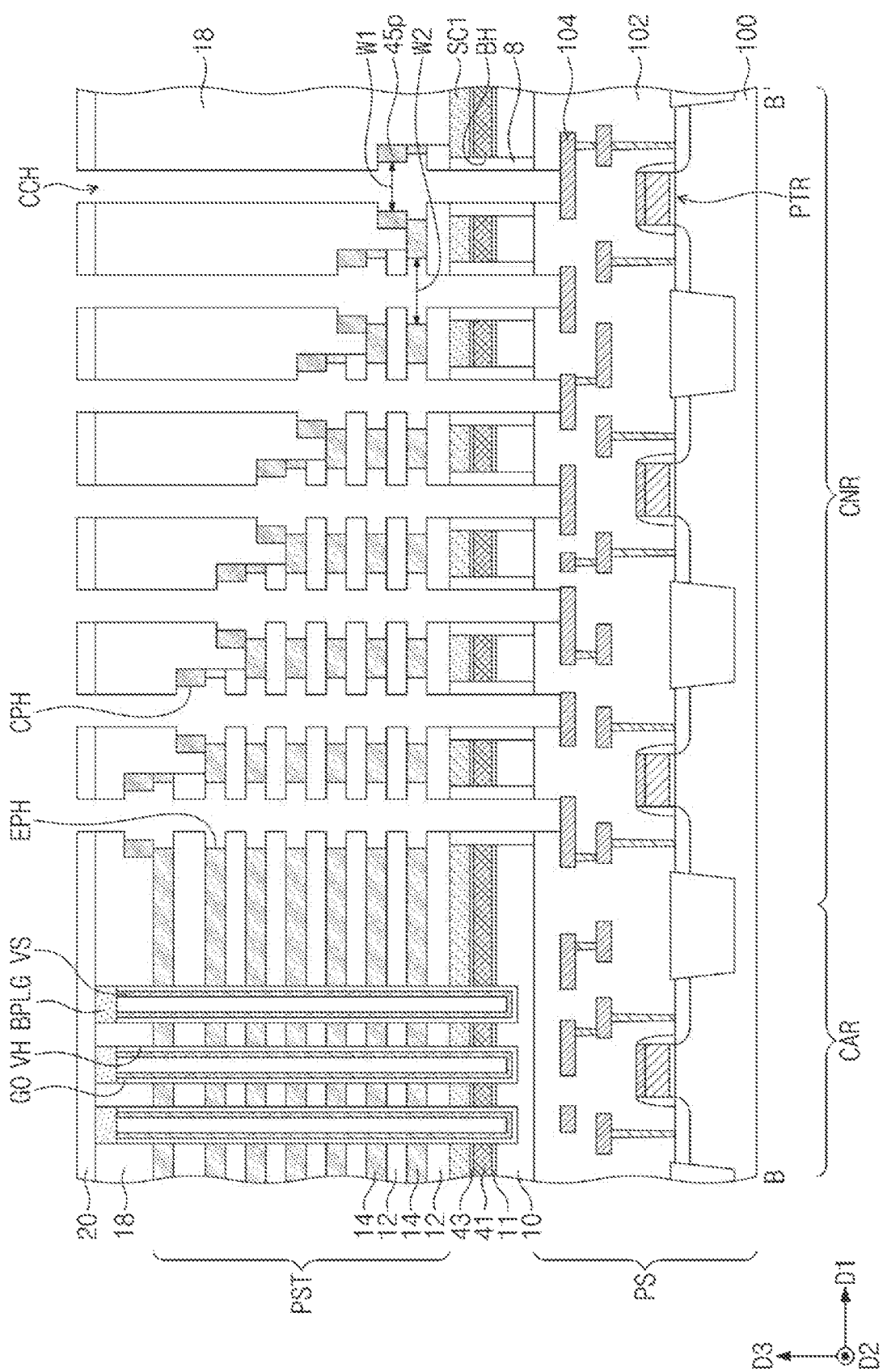
FIG. 8B illustrates a second cross-sectional view showing a part of the method of fabricating the three-dimensional semiconductor memory device having the cross-section of FIG. 7A.

FIGS. 8A and 8B illustrate cross-sectional views showing a method of fabricating a three-dimensional semiconductor memory device having the cross-section of FIG. 7A.

Referring to FIG. 8A, processes discussed with reference to FIGS. 6A and 6B may be performed to form a resultant structure depicted in FIG. 6C. The resultant structure of FIG. 6C may undergo a subsequent process without experiencing the second plasma treatment process. For example, on the resultant structure of FIG. 6C, a planarized dielectric layer 18 may be formed to cover the preliminary stack structure PST, and then the vertical patterns VS, the first dummy vertical patterns DVS1, the second dummy vertical patterns DVS2, a gate dielectric layer GO, and a bit-line pad BPLG may be formed. A first upper dielectric layer 20 may be formed on the planarized dielectric layer 18. The first upper dielectric layer 20, the planarized dielectric layer 18, the plurality of the preliminary pad pattern 45p, the preliminary stack structure PST, and the substrate dielectric pattern 8 may be successively etched to form cell contact holes CCH that expose the peripheral circuit lines 104. In the present embodiment, the preliminary pad pattern 45p may be formed of the same material as that of the mold sacrificial layers 14, and may have a density greater than that of the mold sacrificial layers 14.

Referring to FIG. 8B, an isotropic etching process may be performed to partially remove the preliminary pad pattern 45p and the mold sacrificial layers 14 to form a first inner hole CPH and a second inner hole EPH. In this case, a difference in density may cause the preliminary pad pattern 45p to be etched slower than the mold sacrificial layers 14, and thus the first inner hole CPH may be formed to have a width W1 less than a width W2 of the second inner hole EPH. As the preliminary pad pattern 45p is in contact with one of the mold sacrificial layers 14, the first inner hole CPH may be directly connected to its underlying one of the second inner hole EPH.

Subsequently, as discussed with reference to FIGS. 6F and 6G, a contact dielectric layer 160 may be conformally formed on a resultant structure of FIG. 8B, and then an isotropic etching process may be performed to remove the contact dielectric layer 160 from the first inner hole CPH and to leave the contact dielectric layer 160 in the second inner holes EPH, with the result that a plurality of a contact dielectric pattern 16 may be formed in the second inner holes EPH. A residual contact dielectric pattern 16r may be defined to refer to a portion of the contact dielectric layer 160 that remains in the second inner hole EPH in contact with the first inner hole CPH. In the etching process, the first inner hole CPH may affect the residual contact dielectric pattern 16r to have a shape (a cross-section) different from those of other ones of the plurality of the contact dielectric pattern 16. Subsequently, processes discussed with reference to FIGS. 6I to 6L may be performed.

Figure 9A:
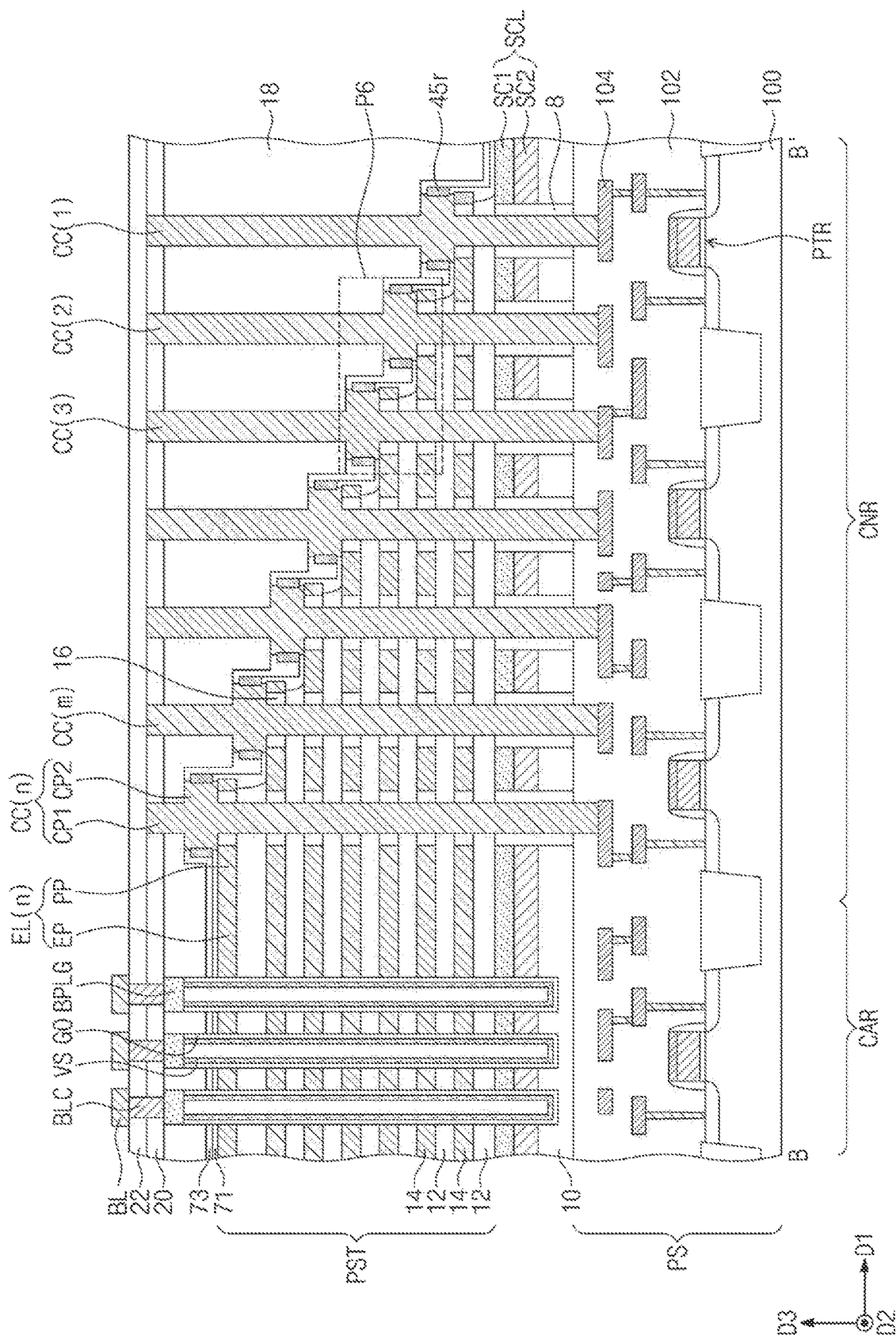
FIG. 9A illustrates a cross-sectional view taken along line B-B' of FIG. 2.
Figure 9B:
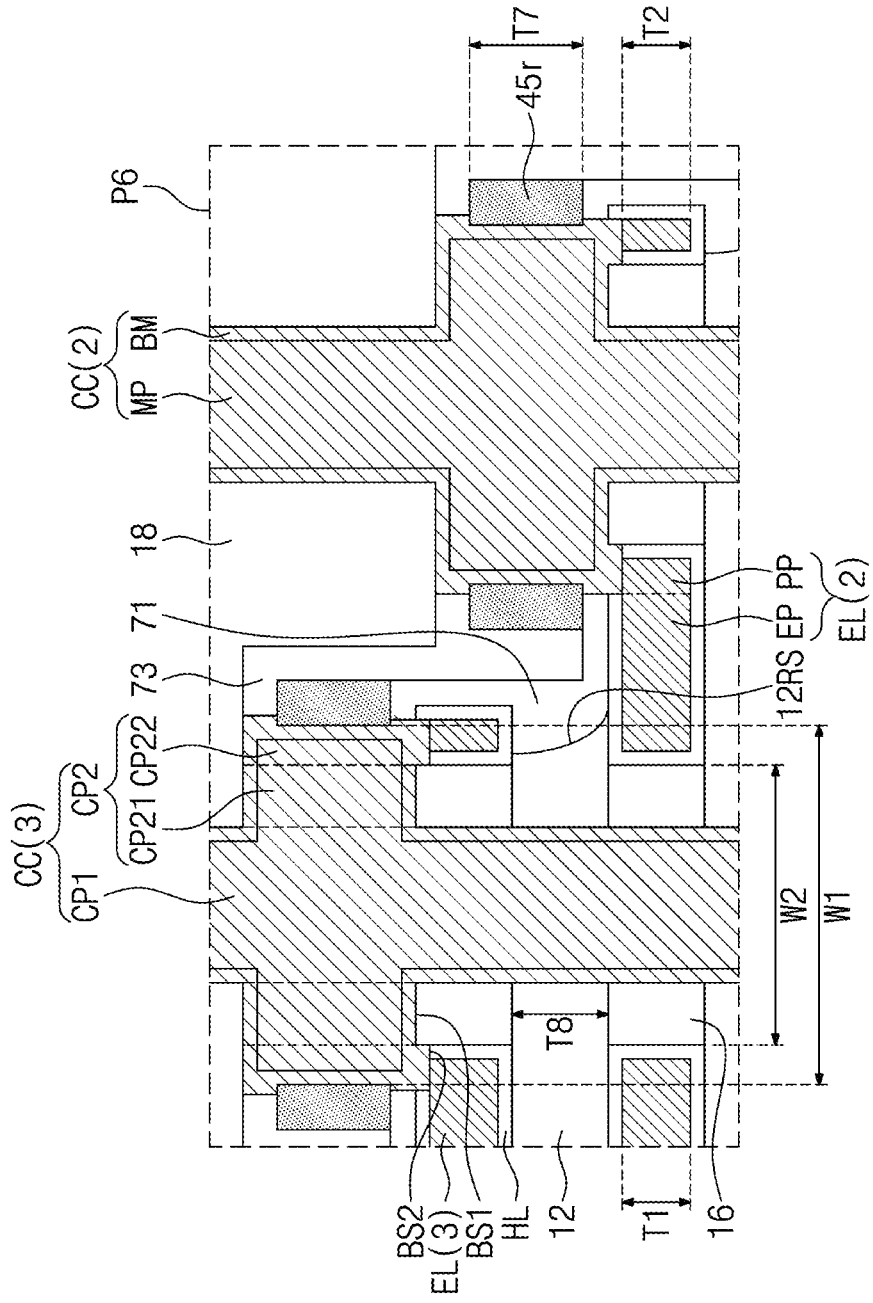
FIG. 9B illustrates an enlarged view showing section P6 of FIG. 9A.

FIG. 9A illustrates a cross-sectional view taken along line B-B' of FIG. 2. FIG. 9B illustrates an enlarged view showing section P6 of FIG. 9A.

Referring to FIGS. 9A and 9B, in the present embodiment, each of the electrode layers EL may include an electrode part EP and a pad part PP. The electrode part EP may have a thickness T1 that is the same as a thickness T2 of the pad part PP. Each of the cell contacts CC may have a columnar part CP1 and a connection part CP2. The connection part CP2 may include a connection center part CP21 in contact with the columnar part CP1 and a connection edge part CP22 spaced apart from the columnar part CP1. The connection center part CP21 may have a bottom surface BS1 in contact with the contact dielectric pattern 16. The connection edge part CP22 may have a bottom surface BS2 lower than the bottom surface BS1 of the connection center part CP21. The connection edge part CP22 may have a portion that protrudes toward the electrode layer EL thereunder. The connection edge part CP22 may penetrate the high-k dielectric layer HL to come into contact with a top electrode of a corresponding one of the electrode layer EL. The connection part CP2 may have a first width W1. The contact dielectric pattern 16 may have a second width W2 less than the first width W1.

The inter-electrode dielectric layers 12 may have a rounded lateral surface 12RS. The rounded lateral surface 12RS of the inter-electrode dielectric layers 12 may not be aligned with an outermost lateral surface of the pad part PP of the electrode layer EL. The pad part PP of the electrode layer EL may have a bottom surface that is not covered with but exposed by one of the inter-electrode dielectric layers 12. The connection part CP2 may have a lateral surface in contact with a residual preliminary pad pattern 45r. The residual preliminary pad pattern 45r may include a dielectric material different from that of the high-k dielectric layer HL and that of the inter-electrode dielectric layers 12. For example, the residual preliminary pad pattern 45r may include a silicon nitride layer. The residual preliminary pad pattern 45r may have a thickness T7 greater than a thickness T8 of the contact dielectric pattern 16. A three-dimensional semiconductor memory device according to the present embodiment may be configured such that the inter-electrode dielectric layers 12 maintain their eighth thickness T8 between the electrode layers EL.

A first auxiliary dielectric layer 71 may cover the rounded lateral surface 12RS of the inter-electrode dielectric layers 12, the outermost lateral surface of the pad part PP of the electrode layer EL, and a portion of the top surface of the electrode part EP of the electrode layer EL. The high-k dielectric layer HL may be interposed between the first auxiliary dielectric layer 71 and the outermost lateral surface of the pad part PP of the electrode layer EL.

The first auxiliary dielectric layer 71 may be in contact with a bottom surface of the residual preliminary pad pattern 45r. The first auxiliary dielectric layer 71 may have a lateral surface aligned with that of the residual preliminary pad pattern 45r. A second auxiliary dielectric layer 73 may cover the lateral surface of the residual preliminary pad pattern 45r and the lateral surface of the first auxiliary dielectric layer 71. Each of the first auxiliary dielectric layer 71 and the second auxiliary dielectric layer 74 may include a single or multiple layer including at least one of a silicon oxide layer, a silicon nitride layer, and a silicon oxynitride layer. Other configurations may be identical or similar to those discussed with reference to FIGS. 2 to 4C.

FIGS. 10A to 10F illustrate cross-sectional views showing a method of fabricating a three-dimensional semiconductor memory device having the cross-section of FIG. 9A. FIG. 10G illustrates an enlarged view showing section P7 of FIG. 10F.

Figure 10A:
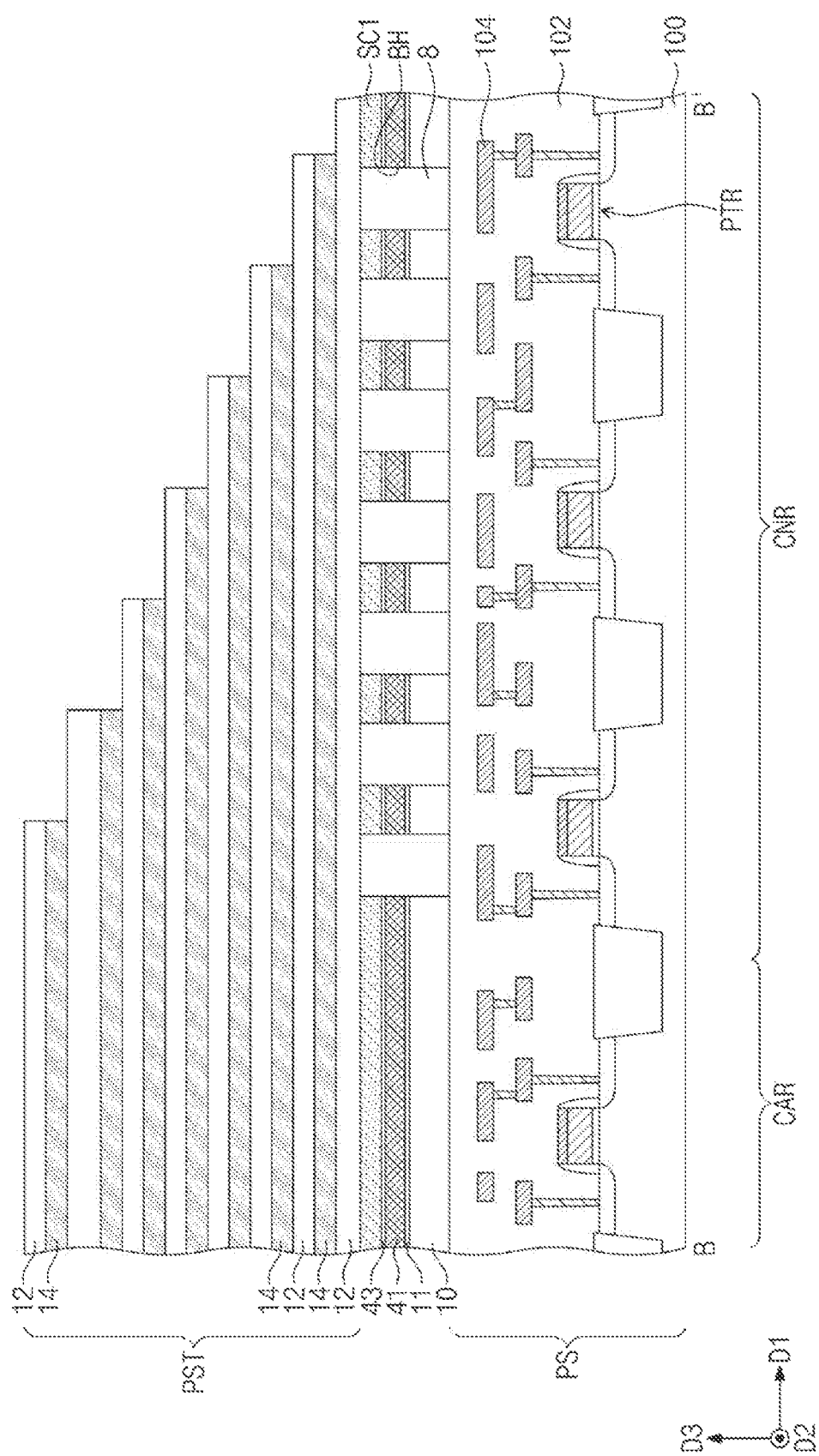
FIG. 10A illustrates a first cross-sectional view showing a part of a method of fabricating a three-dimensional semiconductor memory device having the cross-section of FIG. 9A.

Referring to FIG. 10A, a peripheral circuit structure PS may be manufactured. A cell substrate 10 may be formed on the peripheral circuit structure PS. The cell substrate 10 may include a cell array region CAR and a connection region CNR. A buffer dielectric layer 11, a lower sacrificial layer 41, and an auxiliary buffer dielectric layer 43 may be sequentially formed on the cell substrate 10. A first source pattern SC1 may be formed on the auxiliary buffer dielectric layer 43. On the connection region CNR, the plurality of the substrate dielectric pattern 8 may be formed to penetrate the first source pattern SC1, the auxiliary buffer dielectric layer 43, the lower sacrificial layer 41, the buffer dielectric layer 11, and the cell substrate 10. A preliminary stack structure PST may be formed by alternately stacking inter-electrode dielectric layers 12 and mold sacrificial layers 14 on the first source pattern SC1. At this stage, one of the inter-electrode dielectric layers 12 may be positioned at an uppermost location of the preliminary stack structure PST. A trimming process and an etching process may be repeatedly performed to cause the inter-electrode dielectric layers 12 and the mold sacrificial layers 14 to have their stepwise end portions.

Figure 10B:
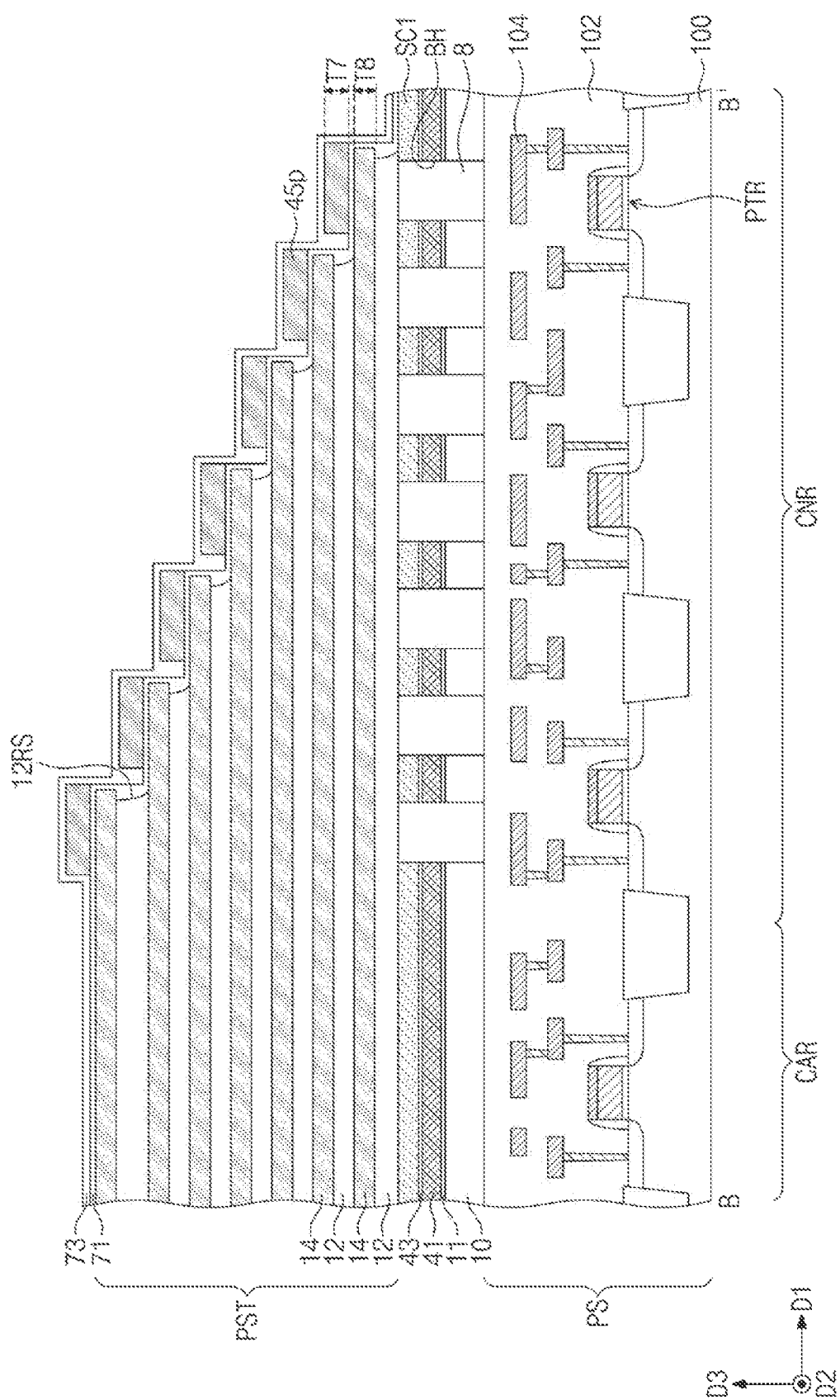
FIG. 10B illustrates a second cross-sectional view showing a part of the method of fabricating the three-dimensional semiconductor memory device having the cross-section of FIG. 9A.

Referring to FIG. 10B, an isotropic etching process may be performed on the inter-electrode dielectric layers 12. Thus, the uppermost one of the inter-electrode dielectric layers 12 may be removed to expose a top surface of an uppermost one of the mold sacrificial layers 14. In addition, the stepwise end portions of the inter-electrode dielectric layers 12 may be removed to expose the end portions of the mold sacrificial layers 14. At this stage, the isotropic etching process may recess portions of the inter-electrode dielectric layers 12 interposed between the mold sacrificial layers 14, and thus the inter-electrode dielectric layers 12 may be formed to have their rounded lateral surface 12RS. Therefore, bottom surfaces of the mold sacrificial layers 14 may be partially exposed. A first auxiliary dielectric layer 71 may be conformally formed on an entire surface of the preliminary stack structure PST. The first auxiliary dielectric layer 71 may be formed by performing an atomic layer deposition (ALD) process to deposit a silicon oxide layer. Processes discussed with reference to FIGS. 6B and 6C may be used to form plurality of the preliminary pad pattern 45p in a state where the first auxiliary dielectric layer 71 is conformally formed. A second auxiliary dielectric layer 73 may be conformally formed on the preliminary stack structure PST to fill a space between the first auxiliary dielectric layer 71 and the plurality of the preliminary pad pattern 45p. The plurality of the preliminary pad pattern 45p may be formed to each have a seventh thickness T7. The mold sacrificial layers 14 may be formed to each have an eighth thickness T8.

Figure 10C:
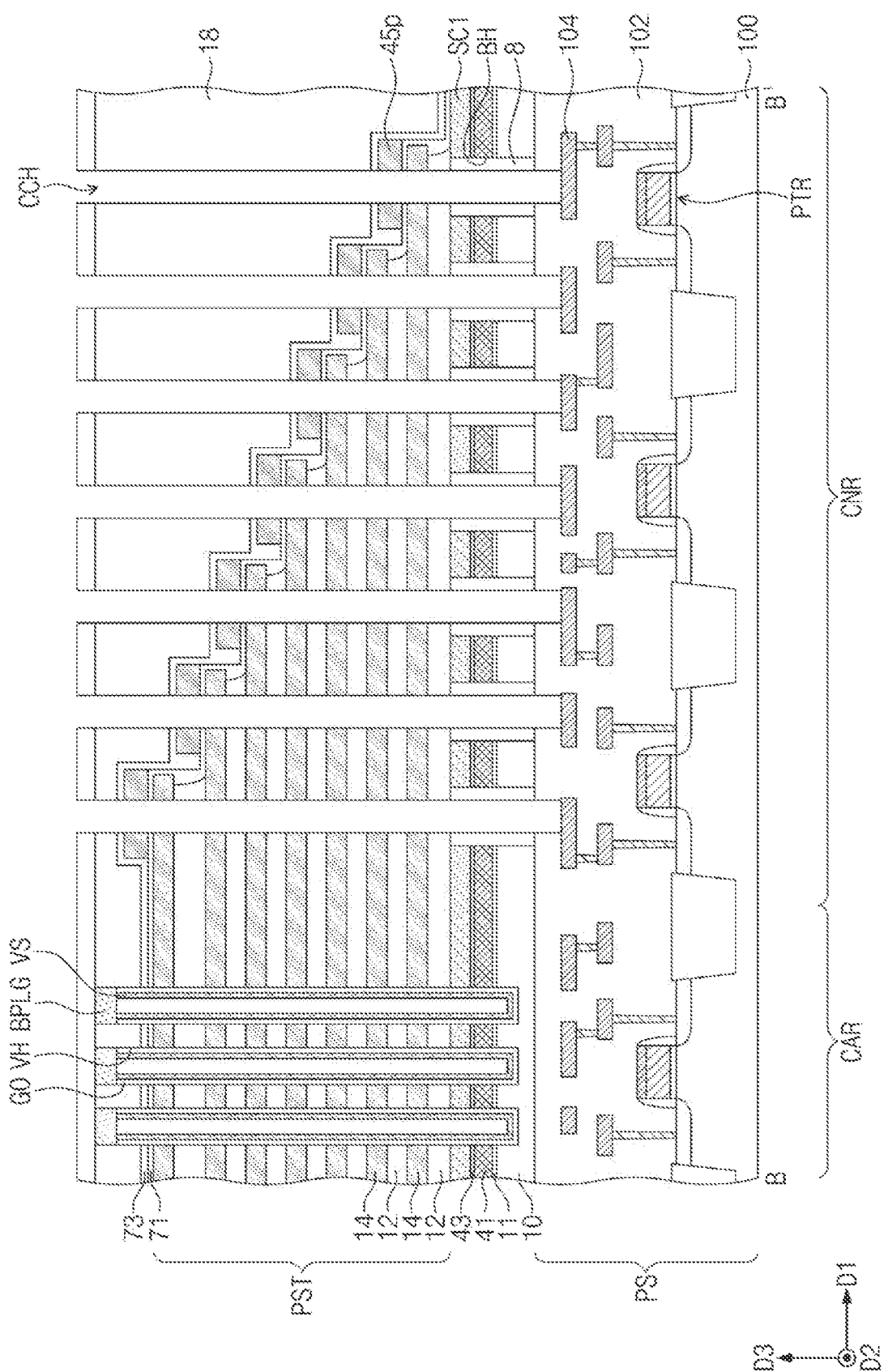
FIG. 10C illustrates a third cross-sectional view showing a part of the method of fabricating the three-dimensional semiconductor memory device having the cross-section of FIG. 9A.

Referring to FIG. 10C, a planarized dielectric layer 18 may be formed to cover the preliminary stack structure PST, and then the vertical patterns VS, the first dummy vertical patterns DVS1, the second dummy vertical patterns DVS2, a gate dielectric layer GO, and a bit-line pad BPLG may be formed. A first upper dielectric layer 20 may be formed on the planarized dielectric layer 18. The first upper dielectric layer 20, the planarized dielectric layer 18, the first auxiliary dielectric layer 71, the second auxiliary dielectric layer 73, the plurality of the preliminary pad pattern 45p, the preliminary stack structure PST, and the substrate dielectric pattern 8 may be successively etched to form cell contact holes CCH that expose the peripheral circuit lines 104.

Figure 10D:
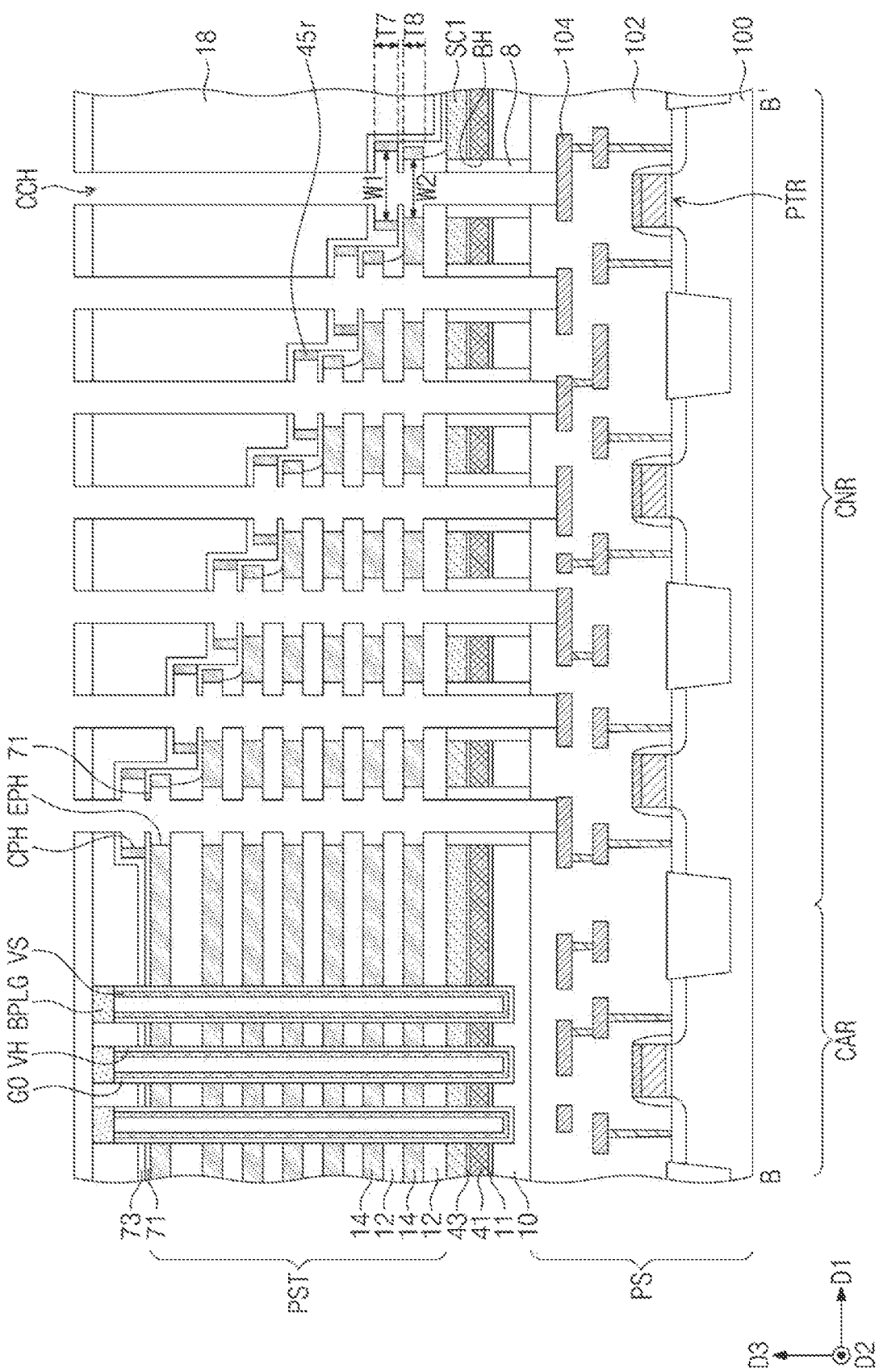
FIG. 10D illustrates a fourth cross-sectional view showing a part of the method of fabricating the three-dimensional semiconductor memory device having the cross-section of FIG. 9A.

Referring to FIG. 10D, an isotropic etching process may be performed to partially remove the plurality of the preliminary pad pattern 45p and the mold sacrificial layers 14 through the cell contact holes CCH. When the plurality of the preliminary pad pattern 45p have the same density as that of the mold sacrificial layers 14, an etchant may easily reach the plurality of the preliminary pad pattern 45p because the seventh thickness T7 of the plurality of the preliminary pad pattern 45p is greater than the eighth thickness T8 of the mold sacrificial layers 14, and an etch rate of the preliminary pad pattern 45p may thus be greater than an etch rate of the mold sacrificial layers 14. Therefore, a width W1 of a first inner hole CPH formed by the partial removal of the preliminary pad pattern 45p may be greater than a width W2 of a second inner hole EPH formed by the partial removal of one of the mold sacrificial layers 14. At this stage, a portion of the preliminary pad pattern 45p may be left to form a residual preliminary pad pattern 45r. A first auxiliary dielectric layer 71 may protrude between the first inner hole CPH and its underlying second inner hole EPH.

Figure 10E:
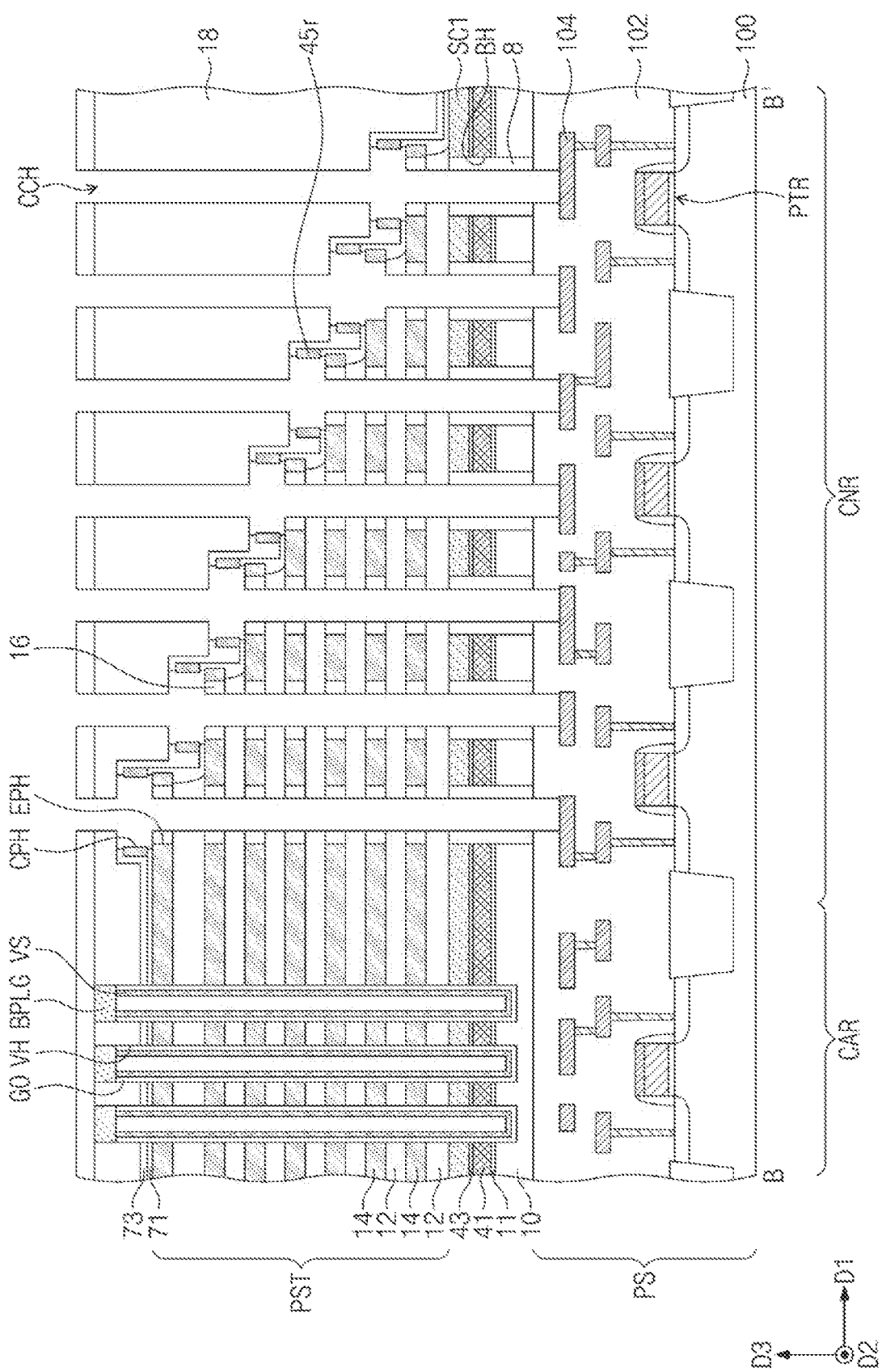
FIG. 10E illustrates a fifth cross-sectional view showing a part of the method of fabricating the three-dimensional semiconductor memory device having the cross-section of FIG. 9A.

Referring to FIG. 10E, as discussed with reference to FIGS. 6F to 6H, a contact dielectric layer 160 may be conformally formed and then an isotropic etching process may be performed to form a contact dielectric pattern 16 in the second inner hole EPH. In this case, an over-etching may be performed as that shown in FIG. 6H, and thus the first auxiliary dielectric layer 71 may be removed from an area between the first inner hole CPH and its underlying one of the second inner hole EPH.

Figure 10F:
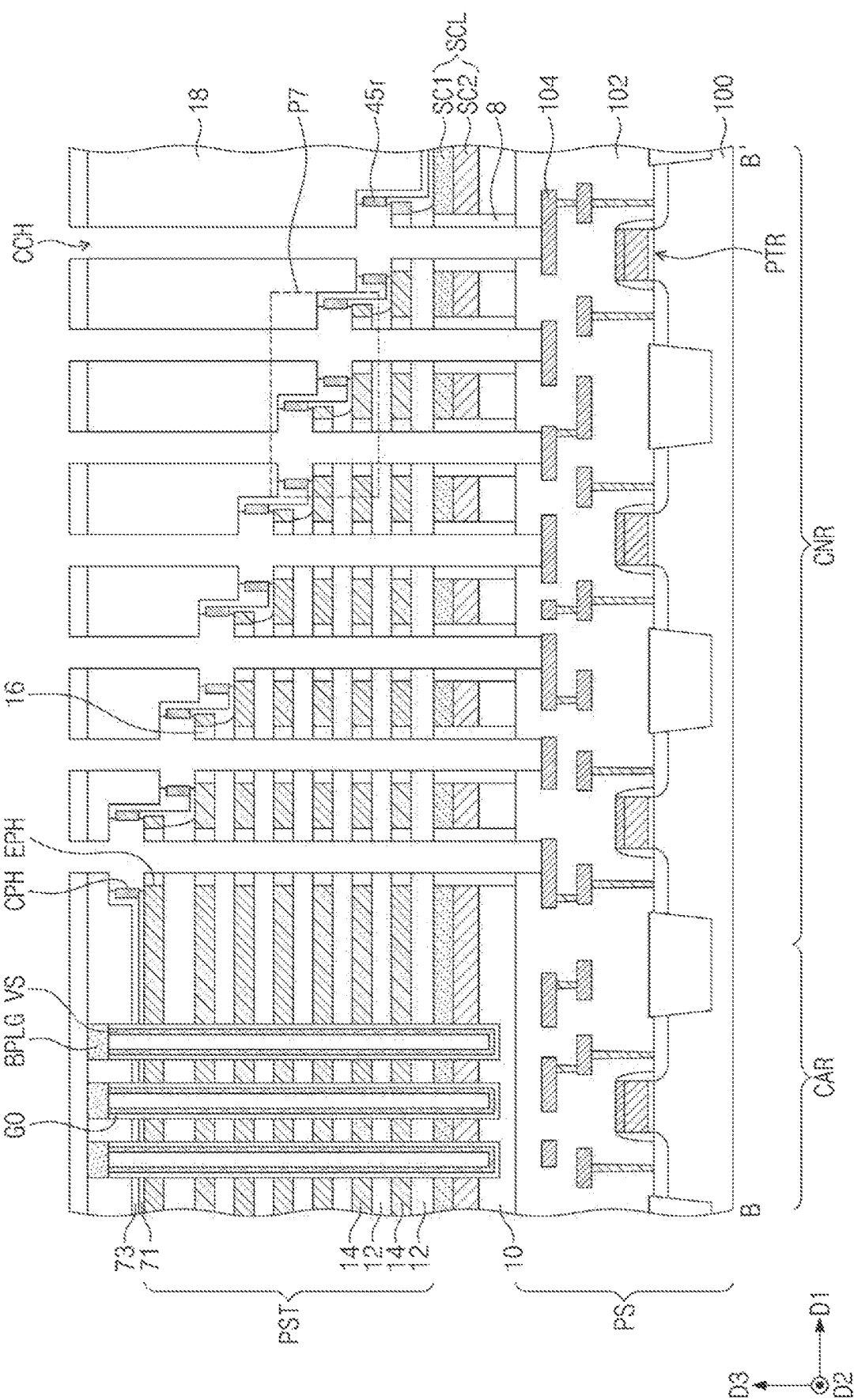
FIG. 10F illustrates a sixth cross-sectional view showing a part of the method of fabricating the three-dimensional semiconductor memory device having the cross-section of FIG. 9A.
Figure 10G:
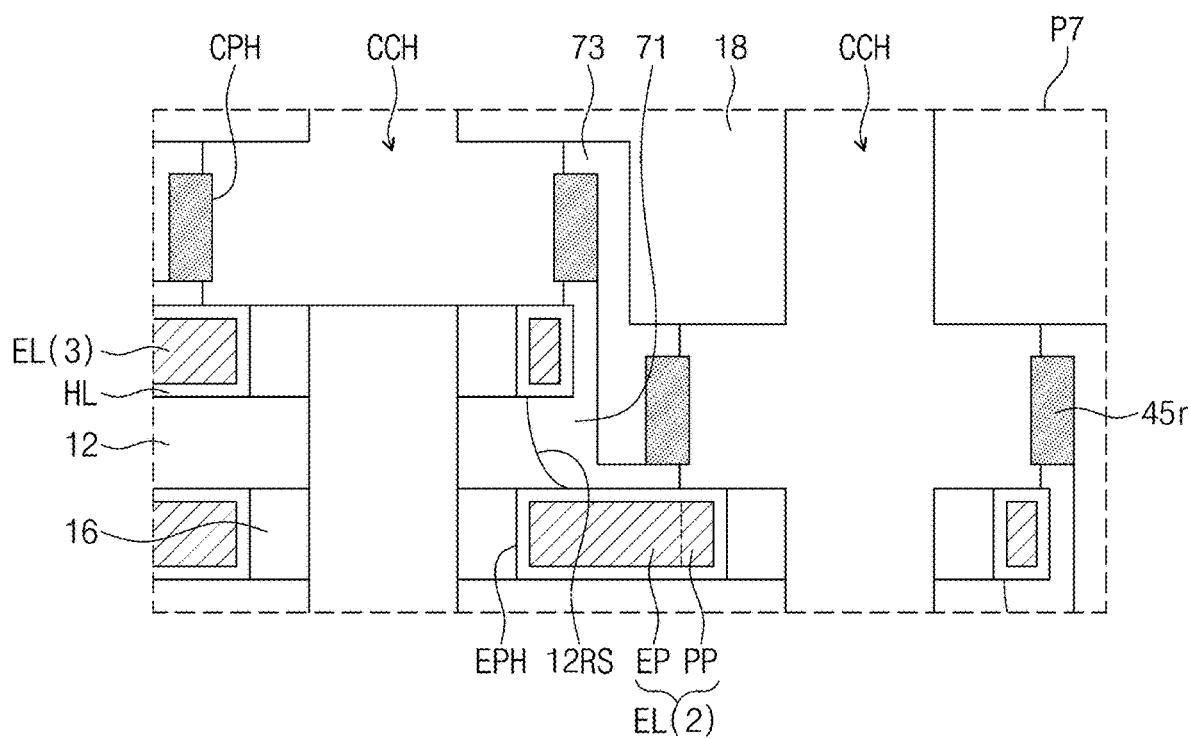
FIG. 10G illustrates an enlarged view showing section P7 of FIG. 10F.

Referring to FIGS. 10F and 10G, a sacrificial buried pattern 59, a source structure SCL, and a stack structure ST may be formed as discussed with reference to FIGS. 6I and 6K. The sacrificial buried pattern 59 may be removed from the cell contact hole CCH. Therefore, the first inner hole CPH may expose, on its bottom surface, the high-k dielectric layer HL that surrounds the electrode layers EL. As shown in FIG. 9B, the high-k dielectric layer HL may be removed from the bottom surface of the first inner hole CPH, thereby exposing the electrode layers EL. Subsequently, cell contacts CC may be formed to fill the cell contact holes CCH and the first inner hole CPH.

In the present embodiment, when an over-etching is performed (on a silicon oxide layer), the first auxiliary dielectric layer 71 may be etched instead of the inter-electrode dielectric layers 12. Therefore, an interval between the connection part CP2 of the cell contact CC and its immediately underlying one of the electrode layers EL may be maintained equal to or greater than a specific distance. As a result, it may be possible to prevent an abnormal reduction in interval between the cell contacts CC and their adjacent electrode layers EL.

Figure 11A:
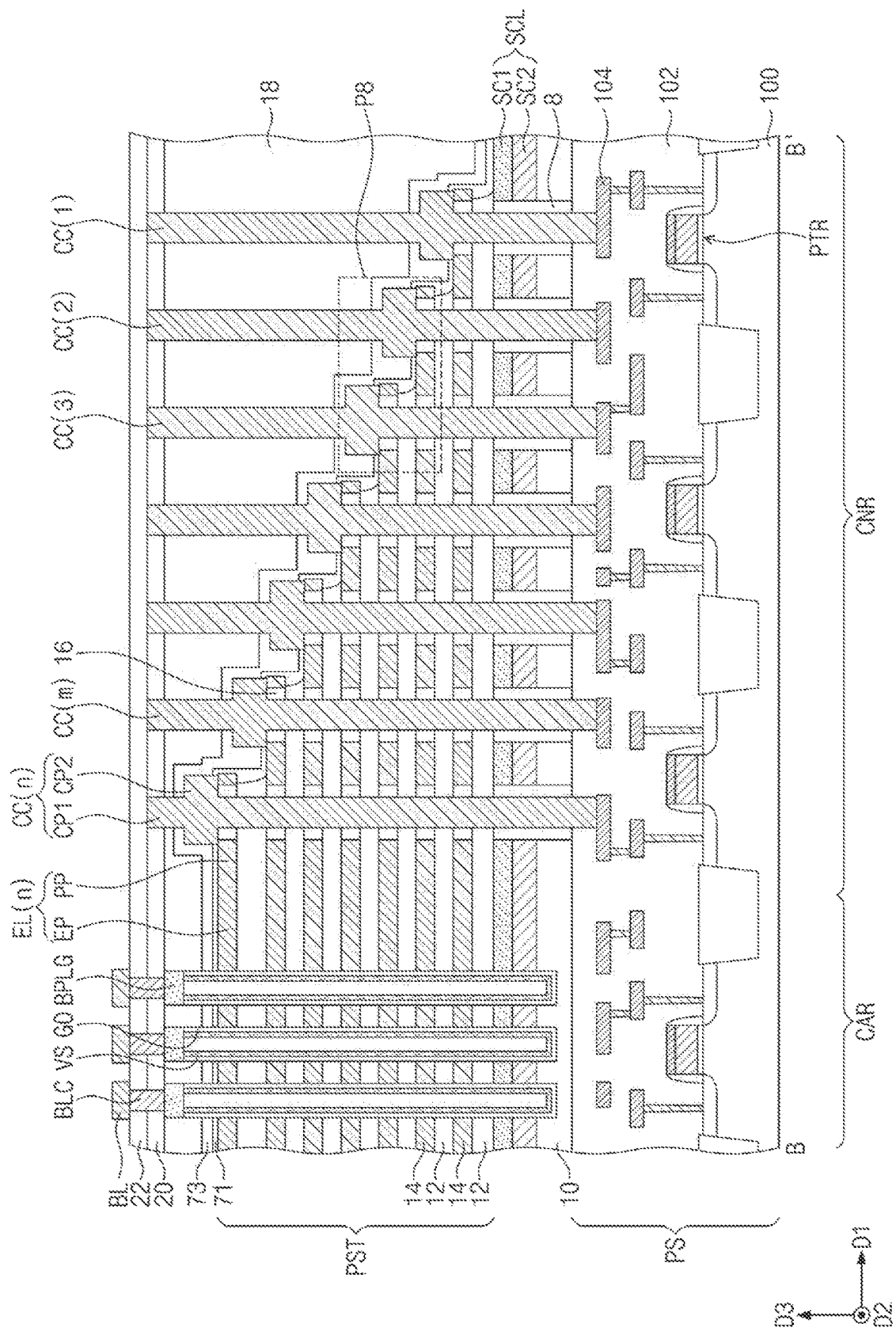
FIG. 11A illustrates a cross-sectional view taken along line B-B' of FIG. 2.
Figure 11B:
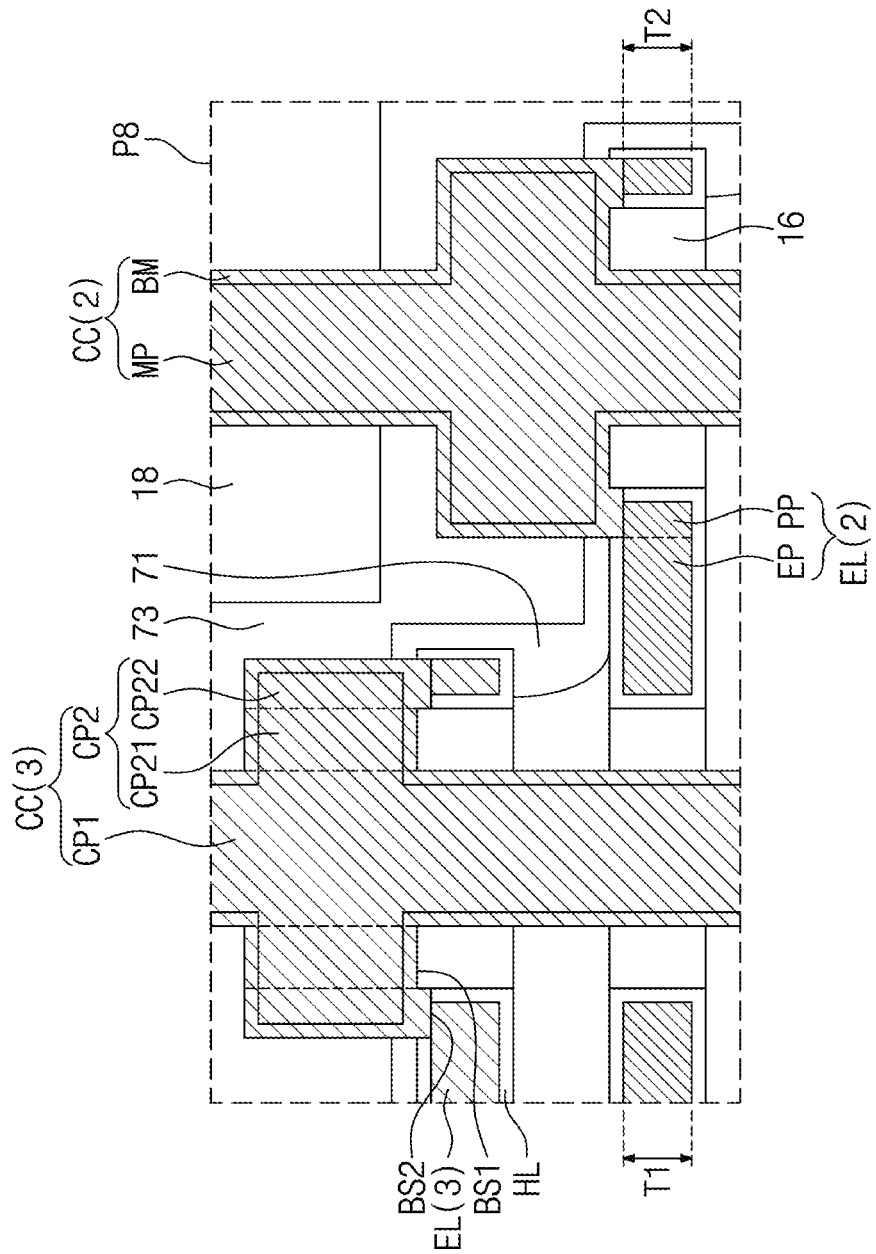
FIG. 11B illustrates an enlarged view showing section P8 of FIG. 11A.

FIG. 11A illustrates a cross-sectional view taken along line B-B' of FIG. 2. FIG. 11B illustrates an enlarged view showing section P8 of FIG. 11A.

Referring to FIGS. 11A and 11B, a three-dimensional semiconductor memory device according to the present embodiment may not include the residual preliminary pad pattern 45r of FIGS. 10A and 10B. The connection part CP2 of the cell contact CC may have a lateral surface in direct contact with the second auxiliary dielectric layer 73. Other configurations may be identical or similar to those discussed with reference to FIGS. 10A and 10B. The three-dimensional semiconductor memory device of FIGS. 11A and 11B may be fabricated by controlling a size of the residual preliminary pad pattern 45r and thicknesses of the first auxiliary dielectric layer 71 and the second auxiliary dielectric layer 73 to adjust a removal amount of the residual preliminary pad pattern 45r in the step of FIG. 10D.

Figure 12A:
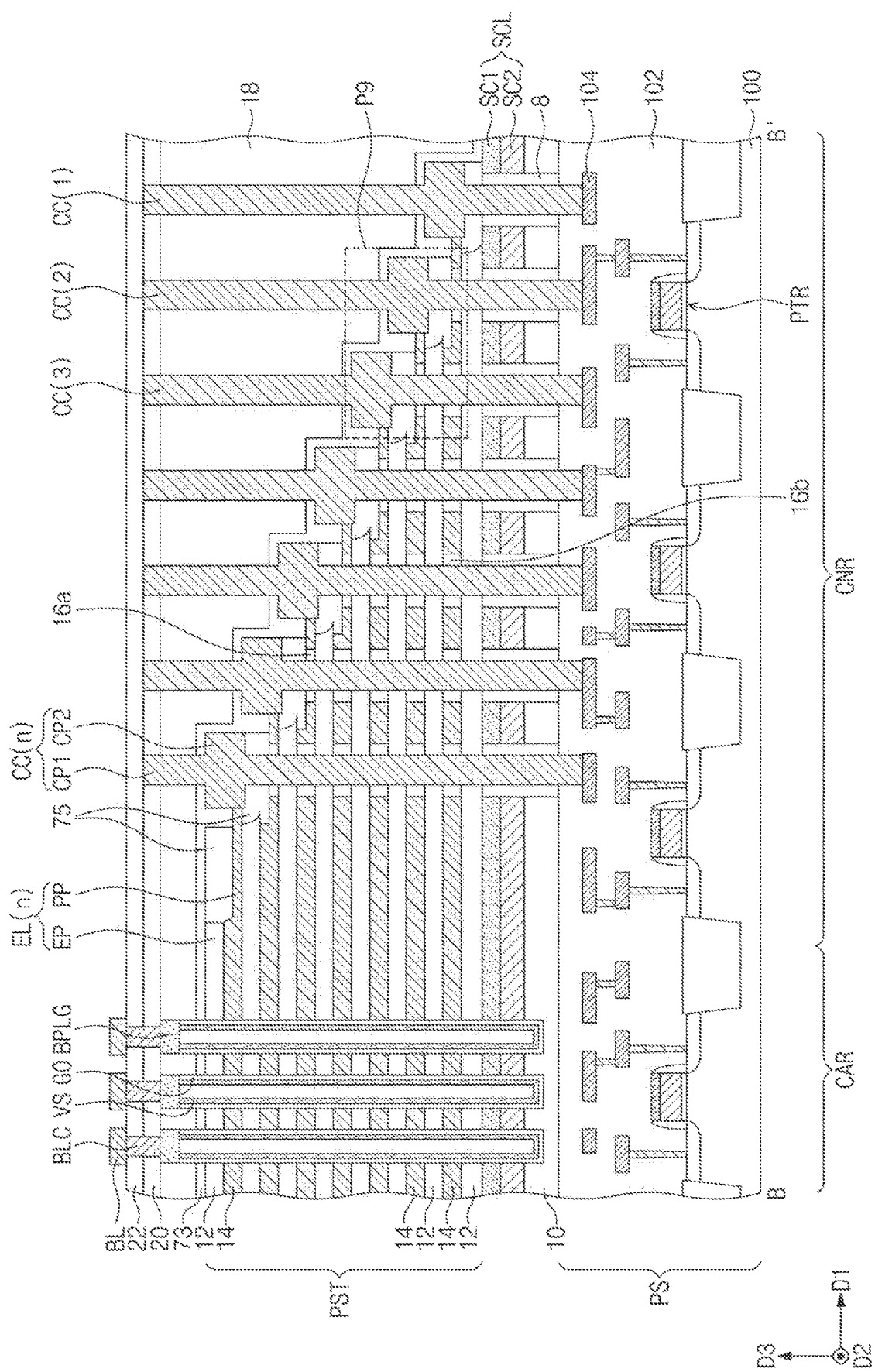
FIG. 12A illustrates a cross-sectional view taken along line B-B' of FIG. 2.
Figure 12B:
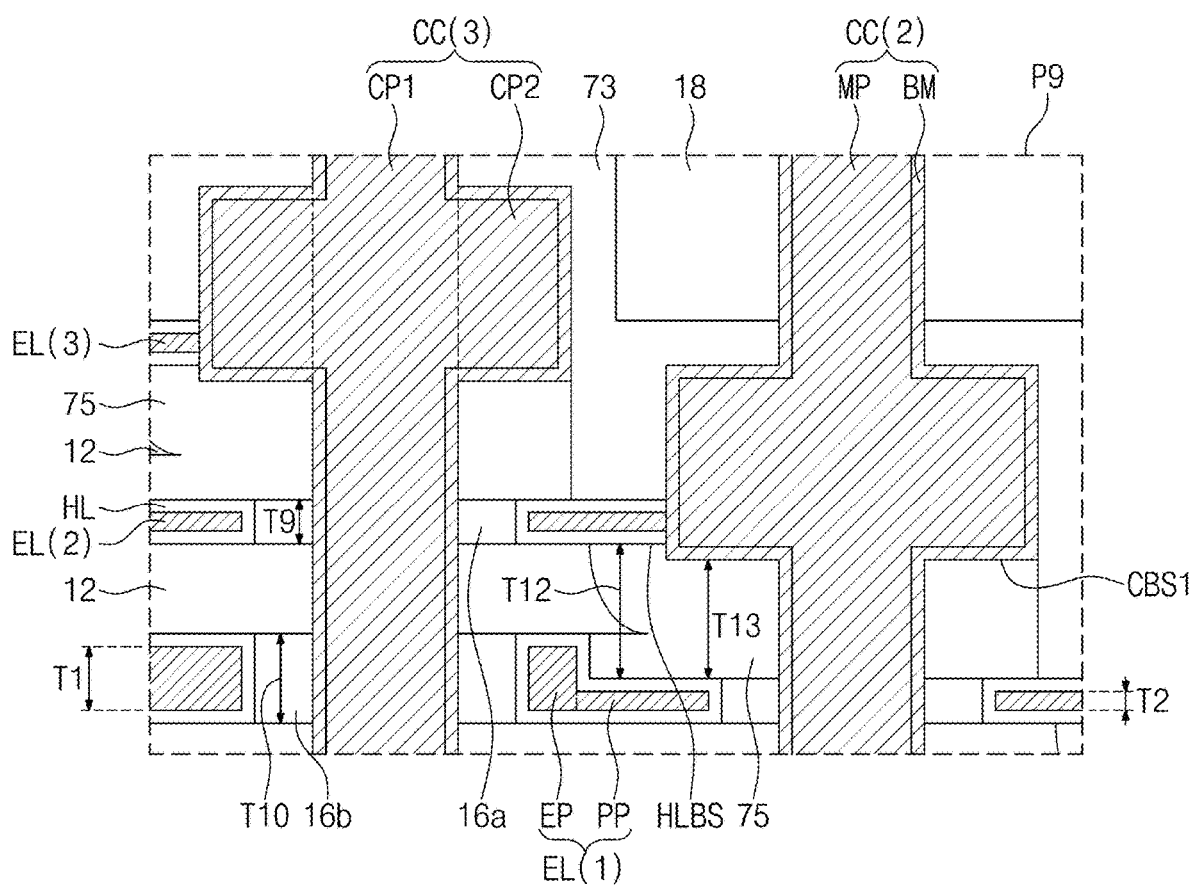
FIG. 12B illustrates an enlarged view showing section P9 of FIG. 12A.

FIG. 12A illustrates a cross-sectional view taken along line B-B' of FIG. 2. FIG. 12B illustrates an enlarged view showing section P9 of FIG. 12A.

Referring to FIGS. 12A and 12B, the electrode layers EL may each include an electrode part EP and a pad part PP. The electrode part EP may have a first thickness T1, and the pad part PP may have a second thickness T2 less than the first thickness T1. The cell contacts CC may each include a columnar part CP1 and a connection part CP2. The connection part CP2 may have a lateral surface in contact with a lateral surface of the pad part PP and a lateral surface of the high-k dielectric layer HL. The connection part CP2 may have a bottom surface CBS1 lower than a lateral surface HLBS of the high-k dielectric layer HL in contact with the lateral surface of the connection part CP2. An auxiliary dielectric pattern 75 may be interposed between the bottom surface CBS1 of the connection part CP2 and the underlying one of the pad part PP of the electrode layer EL. The connection part CP2 may have top and lateral surfaces covered with the second auxiliary dielectric layer 73. The three-dimensional semiconductor memory device according to the present embodiment may not include the first auxiliary dielectric layer 71 of FIG. 11A.

A first contact dielectric pattern 16a may be interposed between the columnar part CP1 and the pad part PP of one of the electrode layers EL that is positioned immediately below the connection part CP2. A second contact dielectric pattern 16b may be interposed between the columnar part CP1 and the electrode part EP of one of the electrode layers EL that is positioned immediately below the first contact dielectric pattern 16a. The first contact dielectric pattern 16a may have a ninth thickness T9. The second contact dielectric pattern 16b may have a tenth thickness T10 greater than the ninth thickness T9. The auxiliary dielectric pattern 75 may be in contact with a lateral surface of one of the inter-electrode dielectric layers 12. The auxiliary dielectric pattern 75 may have a bottom surface lower than that of one of the inter-electrode dielectric layers 12. The inter-electrode dielectric layers 12 may have an eleventh thickness T11. The auxiliary dielectric pattern 75 may have a twelfth thickness T12 on a side of the connection part CP2. The auxiliary dielectric pattern 75 may have a thirteenth thickness T13 below the connection part CP2. The thirteen thickness T13 may be less than the twelfth thickness T12 and greater than the eleventh thickness T11. Other configurations may be identical or similar to those discussed with reference to FIGS. 2 to 4C.

A three-dimensional semiconductor memory device according to the present embodiment may be configured such that the inter-electrode dielectric layers 12 maintain their eleventh thickness T11 between the electrode layers EL. An interval between the connection part CP2 of the cell contact CC and its adjacent electrode layer EL may be maintained equal to or greater than the eleventh thickness T11. As a result, it may be possible to prevent an abnormal reduction in interval between the cell contacts CC and their adjacent electrode layers EL.

FIGS. 13A to 13F illustrate cross-sectional views showing a method of fabricating a three-dimensional semiconductor memory device having the cross-section of FIG. 12A.

Figure 13A:
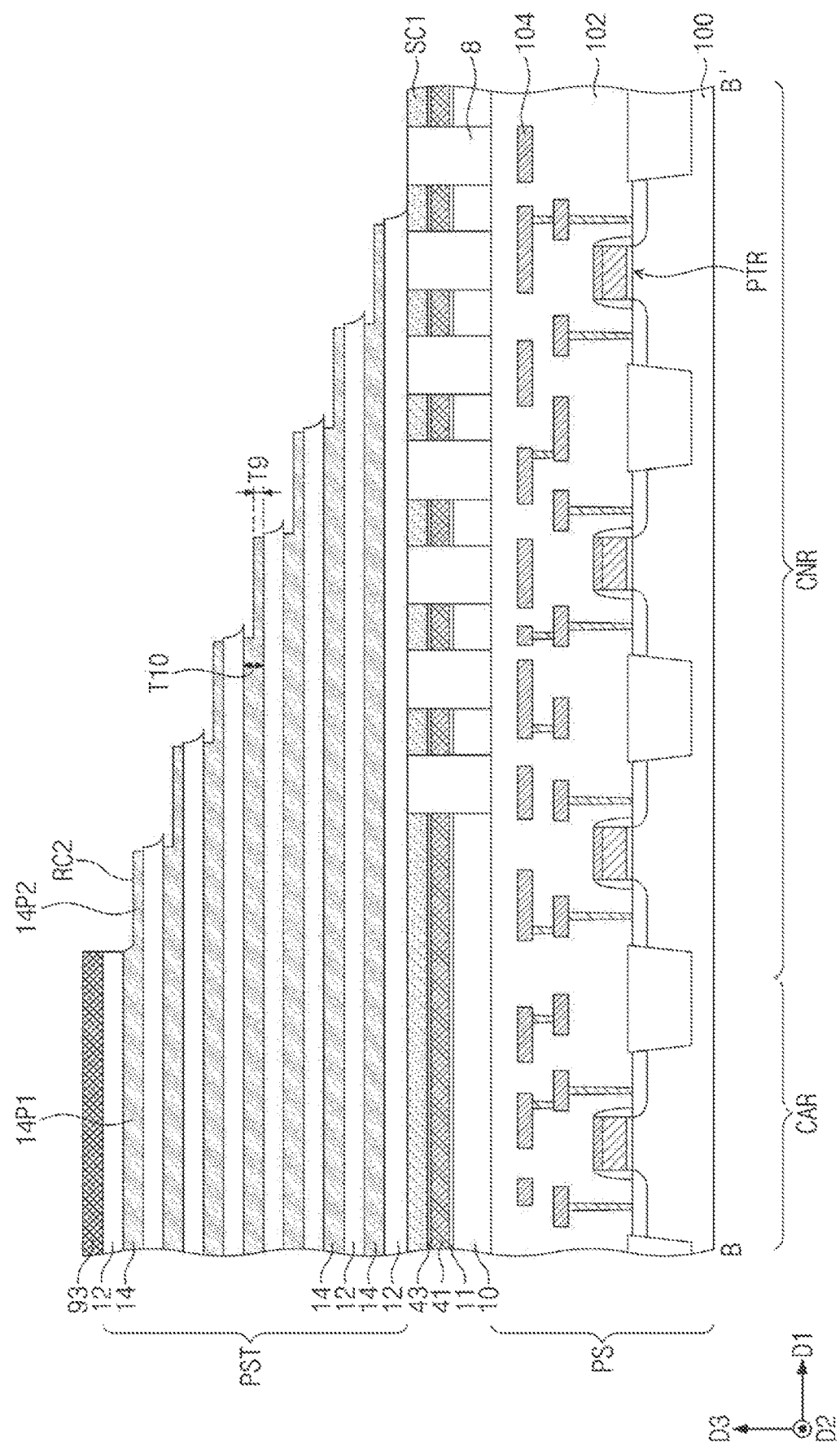
FIG. 13A illustrates a first cross-sectional view showing a part of a method of fabricating a three-dimensional semiconductor memory device having the cross-section of FIG. 12A.

Referring to FIG. 13A, a mask pattern 93 may be formed on the uppermost one of the inter-electrode dielectric layers 12 in a resultant structure of FIG. 10A, partially exposing an end portion of the uppermost one of the inter-electrode dielectric layers 12. An anisotropic etching process may be performed to remove the inter-electrode dielectric layers 12 that are exposed. In addition, the anisotropic etching process may partially etch the mold sacrificial layers 14 below the inter-electrode dielectric layers 12 that are etched. Therefore, the mold sacrificial layers 14 may be formed to each have at its end portion a thickness T9 less than an initial thickness T10. The mold sacrificial layers 14 may be formed to have their recessions RC2 on the end portions thereof. Each of the mold sacrificial layers 14 may have a first part 14P1 having a tenth thickness T10 and a second part 14P2 having a ninth thickness T9 less than the tenth thickness T10.

Figure 13B:
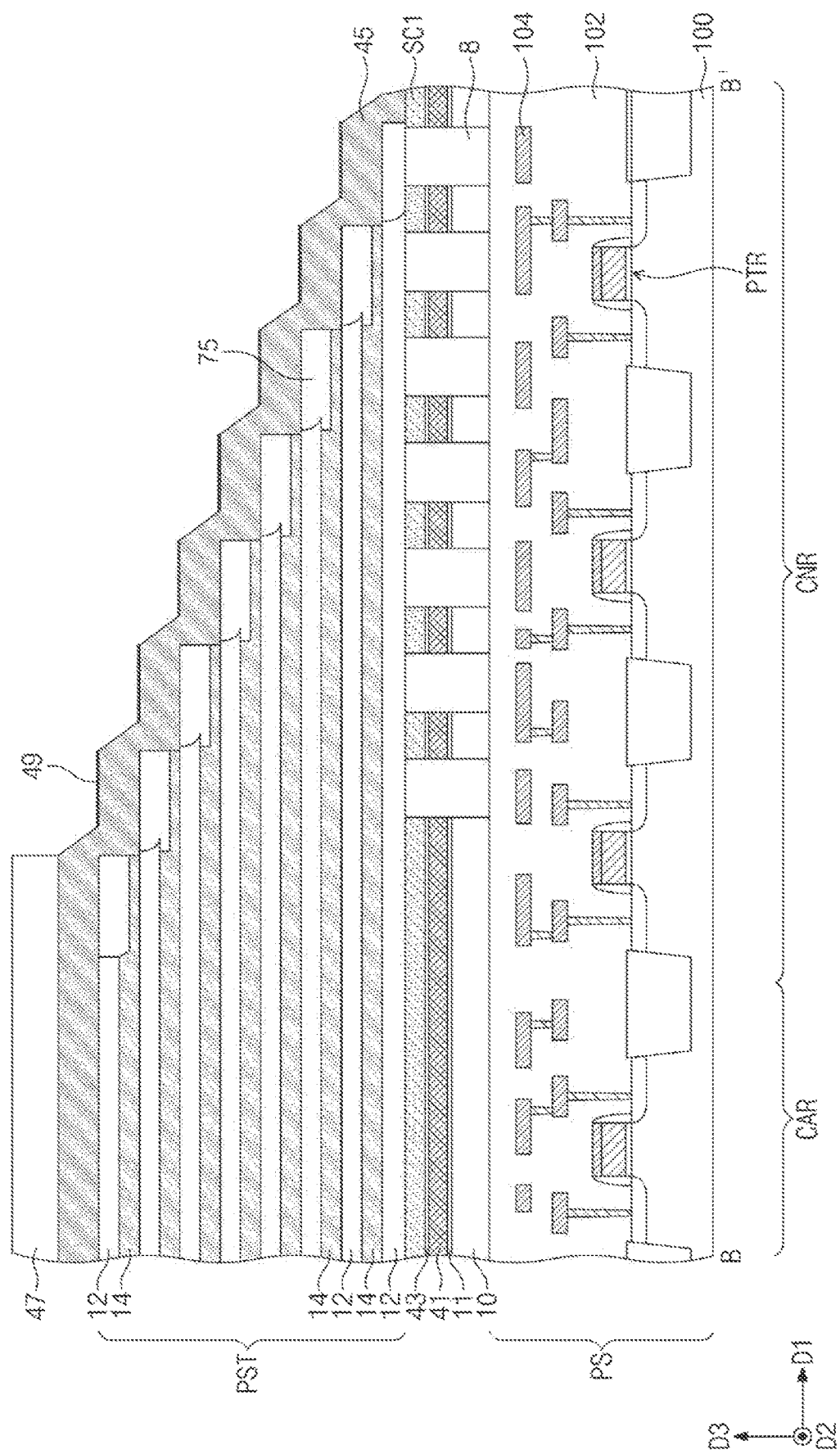
FIG. 13B illustrates a second cross-sectional view showing a part of the method of fabricating the three-dimensional semiconductor memory device having the cross-section of FIG. 12A.

Referring to FIGS. 13A and 13B, the mask pattern 93 may be removed. A plurality of an auxiliary dielectric pattern 75 may be formed in the recessions RC2 of the mold sacrificial layers 14. The plurality of the auxiliary dielectric pattern 75 may be formed of the same material, such as a silicon nitride layer, as that of the inter-electrode dielectric layers 12. The plurality of the auxiliary dielectric pattern 75 may be formed by deposition and etching processes. The plurality of the auxiliary dielectric pattern 75 may be formed to have their top surfaces at the same height (or level) as that of top surfaces of corresponding one of the inter-electrode dielectric layers 12. The plurality of the auxiliary dielectric pattern 75 may be formed to each have a twelfth thickness T12 (refer to FIG. 12B) greater than the thickness T11 (refer to FIG. 12B) of the inter-electrode dielectric layers 12. A preliminary pad layer 45 may be formed on the preliminary stack structure PST. The preliminary pad layer 45 may be formed to contact the mold sacrificial layers 14. A mask pattern 47 may be formed to cover the preliminary pad layer 45 on the cell array region CAR. A plasma treatment process may be performed to form rigid portions 49 on the preliminary pad layer 45.

Figure 13C:
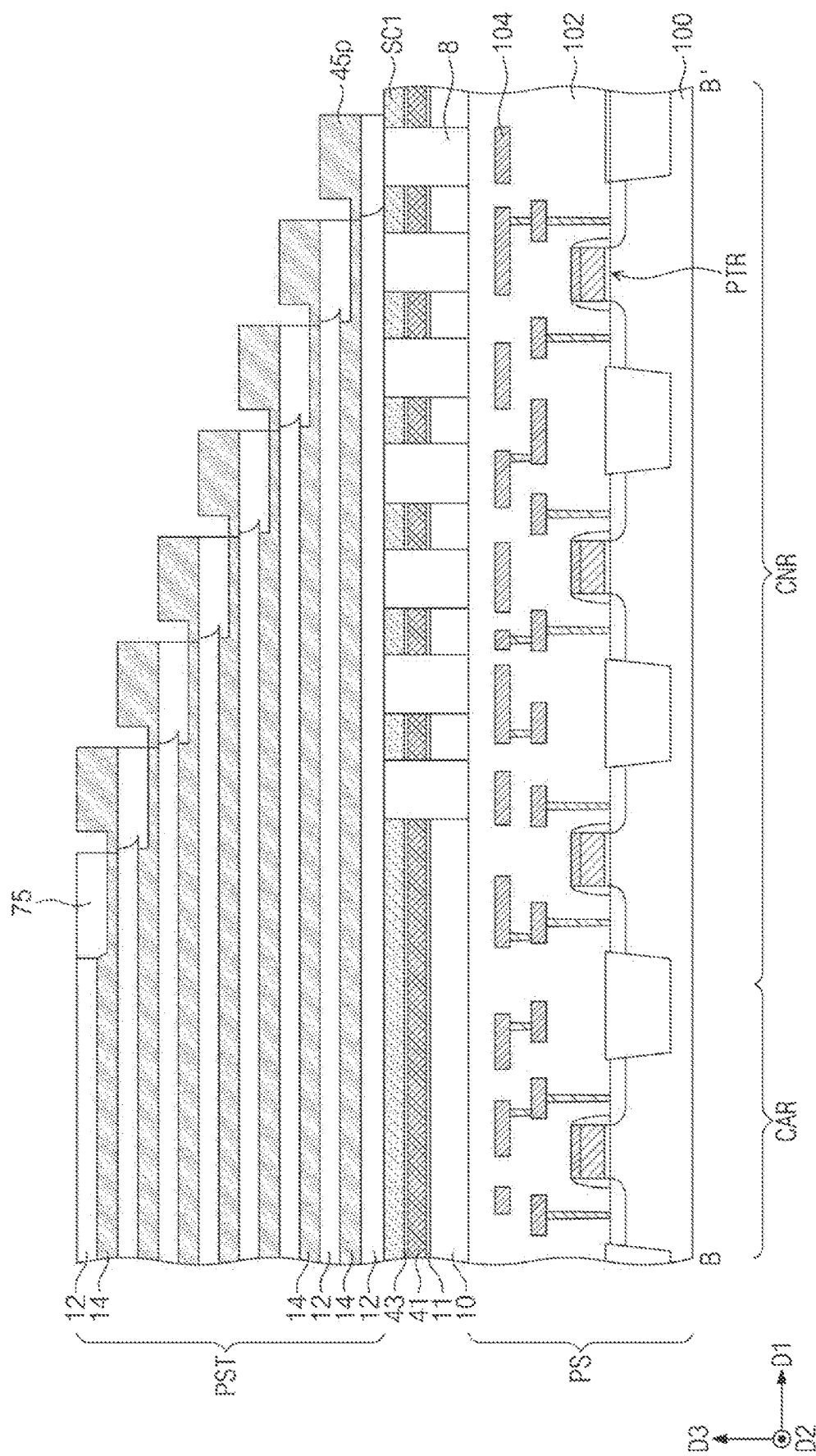
FIG. 13C illustrates a third cross-sectional view showing a part of the method of fabricating the three-dimensional semiconductor memory device having the cross-section of FIG. 12A.

Referring to FIG. 13C, the mask pattern 47 may be removed to expose a surface of the preliminary pad layer 45. The preliminary pad layer 45 may undergo a blanket anisotropic etching process to leave portions of the preliminary pad layer 45 below the rigid portions 49 to form a preliminary pad pattern 45p and to expose a top surface of an uppermost one of the inter-electrode dielectric layers 12. At this stage, the degree of removal of the preliminary pad layer 45 may be adjusted in the anisotropic etching process, and thus it may be possible to leave a portion of the preliminary pad layer 45 adjacent to the auxiliary dielectric pattern 75. Thus, the preliminary pad pattern 45p may be connected to one of the mold sacrificial layers 14.

Figure 13D:
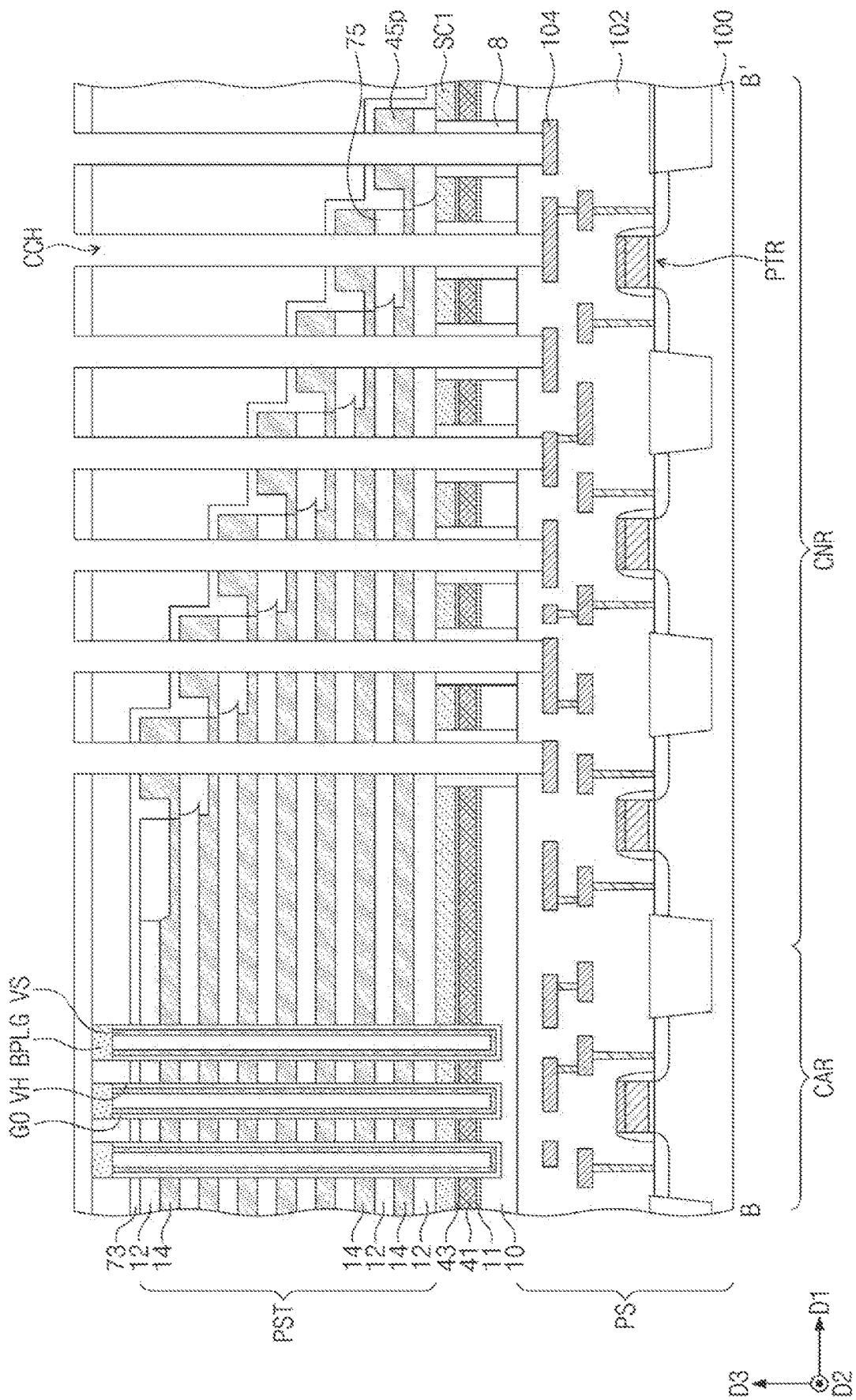
FIG. 13D illustrates a fourth cross-sectional view showing a part of the method of fabricating the three-dimensional semiconductor memory device having the cross-section of FIG. 12A.

Referring to FIG. 13D, a second auxiliary dielectric layer 73 may be conformally formed on the preliminary stack structure PST, thereby filling a space between the auxiliary dielectric pattern 75 and the preliminary pad pattern 45p. A planarized dielectric layer 18 may be formed to cover the preliminary stack structure PST, and then vertical patterns VS, DVS1, and DVS2, a gate dielectric layer GO, and a bit-line pad BPLG may be formed. A first upper dielectric layer 20 may be formed on the planarized dielectric layer 18. The first upper dielectric layer 20, the planarized dielectric layer 18, the second auxiliary dielectric layer 73, the plurality of the preliminary pad pattern 45p, the plurality of the auxiliary dielectric pattern 75, the preliminary stack structure PST, and the substrate dielectric pattern 8 may be successively etched to form cell contact holes CCH that expose the peripheral circuit lines 104.

Figure 13E:
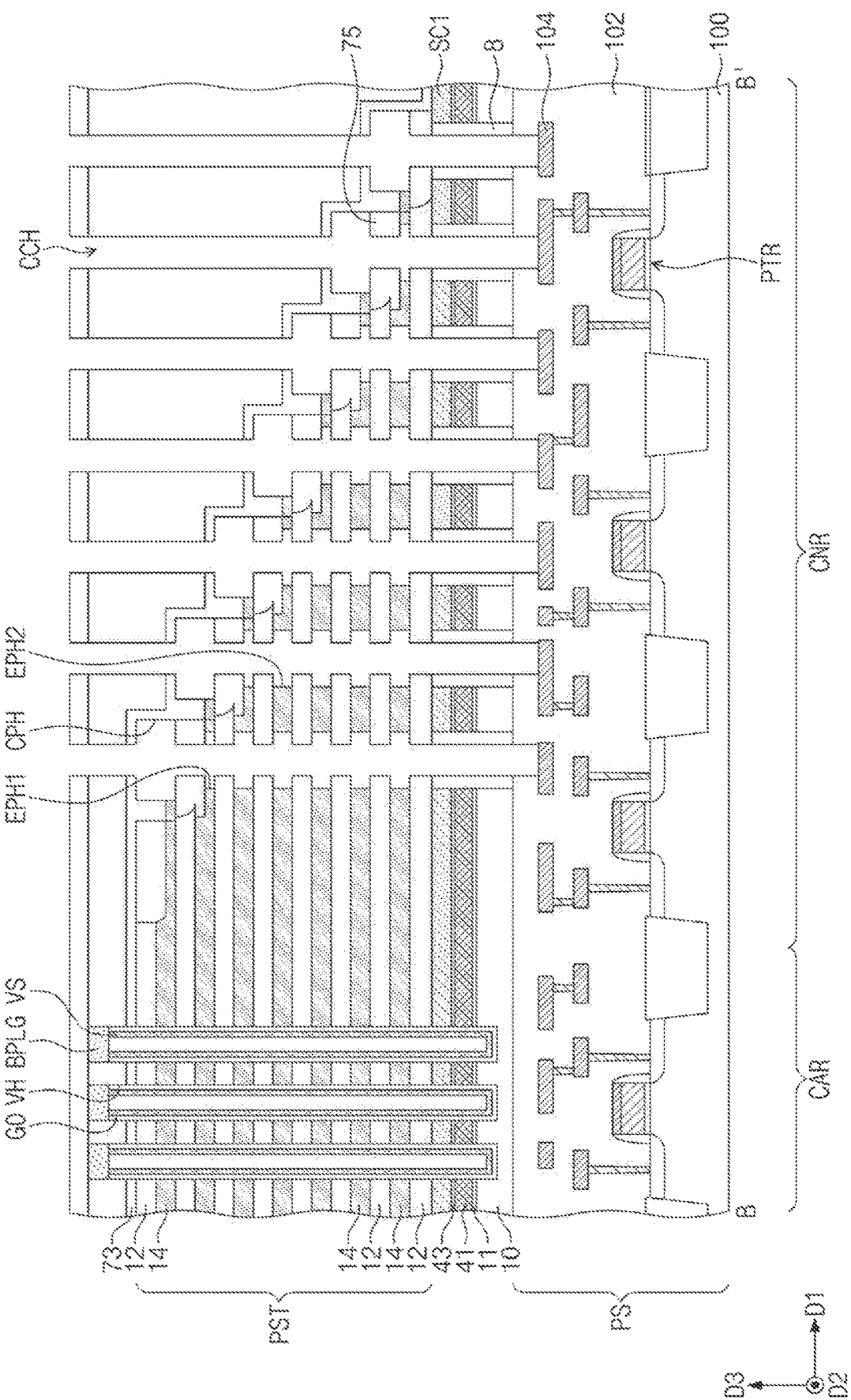
FIG. 13E illustrates a fifth cross-sectional view showing a part of the method of fabricating the three-dimensional semiconductor memory device having the cross-section of FIG. 12A.

Referring to FIG. 13E, an isotropic etching process may be performed to partially remove the preliminary pad pattern 45p and the mold sacrificial layers 14 through the cell contact holes CCH. The preliminary pad pattern 45p may be removed to form a first inner hole CPH. The relatively thin second part 14P2 of the mold sacrificial layers 14 may be removed to form a second upper inner hole EPH1. The relatively thick first part 14P1 of the mold sacrificial layers 14 may be removed to form a second lower inner hole EPH2.

Figure 13F:
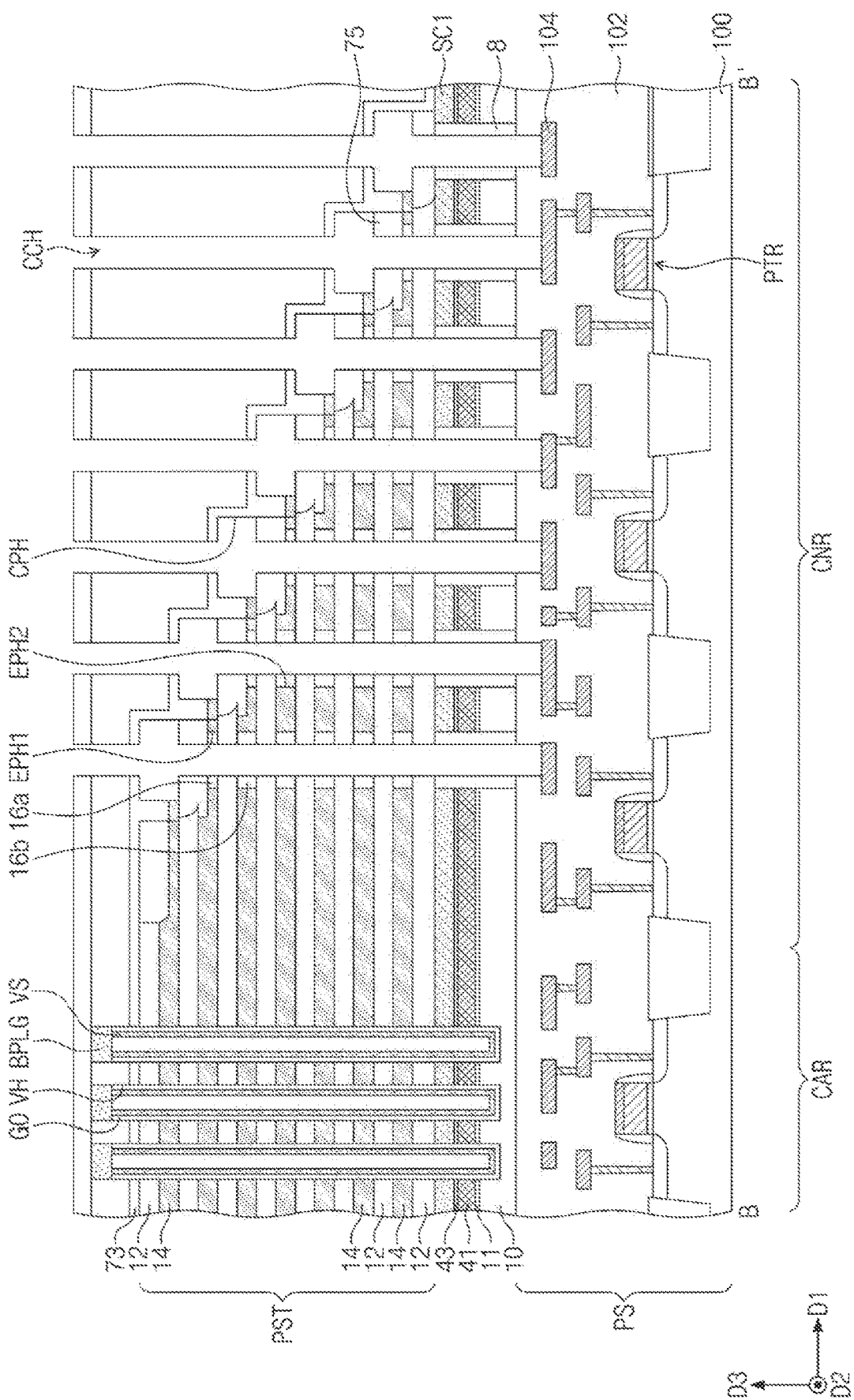
FIG. 13F illustrates a sixth cross-sectional view showing a part of the method of fabricating the three-dimensional semiconductor memory device having the cross-section of FIG. 12A.

Referring to FIG. 13F, as discussed with reference to FIGS. 6F to 6H, a contact dielectric layer 160 may be conformally formed and then an isotropic etching process may be performed to form a first contact dielectric pattern 16a in the second upper inner hole EPH1 and also to form a second contact dielectric pattern 16b in the second lower inner hole EPH2. In this case, an over-etching may be performed (on a silicon oxide layer) to partially etch an upper portion of the auxiliary dielectric pattern 75, and thus as shown in FIG. 6H, the first inner hole CPH may have a bottom surface lower than a top surface of the auxiliary dielectric pattern 75 and/or a top surface of one of the inter-electrode dielectric layers 12.

In a method of fabricating a three-dimensional semiconductor memory device according the present embodiment, the auxiliary dielectric pattern 75 may be formed thicker than the inter-electrode dielectric layers 12, and thus even when a portion of the auxiliary dielectric pattern 75 is etched, the auxiliary dielectric pattern 75 may remain on a bottom surface of the first inner hole CPH, while having a thickness equal to or greater than a specific thickness (e.g., the thickness T13 of FIG. 12B).

When cell contacts CC are subsequently formed as shown in FIG. 12B, a distance between each connection part CP2 of the cell contacts CC and their underlying electrode layer EL may be maintained equal to or greater than the eleventh thickness T11. As a result, it may be possible to prevent an abnormal reduction in interval between the cell contacts CC and an adjacent one of the electrode layers EL.

In a three-dimensional semiconductor memory device according to some example embodiments, an abnormal reduction in interval may be suppressed between electrode layers and/or between cell contacts and their neighboring electrode layers, and therefore, an interference may be minimized between the electrode layers and a breakdown voltage drop may be prohibited. As a result, it may be possible to prevent an operating error and to increase reliability of the three-dimensional semiconductor memory device.

Although the present disclosure have been described in connection with some example embodiments of the present disclosure illustrated in the accompanying drawings, it will be understood to those skilled in the art that various changes and modifications may be made without departing from the technical spirit of the present disclosure. It will be apparent to those skilled in the art that various substitution, modifications, and changes may be thereto without departing from the scope and spirit of the present disclosure.

What is claimed is:

1. A three-dimensional semiconductor memory device, comprising:
   a first substrate that comprises a cell array region and a connection region;
   a first electrode layer and a second electrode layer that are sequentially stacked and spaced apart from each other on the first substrate, and an end portion of the first electrode layer and an end portion of the second electrode layer are offset from each other on the connection region;
   a first cell contact penetrating the second electrode layer and the first electrode layer such as to be connected to the second electrode layer on the connection region; and
   a first contact dielectric pattern between the first cell contact and the first electrode layer,
   wherein the first cell contact comprises:
      a columnar part that vertically extends from a top surface of the first substrate; and
      a connection part that laterally protrudes from the columnar part and contacts the second electrode layer,
   wherein a width of the connection part is less than a width of the first contact dielectric pattern, and
   wherein the second electrode layer is stacked on a top surface of the first electrode layer, and an uppermost surface of the first contact dielectric pattern is below the second electrode layer.

2. The three-dimensional semiconductor memory device of claim 1, further comprising a second contact dielectric pattern between the second electrode layer and a lower portion of the connection part.

3. The three-dimensional semiconductor memory device of claim 2, wherein the connection part has a rounded lateral surface in contact with the second contact dielectric pattern.

4. The three-dimensional semiconductor memory device of claim 2, wherein the second electrode layer covers a top surface and a lateral surface of the second contact dielectric pattern.

5. The three-dimensional semiconductor memory device of claim 1, wherein
   the second electrode layer has a first thickness on the cell array region, and
   the end portion of the second electrode layer has a second thickness greater than the first thickness.

6. The three-dimensional semiconductor memory device of claim 1, wherein the connection part vertically overlaps the first contact dielectric pattern and does not vertically overlap the first electrode layer.

7. The three-dimensional semiconductor memory device of claim 1, further comprising:
   a peripheral circuit structure below the first substrate;
   a source structure between the first substrate and the first electrode layer;
   a vertical pattern penetrating the second electrode layer, the first electrode layer, and the source structure such as to be adjacent to the first substrate; and
   a gate dielectric layer between the vertical pattern and the second electrode layer, between the vertical pattern and the first electrode layer, between the vertical pattern and the source structure, and between the vertical pattern and the first substrate,
   wherein a portion of the source structure penetrates the gate dielectric layer and contacts the vertical pattern.

8. The three-dimensional semiconductor memory device of claim 1, further comprising a substrate dielectric pattern that penetrates the first substrate on the connection region, wherein the columnar part penetrates the substrate dielectric pattern.

9. The three-dimensional semiconductor memory device of claim 1, wherein the three-dimensional semiconductor memory device further comprises an inter-electrode dielectric layer that is between the connection part and the first contact dielectric pattern in a vertical direction of the three-dimensional semiconductor memory device.

10. A three-dimensional semiconductor memory device, comprising:
    a first substrate that comprises a cell array region and a connection region;
    a first electrode layer and a second electrode layer that are sequentially stacked and spaced apart from each other on the first substrate, and an end portion of the first electrode layer and an end portion of the second electrode layer are offset from each other on the connection region;
    a first cell contact penetrating the second electrode layer and the first electrode layer such as to be connected to the second electrode layer on the connection region; and a first contact dielectric pattern between the first cell contact and the first electrode layer,
wherein the first cell contact comprises:
    a columnar part that vertically extends from a top surface of the first substrate; and
    a connection part that laterally protrudes from the columnar part and contacts the second electrode layer,
wherein a width of the connection part is less than a width of the first contact dielectric pattern,
wherein the three-dimensional semiconductor memory device further comprises a second contact dielectric pattern between the second electrode layer and a lower portion of the connection part, and
wherein the connection part has a rounded lateral surface in contact with the second contact dielectric pattern.

11. A three-dimensional semiconductor memory device, comprising:
    a first substrate that comprises a cell array region and a connection region;
    a first electrode layer and a second electrode layer that are sequentially stacked and spaced apart from each other on the first substrate, and an end portion of the first electrode layer and an end portion of the second electrode layer are offset from each other on the connection region;
    a first cell contact penetrating the second electrode layer and the first electrode layer such as to be connected to the second electrode layer on the connection region; and
    a first contact dielectric pattern between the first cell contact and the first electrode layer,
wherein the first cell contact comprises:
    a columnar part that vertically extends from a top surface of the first substrate; and
    a connection part that laterally protrudes from the columnar part and contacts the second electrode layer,
wherein a width of the connection part is less than a width of the first contact dielectric pattern,
wherein the three-dimensional semiconductor memory device further comprises a second contact dielectric pattern between the second electrode layer and a lower portion of the connection part, and
wherein the second electrode layer covers a top surface and a lateral surface of the second contact dielectric pattern.

* * * * *